(12) United States Patent
Lin et al.

(10) Patent No.: US 11,929,763 B2
(45) Date of Patent: *Mar. 12, 2024

(54) STORAGE ERROR CORRECTION USING CYCLIC-CODE BASED LDPC CODES

(71) Applicant: Westhold Corporation, San Jose, CA (US)

(72) Inventors: Shu Lin, Milpitas, CA (US); Khaled Ahmed Sabry Abdel-Ghaffar, Davis, CA (US); Juane Li, Milpitas, CA (US); Keke Liu, Union City, CA (US)

(73) Assignee: WESTHOLD CORPORATION, San Jose, CA (US)

( * ) Notice: Subject to any disclaimer, the term of this patent is extended or adjusted under 35 U.S.C. 154(b) by 327 days.

This patent is subject to a terminal disclaimer.

(21) Appl. No.: 17/216,407

(22) Filed: Mar. 29, 2021

(65) Prior Publication Data
US 2021/0376855 A1  Dec. 2, 2021

Related U.S. Application Data

(60) Continuation of application No. 16/517,035, filed on Jul. 19, 2019, now Pat. No. 11,038,530, which is a
(Continued)

(51) Int. Cl.
*H03M 13/00* (2006.01)
*G06F 11/10* (2006.01)
(Continued)

(52) U.S. Cl.
CPC ........... *H03M 13/116* (2013.01); *G06F 11/10* (2013.01); *H03M 13/036* (2013.01);
(Continued)

(58) Field of Classification Search
CPC ............ H03M 13/116; H03M 13/036; H03M 13/1174; H03M 13/1515; H03M 13/158;
(Continued)

(56) References Cited

U.S. PATENT DOCUMENTS

| 7,810,015 B2 | 10/2010 | Paumier et al. |
| 10,404,280 B2 | 9/2019 | Lin et al. |

(Continued)

OTHER PUBLICATIONS

U.S. Appl. No. 15/357,801, Restriction Requirement dated Aug. 13, 2018, 7 pages.
(Continued)

*Primary Examiner* — Christine T. Tu
(74) *Attorney, Agent, or Firm* — Weaver Austin Villeneuve & Sampson LLP

(57) ABSTRACT

Techniques are described for joint encoding and decoding of information symbols. In one embodiment, a method for joint encoding includes, in part, obtaining a sequence of information symbols, generating a plurality of cyclic codewords each corresponding to a portion of the sequence of information symbols, jointly encoding the plurality of cyclic codewords to generate at least one combined codeword, and providing the combined codeword to a device. The at least one combined codeword may be generated through Galois Fourier Transform (GFT). In one embodiment, a method for joint decoding includes, in part, obtaining a sequence of encoded symbols, wherein the sequence of encoded symbols is generated through GFT, jointly decoding the sequence of encoded symbols using an iterative soft decision decoding algorithm to generate a decoded sequence, transforming the decoded sequence to generate a plurality of cyclic codewords, and decoding the plurality of cyclic codewords to generate a plurality of decoded information symbols.

29 Claims, 23 Drawing Sheets

Related U.S. Application Data division of application No. 15/357,801, filed on Nov. 21, 2016, now Pat. No. 10,404,280.

(60) Provisional application No. 62/257,587, filed on Nov. 19, 2015.

(51) Int. Cl.

| | |
|---|---|
| *H03M 13/03* | (2006.01) |
| *H03M 13/11* | (2006.01) |
| *H03M 13/15* | (2006.01) |
| *H03M 13/27* | (2006.01) |
| *H03M 13/29* | (2006.01) |
| *H03M 13/13* | (2006.01) |
| *H03M 13/19* | (2006.01) |

(52) U.S. Cl.
CPC ... *H03M 13/1174* (2013.01); *H03M 13/1515* (2013.01); *H03M 13/158* (2013.01); *H03M 13/2757* (2013.01); *H03M 13/2906* (2013.01); *H03M 13/611* (2013.01); *H03M 13/136* (2013.01); *H03M 13/152* (2013.01); *H03M 13/19* (2013.01)

(58) Field of Classification Search
CPC ......... H03M 13/2757; H03M 13/2906; H03M 13/611; H03M 13/136; H03M 13/152; H03M 13/19; G06F 11/10
See application file for complete search history.

(56) References Cited

U.S. PATENT DOCUMENTS

| | | | |
|---|---|---|---|
| 2008/0141098 A1* | 6/2008 | Chae | H03M 13/116 714/801 |
| 2009/0158128 A1 | 6/2009 | Yokokawa et al. | |
| 2010/0077275 A1 | 3/2010 | Yu et al. | |
| 2010/0309969 A1 | 12/2010 | Kim et al. | |
| 2012/0054585 A1 | 3/2012 | Jiang et al. | |
| 2012/0284584 A1 | 11/2012 | Zhang et al. | |
| 2012/0307928 A1 | 12/2012 | Jia et al. | |
| 2014/0229789 A1* | 8/2014 | Richardson | H03M 13/036 714/752 |
| 2015/0381204 A1 | 12/2015 | Zhang et al. | |
| 2016/0248442 A1 | 8/2016 | Myung et al. | |
| 2018/0343020 A1* | 11/2018 | Kumar | G06F 11/1076 |
| 2019/0341936 A1 | 11/2019 | Lin et al. | |

OTHER PUBLICATIONS

U.S. Appl. No. 15/357,801, Non-Final Office Action dated Jan. 4, 2019, 11 pages.
U.S. Appl. No. 15/357,801, Notice of Allowance dated Apr. 19, 2019, 7 pages.
U.S. Appl. No. 16/517,035, Non-Final Office Action dated Aug. 11, 2020, 11 pages.
U.S. Appl. No. 16/517,035, Notice of Allowance dated Jan. 29, 2021, 5 pages.
U.S. Appl. No. 16/517,035, Notice of Allowance dated Mar. 16, 2021, 6 pages.
Barnault et al., Fast Decoding Algorithm for LDPC over GF(2q), IEEE Information Theory Workshop, Paris, France, Mar. 31-Apr. 4, 2003, pp. 70-73.
Bellorado et al., Low-Complexity Soft-Decoding Algorithms for Reed-Solomon Codes part I: An Algebraic Soft-in Hard-Out Chase Decoder, IEEE Transactions on Information Theory, vol. 56, No. 3, Mar. 11, 2010, 13 pages.
Bellorado et al., Low-Complexity Soft-Decoding Algorithms for Reed-Solomon Codes—Part II: Soft-Input Soft-Out Iterative Decoding, IEEE Transactions on Information Theory, vol. 56, No. 3, Mar. 2010, pp. 960-967.
Berlekamp, Algebraic Coding Theory, McGraw-Hill, World Scientific Publishing Co., Pte. Ltd., 2015, pp. 119-199.
Blahut, Theory and Practice of Error Control Codes, Addison-Wesley Publishing Company, Jan. 1, 1983, pp. 93-322.
Blake et al., The Mathematical Theory of Coding, Academic Press, 1975, pp. 139-143.
Bose et al., On a Class of Error Correcting Binary Group Codes, Information and Control, vol. 3, No. 1, Mar. 1960, pp. 68-79.
Brigham, Fast Fourier Transform and Its Applications, Upper Saddle River, NJ: Prentice Hall, 1988, pp. 131-166.
Cassuto et al., On the Average Complexity of Reed-Solomon List Decoders, IEEE Transactions on Information Theory, vol. 59, No. 4, Apr. 2013, pp. 2336-2351.
Chase, A Class of Algorithms for Decoding Block Codes with Channel Measurement Information, IEEE Transactions on Information Theory, vol. 18, No. 1, Jan. 1972, pp. 170-182.
Chen et al., Near Optimum Universal Belief Propagation Based Decoding of Low-Density Parity-Check Codes, IEEE Transactions on Communications, vol. 50, No. 3, Mar. 2002, pp. 406-414.
Chen et al., Overlapped Message Passing for Quasi-Cyclic Low-Density Parity Check Codes, IEEE Transactions on Circuits and Systems I, vol. 51, No. 6, Jun. 2004, pp. 1106-1113.
Li et al., Performance and Analysis of Quadratic Residue Codes of lengths less than 100, Available online at: https://arxiv.org/abs/1408.5674, Aug. 25, 2014, 31 pages.
Chen et al., Progressive Algebraic Soft Decision Decoding of Reed-Solomon Codes, IEEE Transactions on Communication, vol. 61, No. 2, Feb. 2013, pp. 433-442.
Davey et al., Low Density Parity Check Codes Over GF(q), IEEE Communication on Letters, vol. 2, No. 6, Jun. 1998, pp. 165-167.
Declercq et al., Decoding Algorithms for Nonbinary LDPC Codes Over GF(q), IEEE Transactions on Communication, vol. 55, No. 4, Apr. 16, 2007, pp. 633-643.
Diao et al., A Matrix-Theoretic Approach for Analyzing Quasi-Cyclic Low-Density Parity-Check Codes, IEEE Trans. Inf. Theory, vol. 58, No. 6, Jun. 2012, pp. 4030-4048.
Diao et al., A Transform Approach for Analyzing and Constructing Quasi-Cyclic Low-Density Parity-Check Codes, Proc. Inf. Theory Applic. Workshop, Feb. 6-11, 2011, pp. 1-8.
Diao et al., LDPC Codes on Partial Geometries: Construction, Trapping Set Structure, and Puncturing, IEEE Transactions on Information Theory, vol. 59, No. 12, Dec. 2013, pp. 7898-7914.
El-Khamy et al., Iterative Algebraic Soft-Decision List Decoding of Reed-Solomon Codes, IEEE Journal on Selected Areas in Communications, vol. 24, No. 3, Mar. 2006, pp. 481-490.
Forney, Generalized Minimum Distance Decoding, IEEE Transactions on Information Theory, vol. 12, No. 2, Apr. 1966, pp. 125-131.
Fossorier, Reduced Complexity Iterative Decoding of Low-Density Parity Check Codes Based on Belief Propagation, IEEE Transactions on Communication, vol. 47, No. 5, May 1999, pp. 673-680.
Fossorier, Reliability-Based Decoding of Reed-Solomon Codes Using Their Binary Image, IEEE Communication Letters, vol. 8, No. 7, Jul. 2004, pp. 452-454.
Gallager, Low Density Parity-Check Codes, IRE Transactions on Information Theory, vol. 8, No. 1, Jan. 1962, pp. 21-28.
Gleason, Weight Polynomials of Self-Dual Codes and the MacWilliams Identities, Actes Congr. Int. Math., vol. 3, 1970, pp. 211-215.
Golay, Notes on Digital Coding, Proc. IRE, vol. 37, Jun. 1949, p. 657.
Gross et al., Applications of Algebraic Soft-Decision Decoding of Reed-Solomon Codes, IEEE Transactions on Communications, vol. 54, No. 7, Jul. 2006, pp. 1224-1234.
Guruswami et al., Improved Decoding of Reed-Solomon and Algebraic-Geometry Codes, IEEE Transactions on Information Theory, vol. 45, No. 6, Sep. 1999, pp. 1757-1767.
Guruswami et al., Maximum-Likelihood Decoding of Reed-Solomon Codes is NP-Hard, IEEE Transactions on Information Theory, vol. 51, No. 7, Jul. 2005, pp. 2249-2256.
Hamming, Error Detecting and Error Correcting Codes, The Bell System Technical Journal, vol. 29, No. 2, Apr. 1950, 14 pages.

(56) References Cited

OTHER PUBLICATIONS

Hocquenghem, Codes Correcteurs d'erreurs, Chiffres, vol. 2, Available online at: http://www.citeulike.org/user/alexzeh/article/2211978 https://en.wikipedia.org/wiki/Alexis_Hocquenghem, Sep. 1959, 3 pages.
Horn et al., Matrix Analysis, Cambridge University Press. Cambridge Books Online, 1985, 18 pages.
Hu et al., An Efficient Hybrid Decoding Algorithm for Reed-Solomon Codes Based on Bit Reliability, IEEE Transactions on Communication, vol. 51, No. 7, Jul. 28, 2003, pp. 1073-1081.
Jiang et al., Algebraic Soft-Decision Decoding of Reed-Solomon Codes Using Bit-Level Soft Information, IEEE Transactions on Information Theory, vol. 54, No. 9, Sep. 2008, pp. 3907-3928.
Jiang et al., Iterative Soft Decision Decoding of Reed-Solomon Codes Based on Adaptive Parity-Check Matrices, International Symposium on Information Theory, Jun. 27-Jul. 2, 2004, 1 page.
Jiang et al., Iterative Soft-Input Soft-Output Decoding of Reed-Solomon Codes by Adapting the Parity-Check Matrix, IEEE Transactions on Information Theory, vol. 52, No. 8, Aug. 2006, 10 pages.
Kasami et al., New Generations of the Reed-Muller Codes Part I: Primitive Codes, IEEE Transactions on Information Theory, vol. 14, No. 2, Mar. 1968, pp. 189-199.
Kasami et al., On Majority-Logic Decoding for Duals of Primitive Polynomial Codes, IEEE Transactions on Information Theory, vol. 17, No. 3, May 1971, pp. 322-331.
Kasami et al., Polynomial Codes, IEEE Transactions on Information Theory, vol. 14, No. 6, Nov. 1968, pp. 807-814.
Koetter et al., Algebraic Soft-Decision Decoding of Reed-Solomon Codes, IEEE Transactions on Information Theory, vol. 49, No. 11, Nov. 2003, pp. 2809-2825.
Koetter et al., The Re-Encoding Transformation in Algebraic List-Decoding of Reed-Solomon Codes, IEEE Transactions on Information Theory, vol. 57, No. 2, Feb. 2011, pp. 633-647.
Kou et al., Low-Density Parity-Check Codes Based on Finite Geometries: A Rediscovery and New Results, IEEE Transactions on Information Theory vol. 47, No. 7, Oct. 2001, pp. 2711-2736.
Lan et al., Construction of Quasi-Cyclic LDPC Codes for AWGN and Binary Erasure Channels: A Finite Field Approach, IEEE Transactions on Information Theory, vol. 53, No. 7, Jul. 2007, pp. 2429-2458.
Leroux et al., Stochastic Chase Decoding of Reed-Solomon Codes, IEEE Communications Letters, vol. 14, No. 9, Sep. 2010, pp. 863-865.
Li et al., Algebraic Quasi-Cyclic LDPC Codes: Construction, Low Error-Floor, Large Girth and a Reduced-Complexity Decoding Scheme, IEEE Transactions on Communication, vol. 62, No. 8, Aug. 2014, pp. 2626-2637.
Li et al., Decoding of Quasi-Cyclic LDPC Codes with Section-Wise Cyclic Structure, In Proc. Inf. Theory Applic. Workshop, San Diego, CA, Feb. 9-14, 2014, pp. 1-10.
Lin et al., Error Control Coding: Fundamentals and Applications, 2nd Edition, Upper Saddle River, NJ: Prentice Hall, 2005, pp. 99-916.
Liu et al., A Revolving Iterative Algorithm for Decoding Algebraic Cyclic and Quasi-Cyclic LDPC Codes, IEEE Transactions on Communication, vol. 61, No. 12, Dec. 2013, pp. 4816-4827.
Liu et al., A Revolving Iterative Algorithm for Decoding Algebraic Quasi-Cyclic LDPC Codes, Proc. IEEE Int. Symp. Inf. Theory, Istanbul, Turkey, Jun. 7-12, 2013, pp. 2656-2660.
Liu et al., Turbo Encoding and Decoding of Reed-Solomon Codes Through Binary Decomposition and Self-Concatenation, IEEE Transactions on Communications, vol. 52, No. 9, Sep. 2004, pp. 1484-1493.
Mackay et al., Evaluation of Gallager Codes of Short Block Length and High Rate Applications, Available online at: https://link.springer.com/chapter/10.1007%2F978-1-4613-0165-3_6, Jan. 5, 1999, pp. 113-130.
Mackay, Good Error-Correcting Codes Based on Very Sparse Matrices, IEEE Transactions on Information Theory, vol. 45, No. 2, Mar. 1999, pp. 399-431.
Massey, Shift-Register Synthesis and BCH Decoding, IEEE Transactions on Information Theory, vol. 15, No. 1, Jan. 1969, pp. 122-127.
Peterson et al., Error-Correcting Codes, 2nd Edition, Cambridge, 1972, pp. 170-308.
Pless, Introduction to the Theory of Error-Correcting Codes, 3rd Edition, Wiley, Available online at: http://www.wiley.com/WileyCDA/WileyTitle/productCd-0471190470.html, Jul. 1998, 214 pages.
Ponnampalam et al., Soft Decision Decoding of Reed-Solomon Codes, IEEE Transactions on Communications, vol. 50, No. 11, Nov. 2002, pp. 1758-1768.
Reed et al., Polynomial Codes Over Certain Finite Fields, Journal of the Society for Industrial and Applied Mathematics, vol. 8, No. 2, Jun. 1960, 2 pages.
Roth, Introduction to Coding Theory, UK: Cambridge University Press, 2006, pp. v-xi.
Ryan et al., Channel Codes: Classical and Modern, New York, NY: Cambridge Univ. Press, 2009, 710 pages.
Shin et al., Soft Decision Decoding of Reed-Solomon Codes Using Trellis Methods, IEE Proc. Communication, vol. 141, No. 5, Oct. 1994, pp. 303-308.
Singleton, Maximum Distance Q-Nary Codes, IEEE Transactions on Information Theory, vol. 10, No. 2, Apr. 1964, pp. 116-118.
Sugiyama et al., A Method for Solving Key Equation for Decoding Goppa Codes, Information and Control, vol. 27, No. 12, Jan. 1975, pp. 87-99.
Tang et al., On Combining Chase-2 and GMD Decoding Algorithms for Nonbinary Block Codes, IEEE Communications Letters, vol. 5, No. 5, May 2001, pp. 209-211.
Tang et al., Progressive List-Enlarged Algebraic Soft Decoding of Reed-Solomon Codes, IEEE Communications Letters, vol. 16, No. 6, Jun. 2012, pp. 901-904.
Tanner, A Recursive Approach to Low Complexity Codes, IEEE Transactions on Information Theory, vol. 27, No. 5, Sep. 1981, pp. 533-547.
Trifonov, Efficient Interpolation in the Guruswami-Sudan Algorithm, IEEE Transactions on Information Theory, vol. 56, No. 9, Sep. 2010, pp. 4341-4349.
Vardy et al., Bit-Level Soft-Decision Decoding of Reed-Solomon Codes, IEEE Transactions on Communications, vol. 39, No. 3, Mar. 1991, pp. 440-444.
Wu, New List Decoding Algorithms for Reed-Solomon and BCH Codes, IEEE Transactions on Information Theory, vol. 54, No. 8, Aug. 2008, pp. 3611-3630.

\* cited by examiner

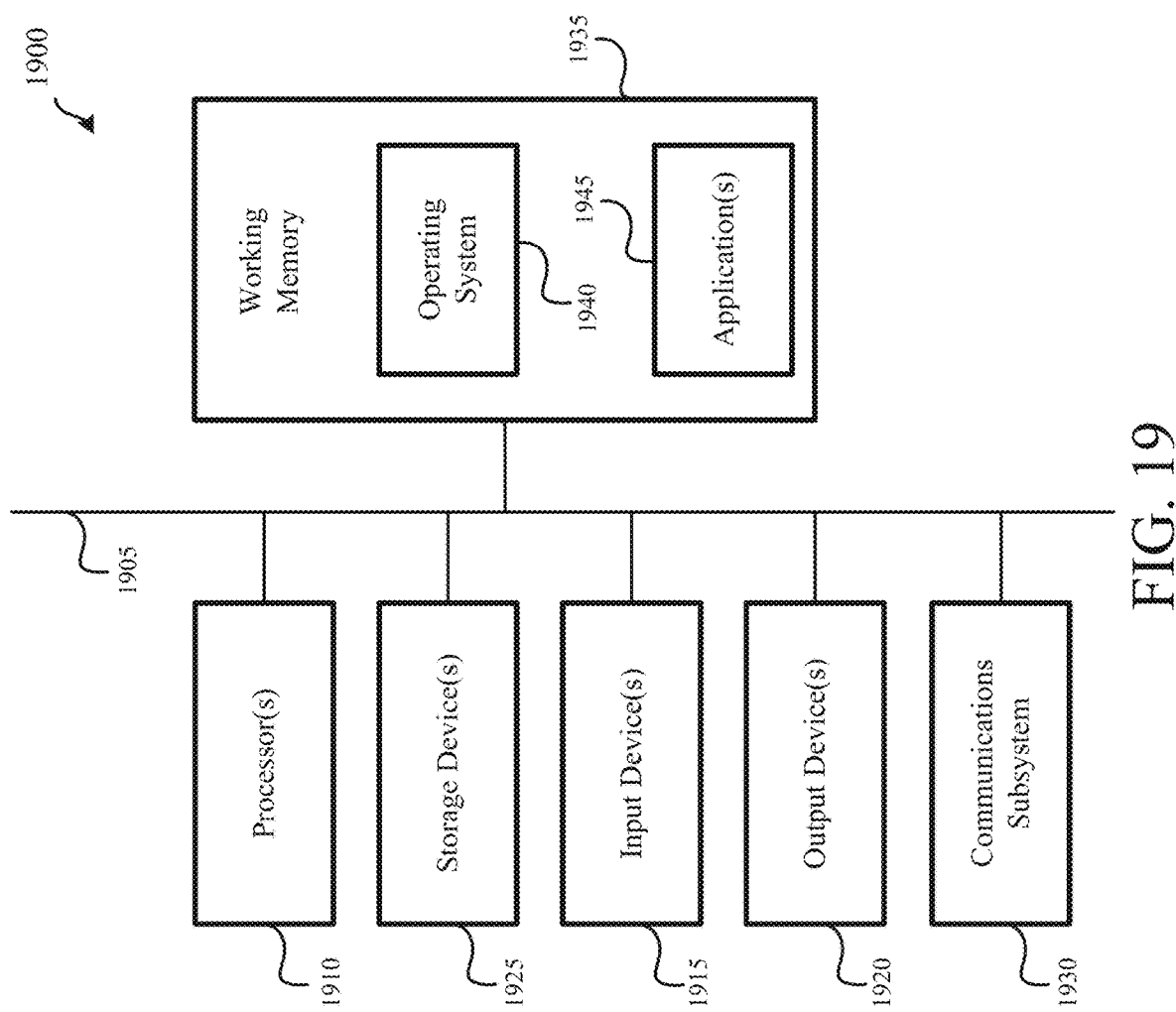

STORAGE ERROR CORRECTION USING CYCLIC-CODE BASED LDPC CODES

CROSS-REFERENCES TO RELATED APPLICATIONS

This present application is a continuation of U.S. application Ser. No. 16/517,035 entitled "Error Correction Encoding And Decoding Using Cyclic-Code Based LDPC Codes" filed Jul. 19, 2019, which is a divisional of U.S. application Ser. No. 15/357,801 entitled "Error Correction Using Cyclic Code-Based LDPC Codes," filed Nov. 21, 2016, which claims priority to Provisional Application No. 62/257,587 entitled "Systems, Apparatuses, And Methods For Error Correction Using Cyclic Code-Based LDPC Codes," filed Nov. 19, 2015, which are assigned to the assignee hereof and expressly incorporated by reference herein in its entirety.

BACKGROUND OF THE INVENTION

Reed-Solomon (RS) codes are prevalent in many communication systems and data storage devices. They are powerful codes that can be efficiently decoded using traditional algebraic hard-decision decoding (HDD) methods such as the Berlekamp-Massey algorithm (denoted by BM-HDDA) and Euclid's algorithm. However, these traditional methods fail to exploit soft reliability information readily available at the output of the detector. With moderate complexity, but also with little improvement in performance for practical values of signal-to-noise ratio (SNR), generalized minimum distance (GMD) decoding, Chase decoding, and their variations were devised to make use of soft reliability information. Reliability-based decoding can also be applied to the binary images of RS codes. Based on the list decoding algorithm of Guruswami and Sudan, Köetter and Vardy (KV) proposed an algebraic soft-decision (ASD) decoding method for RS codes that incorporates reliability to improve performance over previous algebraic decoding algorithms. Analysis, extensions, modifications, refinements, and variations of KV algorithm are numerous in the art.

To improve performance beyond the ASD algorithms, non-algebraic methods have been proposed by Vardy and Be' ery to achieve the maximum-likelihood decoding (MLD) performance based on binary representation of an RS code as a union of cosets. However, the running time of these decoding methods grows exponentially with the length of the code. Indeed, it has been shown by Guruswami and Vardy that MLD of RS codes is NP-hard. Except for codes of lengths up to 15, decoding based on the trellis representation of RS codes is not feasible due to the enormous number of states in the trellis. Liu and Lin devised a turbo algorithm for soft-decision decoding (SDD) of RS codes based on decomposing the binary image of an RS code into binary component codes with relatively small trellis complexities, which are concatenated in a way that permits turbo decoding of RS codes of lengths up to 127.

Iterative decoding methods based on belief propagation (BP), such as the sum-product algorithm (SPA) and the min-sum algorithm (MSA), were proposed to decode low-density parity-check (LDPC) codes resulting in excellent performance with reasonable complexity that allows these codes to be used in practical applications. These decoding algorithms work on the parity-check matrices of LDPC codes which are sparse and their associated Tanner graphs have small number of short cycles, if any. However, due to the high-density of nonzero elements in their parity-check matrices and large number of short cycles, especially cycles of length four, in their associated Tanner graphs, direct application of these decoding methods is not suitable for RS codes. To overcome these difficulties, Jiang and Narayanan (JN) proposed an iterative BP-algorithm for decoding RS codes that uses a binary parity-check matrix for the code that is adapted using Gaussian elimination before each decoding iteration, in order to make the variable nodes (VNs) of lowest reliability connected with single edges to check nodes (CNs). Since this algorithm adapts parity-check matrices before running a decoding iteration based on BP, it is commonly referred to as an adaptive-BP-algorithm (or simply ABPA). Although the JN-ABPA gives good performance, its complexity may not be tolerable in practical applications. To reduce the complexity, it was proposed to use a redundant fixed set of parity-check equations corresponding to low-weight codewords in the binary image of the dual code, and select a subset of these equations based on the least reliable bits for decoding. For further improvement in performance, El-Khamy and McEliece (KM) presented an algorithm that combines the KV-ASD and the JN-ABPA. However, this improved ABPA, called KM-ABP-ASD algorithm (or simply KM-ABP-ASDA), still requires a very large computational complexity for practical applications. There is a need in the art for systems and methods for efficiently encoding and/or decoding information bits with reduced complexity.

BRIEF SUMMARY OF THE INVENTION

Certain embodiments disclose a method for joint encoding. The method includes, in part, obtaining a sequence of encoded symbols. The sequence of encoded symbols may be generated through GFT. The method further includes, in part, jointly decoding the sequence of encoded symbols using an iterative soft decision decoding algorithm to generate a decoded sequence, transforming the decoded sequence to generate a plurality of cyclic codewords, and decoding the plurality of cyclic codewords to generate a plurality of decoded information symbols.

In one embodiment, jointly encoding the plurality of cyclic codewords includes, in part, permuting each of the plurality of cyclic codewords to generate a plurality of permuted codewords, combining the plurality of permuted codewords to generate a cascaded codeword, interleaving the cascaded codeword using an interleaving matrix to obtain an interleaved codeword, and performing a Galois Fourier Transform on the interleaved codeword to generate the at least one combined codeword.

In one embodiment, the plurality of permuted codewords are generated using Hadamard permutation algorithm. Any other permutation method may also be used without departing from the teachings of the present disclosure. In one embodiment, the plurality of cyclic codewords correspond to a first finite field and the at least one combined codeword corresponds to a second finite field, larger than the first finite field.

In one embodiment, the combined codeword includes a quasi-cyclic low density parity check codeword. In one embodiment, the quasi-cyclic low density parity check codeword corresponds to a binary parity check matrix.

In one embodiment, the plurality of cyclic codewords are generated based on Reed-Solomon code. In another embodiment, the plurality of cyclic codewords are generated based on Bose-Chaudhuri-Hocquenghem (BCH) codes. In yet another embodiment, the plurality of cyclic codewords are generated based on Quadratic Residue (QR) codes. In another embodiment, the plurality of cyclic codewords are generated based on Reed-Muller codes. It should be noted that in general, the plurality of cyclic codewords may be generated using any cyclic code generation algorithm known in the art, or a combination thereof, without departing from the teachings of the present disclosure.

In one embodiment, generating the plurality of cyclic codewords comprises encoding the sequence of information symbols using a single parity check cyclic code algorithm. In one embodiment, the method further includes, in part, generating at least one shortened cyclic codeword of prime length by performing a shortening procedure on at least one of the plurality of cyclic codewords when a length of the plurality of cyclic codewords is a composite number, and jointly encoding the at least one shortened cyclic codes to generate the combined codewords.

In one embodiment, the method further includes, in part, encoding the at least one combined codeword using an error-correcting coding algorithm to generate at least one post-GFT encoded codeword, and providing the at least one post-GFT encoded codeword to the device.

Certain embodiments disclose a method for joint decoding. The method includes, in part, obtaining a sequence of encoded symbols. In one embodiment, the sequence of encoded symbols is generated through GFT. The method further includes jointly decoding the sequence of encoded symbols using an iterative soft decision decoding algorithm to generate a decoded sequence, transforming the decoded sequence to generate a plurality of cyclic codewords, and decoding the plurality of cyclic codewords to generate a plurality of decoded information symbols.

In one embodiment, transforming the decoded sequence to generate a plurality of cyclic codewords includes performing an inverse Galois Fourier Transform on the decoded sequence to generate a plurality of transformed codewords, de-interleaving the plurality of transformed codewords to generate a plurality of de-interleaved codewords, and performing inverse permutation on the plurality of de-interleaved codewords to generate a plurality of cyclic codewords.

In one embodiment, performing inverse permutation on the plurality of de-interleaved codewords further includes, in part, de-combining the plurality of de-interleaved codewords to generate a plurality of de-combined codewords, and permuting the plurality of de-combined codewords to generate the plurality of cyclic codewords.

In one embodiment, the sequence of encoded symbols corresponds to a first finite field, and the plurality of transformed codewords correspond to a second finite field. The first finite field is larger than the second finite field.

In one embodiment, the method further includes, in part, decoding the sequence of encoded symbols using hard decision decoding to generate a sequence of corrected symbols, and jointly decoding the sequence of corrected symbols using the iterative soft decision decoding algorithm to generate the decoded sequence.

In one embodiment, the iterative soft decision decoding algorithm is Min-Sum algorithm. In one embodiment, a length of at least one of the plurality of cyclic codewords is a prime number. In one embodiment, the plurality of cyclic codewords correspond to a finite field of characteristic two. In one embodiment, the plurality of cyclic codewords includes Reed-Solomon codes, BCH codes, QR codes, Reed Muller codes, and the like.

Certain embodiments disclose an apparatus for joint encoding. The apparatus includes, in part, a memory, and at least one processor coupled to the memory. The at least one processor is configured to obtain a sequence of information symbols, generate a plurality of cyclic codewords, each cyclic codeword corresponding to a portion of the sequence of information symbols, and jointly encode the plurality of cyclic codewords to generate at least one combined codeword. In one embodiment, the at least one combined codeword is generated through Galois Fourier Transform. The at least one processor is further configured to provide the at least one combined codeword to a device.

Certain embodiments disclose an apparatus for joint decoding. The apparatus includes, in part, a memory, and at least one processor coupled to the memory. The at least one processor is configured to obtain a sequence of encoded symbols, wherein the sequence of encoded symbols is generated through Galois Fourier Transform, jointly decode the sequence of encoded symbols using an iterative soft decision decoding algorithm to generate a decoded sequence, transform the decoded sequence to generate a plurality of cyclic codewords, and decode the plurality of cyclic codewords to generate a plurality of decoded information symbols.

Certain embodiments disclose a non-transitory processor-readable medium for joint encoding. The non-transitory processor-readable medium includes, in part, processor-readable instructions configured to cause one or more processors to obtain a sequence of information symbols, generate a plurality of cyclic codewords, each cyclic codeword corresponding to a portion of the sequence of information symbols, and jointly encode the plurality of cyclic codewords to generate at least one combined codeword. The at least one combined codeword is generated through Galois Fourier Transform. The processor-readable instructions are further configured to provide the at least one combined codeword to a device.

Certain embodiments disclose non-transitory processor-readable medium for joint decoding. The non-transitory processor-readable medium includes processor-readable instructions configured to cause one or more processors to obtain a sequence of encoded symbols, wherein the sequence of encoded symbols is generated through Galois Fourier Transform, jointly decode the sequence of encoded symbols using an iterative soft decision decoding algorithm to generate a decoded sequence, transform the decoded sequence to generate a plurality of cyclic codewords, and decode the plurality of cyclic codewords to generate a plurality of decoded information symbols.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 19 provides a schematic illustration of one embodiment of a computer system that can perform various blocks of the methods provided by various embodiments.

DETAILED DESCRIPTION OF THE INVENTION

Figure 1B:
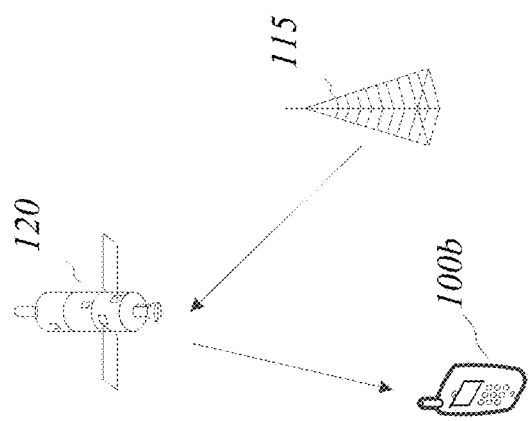
FIGS. 1A through 1D illustrate example communications and/or storage systems, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "block code" is used herein to refer to any member of family of error-correcting codes that encode data in blocks of predetermined lengths. In addition, "cyclic code" is used herein to refer to a block code in which circular shifts of each codeword results in another codeword that belongs to the same code. The term "cyclic encoding algorithm" is used herein to refer to an algorithm that is used to encode a message using a cyclic code. The term codeword is used herein to refer to a sequence of encoded symbols that are generated by applying an encoding algorithm to a sequence of information bits.

The terms "communication channel" or "channel" are used interchangeably to refer to a communication medium through which a signal is transmitted. In a wireless communication, the communication channel may be air. In wired transmission the communication channel may be the metal in the wire or fiber optic.

The term "storage channel" is used herein to refer to a storage device, such as a hard drive or any other type of memory that can be used to store information for a period of time. The term "finite field" or "Galois field" is used herein to refer to a "field" that contains a finite number of elements (as is well known in mathematics). As with any field, a finite field is a set on which the operations of multiplication, addition, subtraction and division are defined and satisfy certain basic rules. The number of elements of a finite field is called its order. A finite field of order q exists if and only if the order q is a prime power $p^k$ (where p is a prime number and k is a positive integer). In a field of order $p^k$, adding p copies of any element always results in zero. Therefore, the "characteristic" of the field is considered to be equal to p.

Certain embodiments disclose a novel coding scheme for encoding and iterative soft decision decoding (SDD) of a class of cyclic codes. One embodiment operates on a class of cyclic codes over finite fields of prime lengths which include all RS and BCH codes of prime lengths over fields of characteristic two, as well as all quadratic residue (QR) codes, and the like. The key to this coding scheme is to map a sequence of codewords in a cyclic code C and its permuted equivalents into a codeword in a powerful quasi-cyclic (QC) LDPC code $C_{LDPC}$ whose parity-check matrix $H_{LDPC}$ is an array of binary circulant permutation matrices (CPMs), the Tanner graph of which is free of cycles of length four. At the decoder, the received sequence is decoded iteratively based on a binary parity-check matrix of the QC-LDPC code $C_{LDPC}$ with a binary iterative soft-decision BP-algorithm. The decoded sequence is then transformed into a sequence of decoded codewords in C through inverse mapping and inverse permutations. Errors not corrected by the LDPC decoder can be decoded using an HDD decoder based on the code C. In one embodiment, the mapping involves symbol permutation within each codeword, combining codewords into a codeword in a code over an extension field, interleaving the permuted codewords, and Galois Fourier transform (GFT). In one embodiment, the inverse mapping involves the inverse GFT, de-interleaving, de-combining codewords, and inverse symbol permutation of each decoded codeword. In general, any other transformation may also be performed on the codewords without departing from the teachings of the present disclosure.

In one embodiment, the proposed coding scheme decodes a cascade of a cyclic code C and a number of its permuted equivalents as a single LDPC code in the GFT domain. In this example, although the LDPC code is non-binary, its parity-check matrix is binary and most importantly the decoding is carried out in binary using a binary iterative soft-decision BP-algorithm. This binary decoding can be performed efficiently and reduces the decoding complexity significantly. For decoding RS and BCH codes, the proposed decoding scheme not only requires much lower decoding complexity than other SDD schemes or algorithms, but also yields superior performance. Computing GFTs and their inverses can be implemented efficiently with fast algorithms. Since the LDPC code $C_{LDPC}$ is QC, the QC-structure simplifies its decoder implementation in terms of wire routing and allows partial parallel decoding. Furthermore, since RS and BCH codes are cyclic, their encoding can be easily implemented with simple feedback shift-registers. It should be emphasized that the coding scheme described herein operates at a coding rate which is at least equal to if not more than the coding rate of the cyclic code C.

One of the most important features of the proposed decoding scheme is that the decoding is performed on a collection of received codewords jointly. During the decoding process, the reliability information of each decoded codeword is shared by the others to enhance the overall reliability of all the decoded codewords. This joint-decoding and information sharing may result in an error performance per decoded codeword better than that of a received codeword decoded individually using maximum likelihood decoding (MLD). This will be demonstrated through examples.

Embodiments of the present disclosure may be used in various systems, including but not limited to high-speed optical communications, mobile and/or cellular communication systems, high-density storage systems, such as 3-dimensional flash memory, and/or any other type of system that needs to correct errors that are caused by noise and/or interference from internal and/or external components. It may also find applications in a combination of multiple-access and broadcast communications (downlinks) for error control. The communication systems may include optical communications, satellite communications, cellular communications, peer to peer communications, or any other type of communications systems.

Figure 1D:
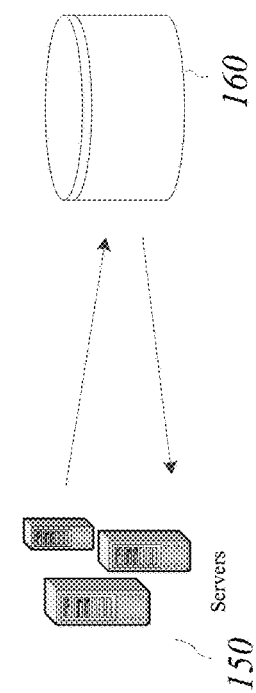
Figure 1A:
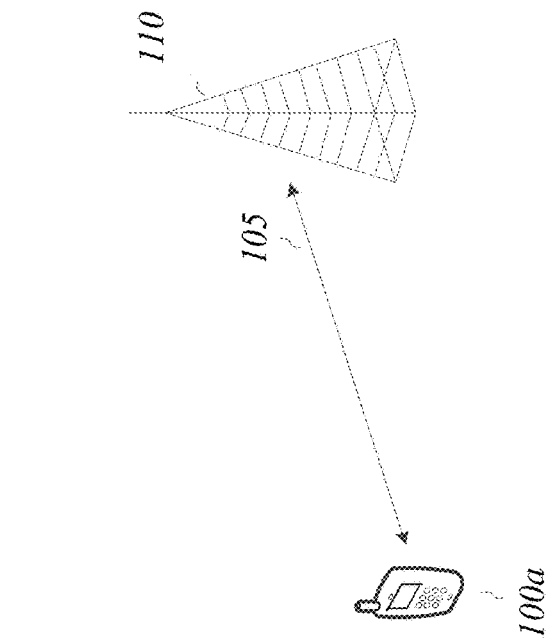

FIG. 1A through 1D illustrate example communications and/or storage systems, in accordance with certain embodiments of the present disclosure. Each of these systems may utilize error control coding (e.g., channel encoding and/or decoding) in order to improve the performance of data communications. FIG. 1A illustrates a cellular communication system, including a mobile device 100a and a base station (cell tower) 110. The mobile device sends and receives messages 105 to/from the base station through the communication channel. In this example, the communication channel is a wireless channel. The mobile device may perform channel encoding on messages before transmitting them through the channel to the base station 110. The base station may perform channel decoding on the received messages to correct some or all of the errors in the received messages. In the other direction, the base station 110 may perform channel coding on messages before transmitting them through the channel to the mobile device 100b. The mobile device may perform channel decoding on the received messages to correct some or all of the errors in the received messages.

The term "channel encoding" is used herein to refer to a process of encoding a message using an error control coding. In general, channel encoding is performed by adding extra bits (such as parity or checksum bits) to a codeword that can be used at the receiver to correct any possible errors in the received codeword. The term "channel decoding" is used herein to refer to the process of decoding a received message using a channel decoder to retrieve the original un-coded information bits and/or symbols. The channel decoder utilizes the redundant bits in the received message to correct any possible errors.

FIG. 1B illustrates an example satellite communications system, in which a mobile device 100b communicates with a base station 110 through a satellite 120. Similar to the cellular communications system in FIG. 1A, mobile device 100b and/or the base station 115 may process messages before transmitting them through the channel. In one example, in forward link, the base station 115 performs channel coding on messages before transmitting them through the channel to the mobile device 100b. The channel is a wireless channel between the base station and the satellite, and the wireless channel between the satellite and the mobile device. The mobile device may perform channel decoding on the received messages to correct some or all of the errors in the received messages. In the reverse link (not shown), mobile device 100b performs channel encoding on messages before transmitting them through the channel to the base station 115. The base station performs channel decoding on the received messages to correct some or all of the errors in the received messages.

Figure 1C:
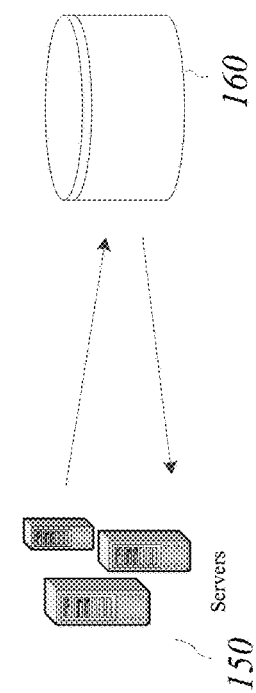

FIG. 1C illustrates an example peer to peer communications system, in which a mobile device 100c communicates with another mobile device 100d through a communication channel. Similar to the cellular communications system in FIG. 1A, mobile devices 100c and 100d process the messages before and after transmission through the channel. For example, mobile device 100c may perform channel encoding on the messages before transmitting the encoded messages through the channel to mobile device 100d. The receiver (e.g., mobile device 100d) may perform channel decoding on the received messages to correct some or all of the errors in the received messages. Similarly, in the other direction, mobile device 100d may perform channel encoding on the messages and transmit them through the channel to mobile device 100c. Mobile device 100c may then perform channel decoding on the received messages to correct the errors in the received messages.

FIG. 1D illustrates an example storage system, in which one or more servers 150 communicate with a storage unit 160. The communications may be wired or wireless. Similar to the example systems shown in FIGS. 1A through 1C, the servers 150 may process the information to be stored before sending them to the storage unit 160 for storage. The storage unit may include a hard disk, flash memory and/or any other device capable of storing information. In one example, the storage unit is an internal component of one of the servers. In another example, the storage is external to the servers which is accessed through a network. Any other topology may be considered without departing from the teachings of the present disclosure.

In this example, the storage unit may be considered as a storage channel. The servers may perform channel encoding before storing the information in the storage unit, and perform channel decoding after retrieving the information from the storage unit. In general, the servers may perform any other type of processing on the information before storing and/or after retrieving the information from the storage unit without departing from the teachings of the present disclosure.

Figure 2A:
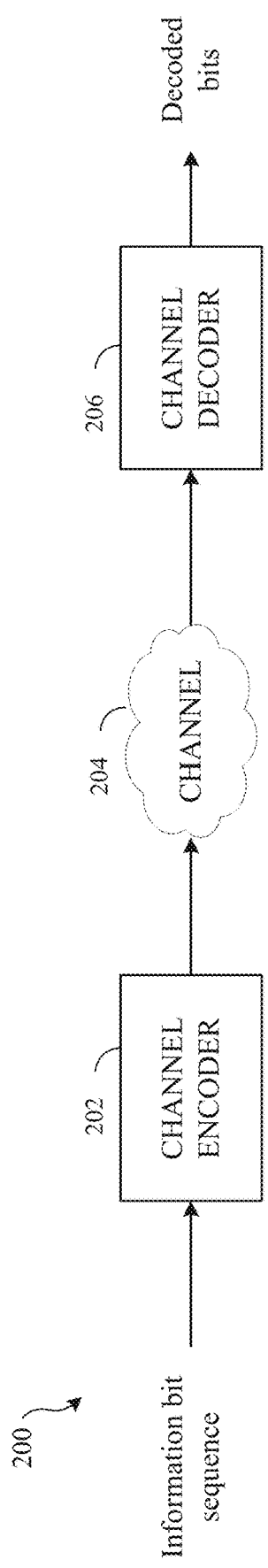
FIG. 2A illustrates an example error control coding system, in accordance with certain embodiments of the present disclosure.

FIG. 2A illustrates an example error control coding system 200, in accordance with certain embodiments of the present disclosure. The example error control coding system may include a channel encoder 202, and a channel decoder 206. Although not shown in the figure, any other type of processing (e.g., source coding, modulation/demodulation, detection, equalization, and the like) may also be performed on the transmitted message and/or received messages without departing from the teachings of the present disclosure. One of ordinary skill in the art would readily understand the differences between source coding and channel coding. In general, source coding may refer to the process of compressing information by removing extra bits from a message. On the other hand, channel coding refers to the process of intelligently adding extra bits to a message that can later be used in error detection and/or correction.

The channel encoder 202 receives information bit sequence, encodes the information bits by adding redundancy to generate encoded codewords. The codewords may then be transmitted through the channel 204 and/or saved in a storage system. Noise, interference and/or any other disturbances may cause errors in the transmitted bits. At the receiver side, the channel decoder 206 may receive a signal that may include the encoded bits and noise. The channel decoder 206 decodes the received signal to correct the errors and generate the decoded bits.

Figure 2B:
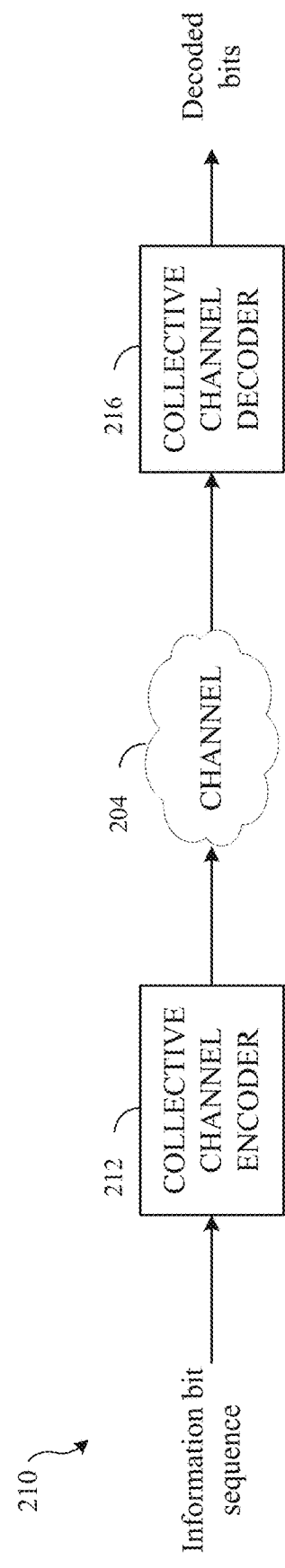
FIG. 2B illustrates an example collective encoder/decoder system, in accordance with certain embodiments of the present disclosure.

FIG. 2B illustrates an example collective encoder/decoder system 210, in accordance with certain embodiments of the present disclosure. As illustrated, the collective encoder/decoder system may include a collective channel encoder 212, a collective channel decoder 216. Although not shown in the figure, any other type of processing (e.g., source coding, modulation/demodulation, detection, equalization, and the like) may also be performed on the transmitted message and/or received messages without departing from the teachings of the present disclosure. The collective encoder/decoder system jointly encodes N codewords, and transmits them through the channel 204. At the receiver side, the collective channel decoder jointly decodes the received codewords to generate the decoded bits.

Figure 3:
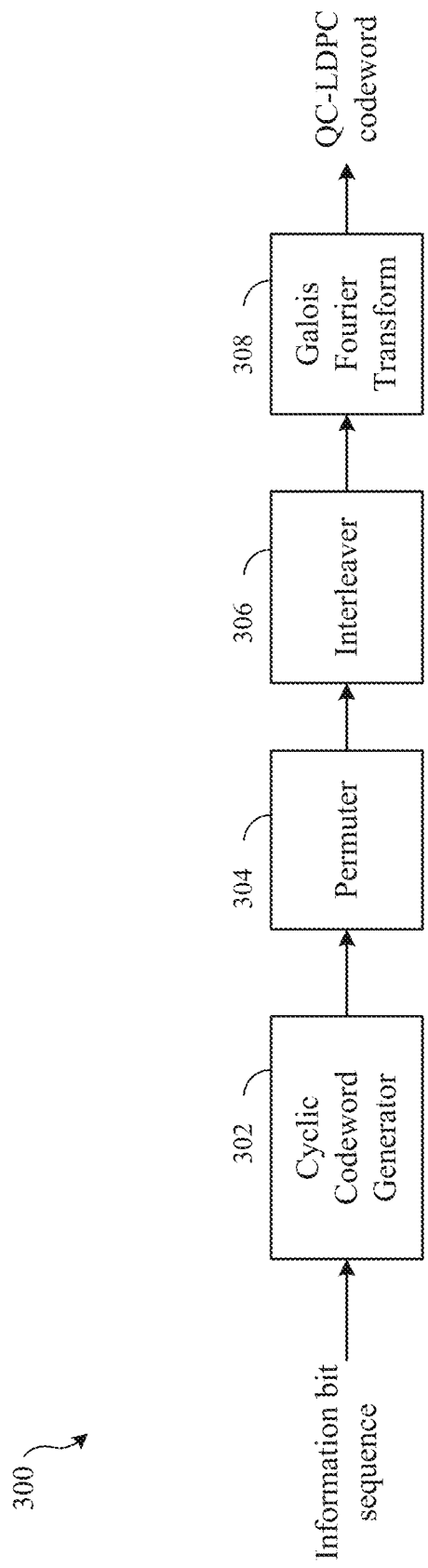
FIG. 3 illustrates an example collective encoder, in accordance with certain embodiments of the present disclosure.

FIG. 3 illustrates an example collective encoder 300, in accordance with certain embodiments of the present disclosure. As illustrated, the collective encoder may include a cyclic codeword generator 302, a permuter 304, an interleaver 306 and a Galois Fourier transform 308. In general, the collective encoder may include any other processing blocks without departing from the teachings of the present disclosure. The collective encoder 300 receives an information bit sequence. The cyclic codeword generator 302 generates a collection of N cyclic codewords. The permuter 304 permutes the collection of N cyclic codewords using a permutation scheme. For example, the permuter uses Hadamard-permutations to permute symbols of the codewords in the collection. An example of a symbol is a bit (e.g., a binary symbol). Next, the permuted codewords are interleaved by the interleaver 306. Galois Fourier Transform (GFT) 308 is applied to the sequence of interleaved codewords to generate one or more encoded codewords. In one embodiment, the one or more encoded codewords are QC-LDPC codewords, as will be described in more detail later.

Figure 4:
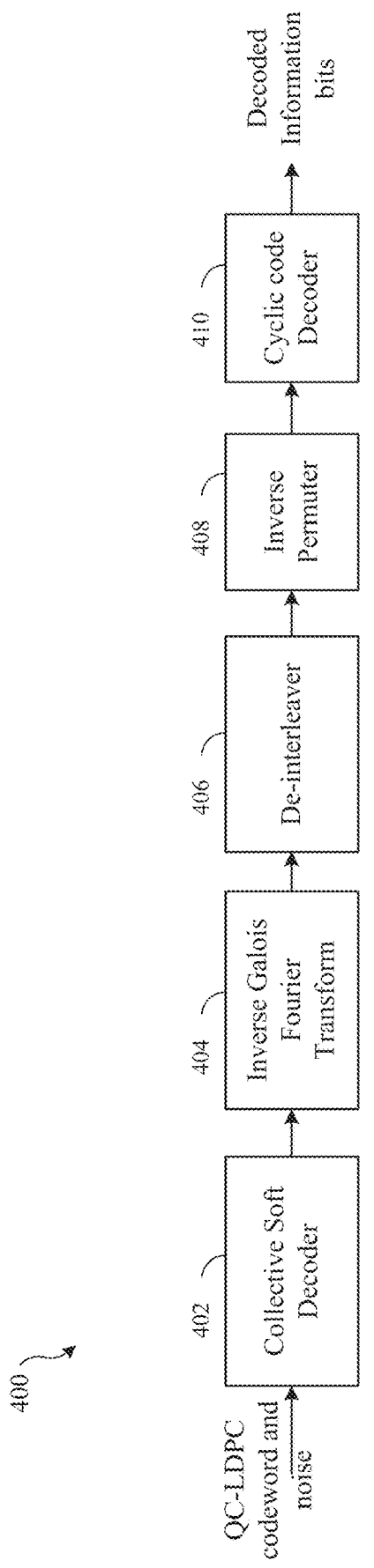
FIG. 4 illustrates an example collective decoder, in accordance with certain embodiments of the present disclosure.

FIG. 4 illustrates an example collective decoder 400, in accordance with certain embodiments of the present disclosure. As illustrated, the collective decoder may include a collective soft decoder 402, an inverse Galois Fourier transform 404, a de-interleaver 406, an inverse permuter 408 and a cyclic code decoder 410. The collective decoder may also include any other processing block without departing from the teachings of the present disclosure. The collective decoder 400 receives a sequence of received symbols that has passed through a channel. In one embodiment, n codewords are embedded in the received sequence of $n^2$ symbols over GF(Q). In one example, the received sequence is a QC-LDPC codeword that may include some errors because of the noise and interference in the channel. The received sequence is passed through a collective soft decoder 402. In one embodiment, the n embedded codewords in the received sequence of $n^2$ symbols over GF(Q) are decoded jointly using a binary iterative soft-decision belief propagation (BP)-decoding algorithm based on the binary LDPC matrix $H_{LDPC}$. The joint-decoding allows information sharing among the n received codewords embedded in the received sequence during the iterative decoding process.

After the collective soft decoding, the n embedded codewords are retrieved through inverse GFTs 404, de-interleaving 406 and inverse Hadamard-permutations 408. If any of the decoded codewords is detected in error, the cyclic code decoder 410, may perform hard decision decoding (HDD) based on the cyclic code $C_{cyc}$ to correct residual errors. The joint-decoding and information sharing may result in an error performance per decoded codeword better than the error performance of a received codeword decoded individually using MLD as demonstrated in several examples. In one embodiment, the joint decoder scheme decodes a Q-ary received sequence in binary based on a binary LDPC matrix. The binary iterative decoding can be performed efficiently and reduces the decoding complexity significantly.

The rest of this disclosure is organized as follows. First, a class of cyclic codes of prime lengths is defined over finite fields of characteristic two in terms of parity-check matrices. This class of cyclic codes contains a subclass of RS codes and a subclass of BCH codes, namely all RS and BCH codes of prime lengths over such fields. In addition, Hadamard-powers of parity-check matrices are defined and their null spaces are characterized. In one embodiment, the GFT is used to transform a collection of codewords in the cyclic code into a codeword in an LDPC code over a larger field that has a binary parity-check matrix. We show that this matrix has good structural properties which allows for excellent performance when used for decoding by iterative SDD. In one embodiment, a coding scheme is developed for encoding and decoding in the GFT domain. In another embodiment, a technique is disclosed for shortening a cyclic code of prime length to a desired length and its associated LDPC code and a method is presented to reduce the code rate to various degrees but maintain the code length. In yet another embodiment, the proposed iterative SDD scheme is applied to RS codes. It is shown that the proposed scheme not only requires much lower decoding complexity than other SDD schemes or algorithms, but also yields superior performance. In later sections two example embodiments are presented in which the proposed decoding scheme is applied to binary BCH codes and QR codes. It is shown that even binary cyclic Hamming codes can perform extremely well.

A Class of Cyclic Codes of Prime Lengths over Finite Fields

In this section, cyclic codes of prime lengths over finite fields of characteristic two are defined. Next, the Hadamard-equivalents of the cyclic codes of prime length are explained. It should be noted that although cyclic codes of prime length are used in the following embodiments, in general, the codes may have any length (e.g., prime or composite), without departing from the teachings of the present disclosure.

Cyclic Codes of Prime Lengths

Let GF(q) be a finite field of characteristic two, say $q=2^\kappa$ for some positive integer $\kappa$, and C be an (n, n−m) cyclic code over GF(q) of odd prime length n and dimension n−m. Then, C has a generator polynomial $g(X)=\Pi_{i=0}^{m-1}(X-\beta^{l_i})$ where $0 \leq l_0 < l_1 < \ldots < l_{m-1} < n$, and $\beta$ is an element of order n in an extension field $GF(q^\tau)$ of GF(q) for some positive integer $\tau$. It follows from the Singleton bound that the minimum distance of C is at most m+1. In one embodiment, a parity-check matrix of C can be expressed in terms of the roots of its generator polynomial as follows:

$$B = [\beta^{jl_i}]_{0 \leq i < m, 0 \leq j < n} = \begin{bmatrix} 1 & \beta^{l_0} & \beta^{2l_0} & \ldots & \beta^{(n-1)l_0} \\ 1 & \beta^{l_1} & \beta^{2l_1} & \ldots & \beta^{(n-1)l_1} \\ \vdots & \vdots & \vdots & \ddots & \vdots \\ 1 & \beta^{l_{m-1}} & \beta^{2l_{m-1}} & \ldots & \beta^{(n-1)l_{m-1}} \end{bmatrix} \quad (1)$$

The matrix B given by (1) is an m×n matrix over $GF(q^\tau)$. A vector $v=(v_0, v_1, \ldots, v_{n-1})$ of length n over GF(q) is a codeword in C if and only if it is orthogonal to every row in B, i.e., $vB^T=0$, where $\tau$ denotes transpose. In polynomial form, the vector v is represented by a polynomial $v(X)=v_0+v_1 X+\ldots+v_{n-1}X^{n-1}$ over GF(q) of degree n−1 or less. Then, v(X) is a code polynomial if and only if v(X) is divisible by the generator polynomial g(X). This is the case if and only if $v(\beta^{l_0})=v(\beta^{l_1})=\ldots=v(\beta^{l_{m-1}})=0$, i.e., if and only if $\beta^{l_0}, \beta^{l_1}, \ldots, \beta^{l_{m-1}}$ are roots of v(X).

The matrix B in (1) satisfies the following property which is relevant for iterative decoding as shown later.

Lemma 1 Any 2×2 submatrix of B given by (1) is nonsingular.

Proof: For $0 \leq i=i' < m$, $0 \leq j=j' < n$, the 2×2 submatrix of B composed of the elements in rows i and i' and columns j and j' has determinant $\beta^{jl_i}\beta^{j'l_{i'}} - \beta^{j'l_i}\beta^{jl_{i'}} = \beta^{jl_i+j'l_{i'}}(1-\beta^{-(j'-j)(l_{i'}-l_i)})$.

Since $l_{i'}-l_i \neq 0$, $j'-j \neq 0$, $-n < l_i$, $j'-j < n$, and $\beta$ is an element of prime order n, it follows that this determinant is nonzero. From this lemma, it follows that the matrix B satisfies a 2×2 submatrix-nonsingular (SNS) constraint.

There are two special cases that we are particularly interested in and they are important for practical applications. However, the scope of the present disclosure is not limited to these cases and, in general, the proposed coding/decoding technique can be applied to any codes without departing from the teachings of the present disclosure.

In one embodiment, $\tau=1$ and $l_0=1, l_1=2, \ldots, l_{m-1}=m$. In this case, the cyclic code C given by the null space of the parity-check matrix B in the form of (1) is an (n, n−m) RS code over GF(q), denoted by $C_{RS}$, of length n and dimension n−m. The length n of the code is a prime factor of q−1. The generator polynomial $g_{RS}(X)$ of this RS code has m consecutive powers of $\beta$ namely, $\beta, \beta^2, \ldots, \beta^m$, as its roots, and the minimum distance of the code is exactly equal to m+1. If q−1 is a prime, then n=q−1 and $\beta$ is a primitive element of GF(q). In this case, the code $C_{RS}$ is a primitive RS code of length q−1. If q−1 is not a prime, then n is a prime factor of q−1 and $C_{RS}$ is a nonprimitive RS code. As an example, let $q=2^7$, i.e., $\kappa=7$. Then, q−1=127 is a prime and $\beta$ is a primitive element of the field $GF(2^7)$. In one example, m=8 and $\beta, \beta^2, \beta^3, \ldots, \beta^8$ can be used to form an 8×127 parity-check matrix, denoted by $B_{RS}$, over $GF(2^7)$ in the form of (1). Then, the null space over $GF(2^7)$ of $B_{RS}$ gives a 128-ary (127,119) RS code of length 127. In this example, the code has minimum distance 9 and rate 0.937. The code in this example is a 4-symbol-error-correcting RS code.

In another embodiment, q=2, i.e., $\kappa=1$, and $\beta$ is an element of order n in $GF(2^\tau)$ which is a prime factor of $2^\tau-1$. Consider a cyclic code of length n over GF(2) whose generator polynomial $g_{BCH}(X)$ has m roots which include 2 t consecutive powers of $\beta$, namely, $\beta, \beta^2, \ldots, \beta^{2t}$ and their conjugates. It is clear that 2t≤m. Then, the null space over GF(2) of B (denoted by $B_{BCH}$) in the form of (1) gives a t-error-correcting BCH code, denoted by $C_{BCH}$, of length n and dimension n−m. If $2^\tau-1$ is a prime, then $\beta$ is a primitive element of $GF(2^\tau)$ and $n=2^\tau-1$. In this case, $C_{BCH}$ is a primitive BCH code. If 2' 1 is not a prime and n is a prime factor of $2^\tau-1$, then $C_{BCH}$ is a nonprimitive BCH code. The t-error-correcting binary BCH code of length n is a subfield subcode of the t-symbol-error-correcting RS code of length n over GF($2^\tau$) and dimension n−2t. As an example, let $\kappa=1$, $\tau=7$, q=2, and t=4. Then, there exists a 4-error-correcting (127,99) primitive BCH code whose generator polynomial has $\beta, \beta^2, \ldots, \beta^8$ and their conjugates as roots (a total of 28 roots). In this case, the parity-check matrix $B_{BCH}$ in the form of (1) is a 28×127 matrix over GF($2^7$). This code is a subfield subcode of the 128-ary (127,119) RS code given above.

In yet another embodiment, a class of binary QR codes is considered as an example. This class of binary QR codes has good minimum distance properties but is difficult to be decoded algebraically. The most well-known QR code is the (23,12) Golay code with minimum distance 7, which is a perfect code.

Hadamard Equivalents of a Cyclic Code

Let t be a nonnegative integer. The t-th Hadamard-power of B is defined as a matrix, denoted by $B^{\circ t}=[\beta^{tjl_i}]_{0 \leq i < m, 0 \leq j < n}$, which is obtained by raising each entry $\beta^{jl_i}$ in B to the t-th power. For 1≤t<n, the j-th column of B, for 0≤j<n, is the $(jt^{-1})_n$-th column of $B^{\circ t}$, where $(u)_d$ for integers u and d≥1 denotes the least nonnegative integer congruent to u modulo d, i.e., $(u)_d = u - \lfloor u/d \rfloor d$, and $t^{-1}$ is the inverse of t modulo n, which exists for all 1≤t<n as n is a prime. Let $\pi_t(j)=(jt^{-1})_n$ for $1 \leq t < n$ and $0 \leq j < n$. Since n is a prime, $\pi_t(j) \neq \pi_t(j')$ for $0 \leq j \neq j' < n$. Hence, $\pi_t$ is a permutation on $\{0,1,\ldots,n-1\}$ which we call the t-th Hadamard permutation. Therefore, for $1 \leq t < n$, $B^{\circ t}$ is simply a column-permutation of B. Clearly, $B^{\circ t}$, $1 \leq t < n$, has the same rank as B, which is m. Note that $B^{\circ 1} = B$. For $t=0$, $B^{\circ 0}$ is an all-one matrix of size m×n.

For $1 \leq t < n$, let $C^{(t)}$ be the code given by the null space over GF(q) of $B^{\circ t}$. Then, $C^{(t)}$ is an (n, n−m) code over GF(q) which is equivalent to the (n, n−m) cyclic code C given by the null space over GF(q) of B defined by (1). The code $C^{(t)}$ can be obtained from C by applying the permutation $\pi_t$ to its codewords. In this disclosure, the term $C^{(t)}$ is used to refer to the t-th Hadamard-equivalent of C. Hereafter, the notation $\pi_t$ is used to denote both the t-th Hadamard-permutation of the columns of the matrix B, and the t-th Hadamard-permutation of the codewords of the code C. Applying the permutation $\pi_t$ to a codeword in C results in a codeword in $C^{(t)}$. Note that $(v_0, v_1, \ldots, v_{n-1})$ is in the null space of $B^{\circ t}$ if and only if the polynomial $\Sigma_{i=0}^{n-1} v_i X_i$ has $\beta^{t i_0}, \beta^{t i_1}, \ldots, \beta^{t i_{m-1}}$ as roots. Hence, for $1 \leq t < n$, $C^{(t)}$ is a cyclic code with generator polynomial $g^{(t)}(X) = \Pi_{i=0}^{m-1}(X - \beta^{t i_i})$. For $t=0$, the null space over GF(q) of $B^{\circ 0}$ gives an (n, n−1) code $C^{(0)}$ of length n and dimension n−1. This code $C^{(0)}$, which has a single parity-check (SPC) symbol, is called an SPC code. It is a cyclic code generated by $g^{(0)}(X) = (X-1)$. Note that $C^{(0)}$ has minimum distance 2 while each of $C^{(1)}, C^{(2)}, \ldots, C^{(n-1)}$ has minimum distance at most m+1 based on the Singleton bound. For $t=1$, $B^{\circ 1} = B$ and $C^{(1)} = C$. Summarizing the above developments, we have the following theorem.

Theorem 1. For $1 \leq t < n$, the t-th Hadamard-power $B^{\circ t}$ of B is a column-permutation of B specified by $\pi_t$. The code $C^{(t)}$ given by the null space over GF(q) of $B^{\circ t}$ is a cyclic code equivalent to the code C given by the null space over GF(q) of B. For $t=0$, $B^{\circ 0}$ is an all-one matrix of size m×n whose null space gives an (n, n−1) SPC code over GF(q).

Transforming a Cyclic Code to an LDPC Code

In in one embodiment, $\pi$ copies of the cyclic code $C^{(t)}$ of length n over GF(q) for each t, $0 \leq t < n$, are combined to form a code $C_\phi^{(t)}$ of length n over GF($q^\tau$). Then, the codes $C_\tau^{(t)}$, are cascaded for $0 < t < n$, to obtain a code $C_{casc}$ of length $n^2$ over GF($q^\tau$). The subscript "casc" stands for "cascade." A permutation, denoted by $\pi$, is performed on $C_{casc}$ to obtain a code $C_{casc}^\pi$ and then the GFT is finally applied to $C_{casc}^\pi$ that results in a code $C_{casc}^{\pi, F}$. This final code turns out to be an LDPC code over GF ($q^\tau$) as it has an LDPC matrix. As an LDPC code, we denote it by $C_{LDPC}$. Starting with the parity-check matrix B of the cyclic code, in one embodiment, we track the above transformations to determine a low-density parity-check matrix for the final LDPC code.

The Code $C_\tau^{(t)}$ and its Parity-Check Matrix $B^{\circ t}$

In one embodiment, let C be an (n, n−m) cyclic code over GF(q) with parity-check matrix B given by (1). Then, for $0 \leq t < n$, $C^{(t)}$ is the cyclic code with parity-check matrix $B^{\circ t} = [\beta^{t j i_i}]_{0 \leq i < m, 0 \leq j < n}$, which is the t-th Hadamard-power of B. Consider $\tau$ codewords $c_{0,t}, c_{1,t}, \ldots, c_{\tau-1,t}$ in $C^{(t)}$. These $\tau$ codewords of length n over GF(q) can be represented as a vector $c_t$ of length n over GF ($q^\tau$) given by $c_t = \tau_{i=0}^{\tau-1} c_{i,t} \alpha^i$, where $\alpha$ is a primitive element in GF ($q^\tau$). Note that the j-th component of $c_t$, $0 \leq j < n$, is the weighted sum of the j-th components of $c_{0,t}, c_{1,t}, \ldots, c_{\tau-1,t}, \ldots, c_{\tau-1,t}$, weighted by $\alpha^0, \alpha^1, \ldots, \alpha^{\tau-1}$, respectively. Let $C_\tau^{(t)}$ be the collection of all vectors $c_t$ corresponding to all sequences $(c_{0,t}, c_{1,t}, \ldots, c_{\tau-1,t})$ of $\tau$ codewords in $C^{(t)}$. Since $C^{(t)}$ is a cyclic code, then $C_\tau^{(t)}$ is a cyclic code over GF ($q^\tau$). The length and dimension of $C_\tau^{(t)}$ are the same as those of $C^{(t)}$, i.e., its length is n and its dimension is n−1 if t=0 and n−m if $1 \leq t < n$. However, the code $C_\tau^{(t)}$ is over GF ($q^\tau$) while the code $C^{(t)}$ is over GF(q).

In particular, $C_\tau^{(0)}$ has $q^{(n-1)\tau}$ codewords while the code $C^{(0)}$ has $q^{n-1}$ codewords and, for $1 \leq t < n$, the code $C_\tau^{(t)}$ has $q^{(n-m)\tau}$ codewords while the code $C^{(t)}$ has $q^{n-m}$ codewords.

It should be noted that the code $C_\tau^{(t)}$ has the same parity-check matrix $B^{\circ t}$ as $C^{(t)}$. Indeed, since every codeword in $C_\tau^{(t)}$ is a weighted sum of codewords in $C^{(t)}$, it follows that $C_\tau^{(t)}$ is in the null space of $B^{\circ t}$. As $B^{\circ t}$ is of rank 1 if t=0 and rank m if $1 \leq t < n$, and $C_\tau^{(t)}$ is of dimension n−1 if t=0 and dimension n−m if $1 \leq t < n$, it follows that the null space of $B^{\circ t}$ over GF ($q^\tau$) is precisely $C_\tau^{(t)}$. Note that from the codeword $c_t$ in $C_\tau^{(t)}$, it is possible to retrieve the codewords $c_{0,t}, c_{1,t}, \ldots, c_{\tau-1}$ in $C^{(t)}$ as every element in GF ($q^\tau$) can be written in a unique way as a polynomial in $\alpha$ of degree less than $\tau$.

In one embodiment, C is an RS code over GF(q), $\tau=1$ and, for each $0 \leq t < n$, the code $C_\tau^{(t)}$ is the same as $C^{(t)}$.

The Code $C_{casc}$ and its Parity-Check Matrix $H_{casc}$

In one embodiment, let $C_{casc}$ be the code over GF ($q^\tau$) of length $n^2$ obtained by cascading codewords in $C_\tau^{(0)}, C_\tau^{(1)}, C_\tau^{(n-1)}$ in this order. A codeword $c_{casc}$ in $C_{casc}$ is in the form of $c_{casc} = (c_0, c_1, \ldots, c_{n-1})$ with $c_t$ in $C_\tau^{(t)}$ for $0 \leq t < n$. The code $C_{casc}$ has length $n^2$, dimension $(n-1)+(n-m)(n-1)=(n-m+1)(n-1)$, and a parity-check matrix of the form:

$$H_{casc} = \text{diag}(B^{\circ 0}, B^{\circ 1}, \ldots, B^{\circ(n-1)}) = \begin{bmatrix} B^{\circ 0} & & & \\ & B^{\circ 1} & & \\ & & \ddots & \\ & & & B^{\circ(n-1)} \end{bmatrix}, \quad (2)$$

which is an n×n diagonal array of m×n matrices $B^{\circ 0}, B^{\circ 1}, \ldots, B^{\circ(n-1)}$. The array, $H_{casc}$, is an mn×$n^2$ matrix over GF ($q^\tau$). The rank of $H_{casc}$ is 1+m(n−1).

The Code $C_{casc}^\pi$ and its Parity-Check Matrix $H_{casc}^\pi$

In one embodiment, coordinates of the codewords in $C_{casc}$ and the rows and columns of its parity-check matrix $H_{casc}$ are permuted. First, the following index sequences are defined:

$$\pi_{row}^{(0)} = [0, m, 2m, \ldots, (n-1)m], \quad (3)$$

$$\pi_{row} = [\pi_{row}^{(0)}, \pi_{row}^{(0)}+1, \ldots, \pi_{row}^{(0)}+m-1], \quad (4)$$

$$\pi_{col}^{(0)} = [0, n, 2n, \ldots, (n-1)n], \quad (5)$$

$$\pi_{col} = [\pi_{col}^{(0)}, \pi_{col}^{(0)}+1, \ldots, \pi_{col}^{(0)}+n-1]. \quad (6)$$

In one embodiment, $\pi_{row}$ and $\pi_{col}$ define a permutation on $\{0, 1, \ldots, mn-1\}$ and a permutation on $\{0, 1, \ldots, n^2-1\}$, respectively. In particular, $\pi_{row}(mi'+i'')=ni''+i'$ for $0 \leq i' < n$, $0 \leq i'' < m$, and $\pi_{col}(nj'+j'')=nj''+j'$ for $0 \leq j', j'' < n$. Let $c_{casc}=(c_0, c_1, \ldots, c_{n-1})$ be a codeword in $C_{casc}$. Then, $c_{casc}$ is a vector of length $n^2$ over GF ($q^\tau$). By labeling the coordinates of $c_{casc}$ from 0 to $n^2-1$, and applying the permutation $\pi_{col}$, we obtain a vector $c_{casc}^\pi = (0_0^\pi, c_1^\pi, \ldots, c_{n-1}^\pi)$, where $c_t^\pi$, $0 \leq t < n$, is a vector of length n in which its j-th component, $0 \leq j < n$, is the t-th component in $c_j$. Note that the vector $c_{casc}^\pi$ is obtained by interleaving the n codewords $c_0, c_1, \ldots, c_{n-1}$ from $C_\tau^{(0)}, C_\tau^{(1)}, \ldots, C_\tau^{(n-1)}$, respectively. In one embodiment, the interleaving can be performed by arranging the n codewords $c_0, c_1, \ldots, c_{n-1}$ as rows of an n×n array κ. Then, the n columns of this array κ are $c_0^\pi, c_1^\pi, \ldots, c_{n-1}^\pi$. Let $C_{casc}^\pi$ be the collection of all vectors, $c_{casc}^\pi$, corresponding to all codewords, $c_{casc}$, in $C_{casc}$. Then, $C_{casc}^\pi$ is a linear code over GF ($q^\tau$) of length $n^2$ and dimension (n−m+1)(n−1) which are equal to those of $C_{casc}$.

In one embodiment, a parity-check matrix for $C_{casc}^\pi$ can be obtained by applying the permutations $\pi_{col}$ and $\pi_{row}$ to the columns and rows of the parity-check matrix $H_{casc}$ of $C_{casc}$, respectively. First, the rows of $H_{casc}$ are labeled from 0 to $mn-1$ and the columns from 0 to $n^2-1$. If the rows of $H_{casc}$ are first permuted based on $\pi_{row}$ and then the columns of $H_{casc}$ are permuted based on $\pi_{col}$, an $mn \times n^2$ matrix, $H_{casc}^\pi$, is obtained over GF $(q^\tau)$, where $\pi$ denotes $\pi_{row}$ and $\pi_{col}$ collectively, i.e., $\pi=(\pi_{row}, \pi_{col})$. The matrix $H_{casc}^\pi$ is a parity-check matrix for the code $C_{casc}^\pi$. The (mi'+i", nj'+j")-entry in $H_{casc}^\pi$ is the (ni"+i', nj"+j')-entry in $H_{casc}^\pi$, where $0 \le i" < m$, $0 \le i', j', j" < n$. Based on the matrix $H_{casc}$ given in (2), it can be seen that the (mi'+i", nj'+j")-entry in $H_{casc}$, which is the (ni"+i', nj"+j')-entry in $H_{casc}^\pi$, is 0 unless i'=j' in which case it equals $\beta^{i"j"t}$, where t=i'=j'. Hence, $H_{casc}^\pi$ is an $m \times n$ array of $n \times n$ diagonal matrices as follows:

$$H_{casc}^\pi = [D_{e,f}]_{0 \le e < m, 0 \le f < n}, \quad (7)$$

where, for $0 \le e < m$ and $0 \le f < n$, $D_{e,f}$ is an $n \times n$ diagonal matrix over GF $(q^\tau)$ of the following form:

$$D_{e,f} = \text{diag}(1, \beta^{fe}, \beta^{2fe}, \ldots, \beta^{(n-1)fe}). \quad (8)$$

The Code $C_{casc}^{\pi,F}$ and its Parity-Check Matrix $H_{casc}^{\pi,F^{-1}}$

Let $a=(a_0, a_1, \ldots, a_{n-1})$ be a vector over GF $(q_\tau)$ and $\beta$, as before, be an element of order n in GF $(q^\tau)$. According to one embodiment, the Galois Fourier transform (GFT), denoted by $\mathcal{F}$ (a), of a is a vector $b=(b_0, b_1, \ldots, b_{n-1})$ whose t-th component, for $0 \le t < n$, is given by $$b_t = \Sigma_{k=0}^{l-1} a_k \beta^{kt} = a_0 + a_1 \beta^t a_2 \beta^{2t} + \ldots + a_{l-1} \beta^{(n-1)t}, \quad (9)$$

which is simply the inner product of $(a_0, a_1, \ldots, a_{n-1})$ and $(1, \beta^t, \beta^{2t}, \ldots, \beta^{(n-1)t})$. The vector a is called the inverse GFT of the vector b, denoted by $\mathcal{F}^{-1}(b)$, and can be retrieved using the relation:

$$a_t = \Sigma_{k=0}^{n-1} b_k \beta^{-kt} = b_0 + b_1 \beta^{-t} + b_2 \beta^{-2t} + \ldots + b_{n-1} \beta^{-(n-1)t}, \quad (10)$$

for $0 \le t < n$. Let $V = [\beta^{ij}]_{0 \le i, j < n}$. Then, V is an $n \times n$ Vandermonde matrix which is nonsingular with inverse $V^{-1} = [\beta^{-ij}]_{0 \le i,j < n}$. It is easy to check that F (a)=aV and $F^{-1}(b) = bV^{-1}$.

Let $c_{casc}^\pi = (c_0^\pi, c_1^\pi, \ldots, c_{n-1}^\pi)$ be a codeword in $C_{casc}^\pi$, where each of $c_0^\pi, c_1^\pi, \ldots, c_{n-1}^\pi$ is a sequence over GF $(q^\tau)$ of length n. For $0 \le i < n$, let $c_i^{\pi, F} = F(c_i^\pi) = c_i^\pi V$ and $$c_{casc}^{\pi,\mathcal{F}} = \left(c_0^{\pi,F}, c_1^{\pi,F}, \ldots, c_{n-1}^{\pi,F}\right) = c_{casc}^\pi \text{diag}(\underbrace{V, V, \ldots, V}_{n}). \quad (11)$$

The vector $c_{casc}^{\pi,\mathcal{J}}$ is referred to as the GFT of $c_{casc}^\pi$. The inverse GFT of $c_{casc}^{\pi,\mathcal{J}}$ gives back the vector $c_{casc}^\pi$, i.e., $$c_{casc}^\pi = c_{casc}^{\pi,\mathcal{F}} \text{diag}(\underbrace{V^{-1}, V^{-1}, \ldots, V^{-1}}_{n}). \quad (12)$$

Let $C_{casc}^{\pi,F}$ be the collection of all vectors, $c_{casc}^{\pi,F}$, corresponding to all codewords, $c_{casc}^\pi$, in $C_{casc}^\pi$. Then, $c_{casc}^{\pi,\mathcal{F}}$ is a linear code over GF $(q^\tau)$ of length $n^2$ and dimension $(n-m+1)(n-1)$, which are equal to those of $C_{casc}^\pi$. In one embodiment, from (11) and the fact that $H_{casc}^\pi$ is a parity-check matrix for $C_{casc}^\pi$, it follows that the matrix $H_{casc}^{\pi,F^{-1}}$, defined by $$H_{casc}^{\pi,\mathcal{F}^{-1}} = \text{diag}(\underbrace{V, V, \ldots, V}_{m}) H_{casc}^\pi \text{diag}(\underbrace{V^{-1}, V^{-1}, \ldots, V^{-1}}_{n}), \quad (13)$$

is a parity-check matrix of $C_{casc}^{\pi,F}$. It is an $mn \times n^2$ matrix over GF $(q^\tau)$ of rank $1+(n-1)m$.

The Code $C_{LDPC}$ and its Parity-Check Matrix $H_{LDPC}$

In this subsection, structure of the parity-check matrix $H_{casc}^{\pi,\mathcal{J}^{-1}}$ of the code $C_{casc}^{\pi,F}$ is studied. From (7) and (13), it follows that $$H_{casc}^{\pi,\mathcal{F}^{-1}} = [V D_{e,f} V^{-1}]_{0 \le e < m, 0 \le f < n}. \quad (14)$$

It is straightforward to check from (8) that for $0 \le e < m$ and $0 \le f < n$, $V D_{e,f} V^{-1}$ gives an $n \times n$ matrix whose (i, j)-entry, $0 \le i, j < n$, equals $$\Sigma_{k=0}^{n-1} \beta^{(i-j+fe)k}, \quad (15)$$

The sum given by (15) equals to zero unless i–j assumes the unique value modulo n satisfying $\beta^{i-j+fe}=1$, i.e., $i-j \equiv -f l_e$ (mod n), and $0 \le i, j < n$, in which case the sum equals to one. Thus, $V D_{e,f} V^{-1}$ is a circulant over GF(2) in which each row contains a single nonzero entry which equals to one. Such a circulant is called a circulant permutation matrix (CPM). It should be noted that the entries of the top row of $V D_{e,f} V^{-1}$, given by the sums $\Sigma_{k=0}^{n-1} \beta^{(i-j+fe)k}$, for i=0 and j=0,1, ..., n–1, are the inverse GFT values of the vector $(1, \beta^{fe}, \beta^{2fe)k}, \ldots, \beta^{(n-1)f l_e})$ over GF $(q^\tau)$ comprising the diagonal of $D_{e,f}$. The top row of a circulant is called the generator of the circulant. Let $\mathcal{D}_{e,f}^{\mathcal{J}^{-1}}$ denote $V D_{e,f} V^{-1}$. Then, from (14), $$H_{casc}^{\pi,\mathcal{J}^{-1}} = [D_{e,f}^{F-1}]_{0 \le e < m, 0 \le f < n} \quad (16)$$

is an $m \times n$ array of binary CPMs of size $n \times n$. Each row in $H_{casc}^{\pi,\mathcal{J}^{-1}}$ has weight n and each column has weight m.

According to one embodiment, it follows from the above developments that $H_{casc}^{\pi,\mathcal{J}^{-1}}$ given by (14) can be constructed directly from its $m \times n$ matrix $B = [\beta^{jl_i}]_{0 \le i < m, 0 \le j < n}$ by a replacement process. Recall that the entries of B are elements from the cyclic subgroup $\{1, \beta, \beta^2, \ldots, \beta^{n-1}\}$ of the extension field GF $(q^\tau)$ of GF (q), where $\beta$ is an element in GF $(q^\tau)$ of order n and n is a prime factor of $2^{\kappa\tau}-1$. In one embodiment, construction of $H_{casc}^{\pi,\mathcal{J}^{-1}}$ is carried out as follows. For $0 \le i < m$ and $0 \le j < n$, the (i, j)-entry $\beta^{j,l_i}$ of B may be replaced by an $n \times n$ binary CPM, with rows and columns labeled from 0 to n–1, whose generator has its single nonzero component "1" at location $(jl_i)_n$, the least nonnegative integer congruent to $jl_i$ modulo n. This CPM is denoted by CPM($\beta^{jl_i}$) and is called the CPM-dispersion of $\beta^{jl_i}$. Replacing all the entries of B by their corresponding CPM-dispersions, the matrix $H_{casc}^{\pi,\mathcal{F}^{-1}}$ is obtained, which is called the CPM-dispersion of B.

According to one embodiment, for large n, $H_{casc}^{\pi,\mathcal{J}^{-1}}$ is a low-density matrix, the null space over GF($q^\tau$) of which can be considered as an LDPC code over GF $(q^\tau)$. Hence, $H_{casc}^{\pi,\mathcal{J}^{-1}}$ is simply denoted by $H_{LDPC}$ and its null space over GF $(q^\tau)$, $C_{casc}^{\pi,F}$, by $C_{LDPC}$. Since $H_{LDPC}$ is an array of binary CPMs, $C_{LDPC}$ is a QC-LDPC code. Since the $mn \times n^2$ LDPC matrix $H_{LDPC} = H_{casc}^{\pi,\mathcal{J}^{-1}}$ is constructed based on the $m \times n$ parity-check matrix B of the code C given by (1) and its Hadamard-powers, B is referred to as the base matrix and C is referred to as the base code for constructing $H_{LDPC}$ and $C_{LDPC}$, respectively.

Structural Properties of $H_{LDPC}$

The parity-check matrix $H_{LDPC}$ of the $q^\tau$-ary QC-LDPC code $C_{LDPC}$ has several properties which are relevant to its use in iterative decoding based on BP. First, since, from Lemma 1, the base matrix B satisfies the 2×2 SNS-constraint, $H_{LDPC}$ satisfies the RC-constraint, i.e., no two rows (or two columns) in $H_{LDPC}$ have more than one place where they both have 1-components. This RC-constraint ensures that the Tanner graph associated with $H_{LDPC}$ has girth at least six, which is typically required for iterative decoding algorithms, such as the SPA or the MSA, to achieve good performance.

It follows from the RC-constrained structure of $H_{LDPC}$ and the orthogonal principle of one-step majority-logic decoding that the QC-LDPC code $C_{LDPC}$ has minimum distance at least m+1. Note that, while the cascaded code $C_{casc}$ of $C^{(0)}, C^{(1)}, \ldots, C^{(n-1)}$ with parity-check matrix $H_{casc}$ has minimum distance 2, as $C^{(0)}$ has minimum distance equal to two, the LDPC code $C_{LDPC}$ which is the null space of $H_{LDPC}$, in one embodiment, has minimum distance at least m+1, which is the Singleton upper bound on the minimum distance of the codes $C=C^{(1)}, C^{(2)}, C^{(n-1)}$.

It should be noted that since the LDPC matrix $H_{LDPC}$ is RC-constrained with constant column weight m, it has no absorbing set of size less than [m/2]+1 or a small trapping set of size less than m−3. This implies that the $q^\tau$-ary QC-LDPC code $C_{LDPC}$ given by the null space of $H_{LDPC}$ decoded with SPA or the MSA does not suffer from high error-floors if m is reasonably large. Furthermore, note that $H_{LDPC}$ is an array of CPMs which simplifies wire routing in the decoder and allows for using the reduced-complexity decoding schemes to reduce the hardware implementation complexity of an iterative decoder.

According to one embodiment, $H_{LDPC}$ is a binary matrix. This binary property considerably simplifies the decoding of $C_{LDPC}$, a code over GF $(q^\tau)$, where $q=2^\kappa$. A vector $r=(r_0, r_1, \ldots, r_{n^2-1})$ over GF $(q^\tau)$ is in the null space of the binary matrix $H_{LDPC}$ if and only if each of the $\kappa\tau$ binary constituent vectors $r_{b,i}=(r_{0,i}, r_{1,i}, \ldots, r_{n^2-1,i})$ for $0 \leq i < \kappa\tau$, is in the null space over GF(2) of $H_{LDPC}$, where $(r_{j,0}, r_{j,1}, \ldots, r_{j,\kappa\tau-1})$ is the binary vector representation of the symbol $r_j$ which is an element in GF $(q^\tau)$ for $0 \leq j < n^2$. The subscript "b" in $r_{b,i}$ stands for "binary". Thus, in one embodiment, decoding a received vector r over GF $(q^\tau)$ (GF $(2^{\kappa\tau})$) can be implemented by performing $\kappa\tau$ decodings of its $\kappa\tau$ binary constituent vectors using a binary iterative soft-decision BP-algorithm. This reduces the decoding complexity from a function of $(q^\tau)^2=2^{2\kappa\tau}$ for direct implementation of BP, or $\kappa\tau 2^{\kappa\tau}$ for fast Fourier transform implementation of BP, to a function of $\kappa\tau$, i.e., $\kappa\tau$ times the complexity of a binary iterative soft-decision BP-decoding algorithm.

To summarize the disclosure so far, one embodiment starts with the $mn \times n^2$ matrix $H_{casc}$ given by (2) over GF $(q^\tau)$ of rank 1+m(n−1), which is an n×n diagonal array of m×n submatrices. Row and column permutations denoted by 71" are performed to obtain an $mn \times n^2$ matrix $H_{casc}^\pi$, which is an m×n array of n×n diagonal submatrices. This is followed by applying the GFT as implemented using (13) to obtain an RC-constrained $mn \times n^2$ matrix over GF(2), $H_{casc}^{\pi,\mathcal{F}^{-1}} = H_{LDPC}$, which is an m×n array of n×n binary CPMs. The row and column permutations followed by the GFT maintain the rank, i.e., $H_{LDPC}$ has rank 1+m(n−1).

What is gained the most in terms of decoding complexity is an LDPC matrix which is binary. In one embodiment, this binary structure can be used effectively for decoding a cascaded cyclic code $C_{casc}$ over GF$(q^\tau)$ in the GFT domain as a powerful nonbinary QC-LDPC code. The decoding of the nonbinary QC-LDPC code can be carried out in binary. This is the most important advantage in decoding a cascaded code as an LDPC code in the GFT domain, in terms of decoding complexity.

The code $C_{LDPC}$ is referred to herein as the LDPC code associated with the cyclic code C. The following theorem summarizes this section.

Theorem 2 Let C be an (n, n−m) cyclic code over GF(q) of prime length n with generator polynomial $g(X)=\prod_{i=0}^{m-1}(X-\beta^{l_i})$, where $\beta$ is an element of order n in an extension field GF $(q^\tau)$ and $0 \leq l_0 < l_1 < \ldots < l_{m-1} < n$. Then, $B=[\beta^{jl_i}]_{0 \leq i < m, 0 \leq j < n}$ is a parity-check matrix for C, which satisfies the 2×2 SNS-constraint. The LDPC code $C_{LDPC}$ associated with C is an $(n^2, (n-m+1)(n-1))$ code over GF $(q^\tau)$ with parity-check matrix $H_{LDP}=[CPM(\beta^{jl_i})]_{0 \leq i < m, 0 \leq j < n}$ obtained by replacing the element $\beta^{jl_i}$ in B by a binary n×n CPM whose top row has its single nonzero element "1" at position $(jl_i)_n$ and 0's everywhere else. $H_{LDPC}$ satisfies the RC-constraint and its associated Tanner graph has girth at least six.

The developments given in this section show that for every cyclic code C of prime length n over a field GF(q) of characteristic two, there is a QC-LDPC code $C_{LDPC}$ over GF $(q^\tau)$, an extension field of GF(q), associated with it.

EXAMPLE 1

In one embodiment, consider the (5,3) cyclic code C over GF$(2^4)$ generated by the polynomial $g(X)=(X-\beta)(X-\beta^2)$, where $\beta$ is an element of order 5 in GF$(2^4)$. Then, $q=2^4$, $\kappa=4$, and $\tau=1$. The code C is a 16-ary nonprimitive RS code with a parity-check matrix of the form (1) shown as below:

$$B = \begin{bmatrix} 1 & \beta & \beta^2 & \beta^3 & \beta^4 \\ 1 & \beta^2 & \beta^4 & \beta & \beta^3 \end{bmatrix}, \quad (17)$$

which satisfies the 2×2 SNS-constraint. The Hadamard-powers of B are $$B^{\circ 0} = \begin{bmatrix} 1 & 1 & 1 & 1 & 1 \\ 1 & 1 & 1 & 1 & 1 \end{bmatrix}, B^{\circ 2} = \begin{bmatrix} 1 & \beta^2 & \beta^4 & \beta & \beta^3 \\ 1 & \beta^4 & \beta^3 & \beta^2 & \beta \end{bmatrix}, \quad (18)$$

$$B^{\circ 3} = \begin{bmatrix} 1 & \beta^3 & \beta & \beta^4 & \beta^2 \\ 1 & \beta & \beta^2 & \beta^3 & \beta^4 \end{bmatrix}, B^{\circ 4} = \begin{bmatrix} 1 & \beta^4 & \beta^3 & \beta^2 & \beta \\ 1 & \beta^3 & \beta & \beta^4 & \beta^2 \end{bmatrix}, \quad (19)$$

and $B^{\circ 1}=B$. The matrix $H_{casc}$ in (2) is then $$H_{casc} = \quad (20)$$

$$\begin{bmatrix}
1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & \beta & \beta^2 & \beta^3 & \beta^4 & 0 & 0 & 0 & 0 & 0 & 0 & 0 & 0 & 0 & 0 & 0 & 0 & 0 & 0 & 0 \\
0 & 0 & 0 & 0 & 0 & 1 & \beta^2 & \beta^4 & \beta & \beta^3 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 1 & \beta^2 & \beta^4 & \beta & \beta^3 & 0 & 0 & 0 & 0 & 0 & 0 & 0 & 0 & 0 & 0 \\
0 & 0 & 0 & 0 & 0 & 0 & 0 & 0 & 0 & 0 & 1 & \beta^4 & \beta^3 & \beta^2 & \beta & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 1 & \beta^3 & \beta & \beta^4 & \beta^2 & 0 & 0 & 0 & 0 & 0 \\
0 & 0 & 0 & 0 & 0 & 0 & 0 & 0 & 0 & 0 & 0 & 0 & 0 & 0 & 0 & 1 & \beta & \beta^2 & \beta^3 & \beta^4 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & \beta^4 & \beta^3 & \beta^2 & \beta \\
0 & 0 & 0 & 0 & 0 & 0 & 0 & 0 & 0 & 0 & 0 & 0 & 0 & 0 & 0 & 0 & 0 & 0 & 0 & 0 & 1 & \beta^3 & \beta & \beta^4 & \beta^2
\end{bmatrix}$$

Applying the permutations $\pi_{row}$ and $\pi_{col}$ to the rows and columns of $H_{casc}$, respectively, the following 2×5 array of 5×5 diagonal matrices over GF ($2^4$) is obtained:

$$H_{casc}^{\pi} = \begin{bmatrix} 1 & 0 & 0 & 0 & 0 & | & 1 & 0 & 0 & 0 & 0 & | & 1 & 0 & 0 & 0 & 0 & | & 1 & 0 & 0 & 0 & 0 & | & 1 & 0 & 0 & 0 & 0 \\ 0 & 1 & 0 & 0 & 0 & | & 0 & \beta & 0 & 0 & 0 & | & 0 & \beta^2 & 0 & 0 & 0 & | & 0 & \beta^3 & 0 & 0 & 0 & | & 0 & \beta^4 & 0 & 0 & 0 \\ 0 & 0 & 1 & 0 & 0 & | & 0 & 0 & \beta^2 & 0 & 0 & | & 0 & 0 & \beta^4 & 0 & 0 & | & 0 & 0 & \beta & 0 & 0 & | & 0 & 0 & \beta^3 & 0 & 0 \\ 0 & 0 & 0 & 1 & 0 & | & 0 & 0 & 0 & \beta^3 & 0 & | & 0 & 0 & 0 & \beta & 0 & | & 0 & 0 & 0 & \beta^4 & 0 & | & 0 & 0 & 0 & \beta^2 & 0 \\ 0 & 0 & 0 & 0 & 1 & | & 0 & 0 & 0 & 0 & \beta^4 & | & 0 & 0 & 0 & 0 & \beta^3 & | & 0 & 0 & 0 & 0 & \beta^2 & | & 0 & 0 & 0 & 0 & \beta \\ 1 & 0 & 0 & 0 & 0 & | & 1 & 0 & 0 & 0 & 0 & | & 1 & 0 & 0 & 0 & 0 & | & 1 & 0 & 0 & 0 & 0 & | & 1 & 0 & 0 & 0 & 0 \\ 0 & 1 & 0 & 0 & 0 & | & 0 & \beta^2 & 0 & 0 & 0 & | & 0 & \beta^4 & 0 & 0 & 0 & | & 0 & \beta & 0 & 0 & 0 & | & 0 & \beta^3 & 0 & 0 & 0 \\ 0 & 0 & 1 & 0 & 0 & | & 0 & 0 & \beta^4 & 0 & 0 & | & 0 & 0 & \beta^3 & 0 & 0 & | & 0 & 0 & \beta^2 & 0 & 0 & | & 0 & 0 & \beta & 0 & 0 \\ 0 & 0 & 0 & 1 & 0 & | & 0 & 0 & 0 & \beta & 0 & | & 0 & 0 & 0 & \beta^2 & 0 & | & 0 & 0 & 0 & \beta^3 & 0 & | & 0 & 0 & 0 & \beta^4 & 0 \\ 0 & 0 & 0 & 0 & 1 & | & 0 & 0 & 0 & 0 & \beta^3 & | & 0 & 0 & 0 & 0 & \beta & | & 0 & 0 & 0 & 0 & \beta^4 & | & 0 & 0 & 0 & 0 & \beta^2 \end{bmatrix}$$ (21)

The ten 5×5 diagonal submatrices in $H_{casc}^{\pi}$ are $D_{e,f}$, $0 \leq e < 2$, $0 \leq f < 5$ (see (7) and (8)). Let $V = [\beta^{ij}]_{0 \leq i,j < 5}$. For each e and f, $VD_{e,f}V^{-1}$ is a 5×5 binary CPM, denoted by $D_{e,f}^{\mathcal{F}^{-1}}$, the top row of which is the inverse GFT of the diagonal vector of $D_{e,f}$. Then, $H_{casc}^{\pi,\mathcal{F}^{-1}} = H_{LDPC}$ given in (14) is $$H_{casc}^{\pi,\mathcal{F}^{-1}} = \begin{bmatrix} 1 & 0 & 0 & 0 & 0 & | & 0 & 1 & 0 & 0 & 0 & | & 0 & 0 & 1 & 0 & 0 & | & 0 & 0 & 0 & 1 & 0 & | & 0 & 0 & 0 & 0 & 1 \\ 0 & 1 & 0 & 0 & 0 & | & 0 & 0 & 1 & 0 & 0 & | & 0 & 0 & 0 & 1 & 0 & | & 0 & 0 & 0 & 0 & 1 & | & 1 & 0 & 0 & 0 & 0 \\ 0 & 0 & 1 & 0 & 0 & | & 0 & 0 & 0 & 1 & 0 & | & 0 & 0 & 0 & 0 & 1 & | & 1 & 0 & 0 & 0 & 0 & | & 0 & 1 & 0 & 0 & 0 \\ 0 & 0 & 0 & 1 & 0 & | & 0 & 0 & 0 & 0 & 1 & | & 1 & 0 & 0 & 0 & 0 & | & 0 & 1 & 0 & 0 & 0 & | & 0 & 0 & 1 & 0 & 0 \\ 0 & 0 & 0 & 0 & 1 & | & 1 & 0 & 0 & 0 & 0 & | & 0 & 1 & 0 & 0 & 0 & | & 0 & 0 & 1 & 0 & 0 & | & 0 & 0 & 0 & 1 & 0 \\ 1 & 0 & 0 & 0 & 0 & | & 0 & 0 & 1 & 0 & 0 & | & 0 & 0 & 0 & 0 & 1 & | & 0 & 1 & 0 & 0 & 0 & | & 0 & 0 & 0 & 1 & 0 \\ 0 & 1 & 0 & 0 & 0 & | & 0 & 0 & 0 & 1 & 0 & | & 1 & 0 & 0 & 0 & 0 & | & 0 & 0 & 1 & 0 & 0 & | & 0 & 0 & 0 & 0 & 1 \\ 0 & 0 & 1 & 0 & 0 & | & 0 & 0 & 0 & 0 & 1 & | & 0 & 1 & 0 & 0 & 0 & | & 0 & 0 & 0 & 1 & 0 & | & 1 & 0 & 0 & 0 & 0 \\ 0 & 0 & 0 & 1 & 0 & | & 1 & 0 & 0 & 0 & 0 & | & 0 & 0 & 1 & 0 & 0 & | & 0 & 0 & 0 & 0 & 1 & | & 0 & 1 & 0 & 0 & 0 \\ 0 & 0 & 0 & 0 & 1 & | & 0 & 1 & 0 & 0 & 0 & | & 0 & 0 & 0 & 1 & 0 & | & 1 & 0 & 0 & 0 & 0 & | & 0 & 0 & 1 & 0 & 0 \end{bmatrix}$$ (22)

which satisfies the RC-constraint. Note that the matrix $H_{casc}^{\pi,\mathcal{F}^{-1}} = H_{LDPC}$ is obtained from (17) by replacing each element in B by a binary CPM of size 5×5, in which the location of the 1-component in the top row is the power of the corresponding element in (17). The null space over GF($2^4$) of $H_{LDPC}$ gives a 16-ary (25,16) QC-LDPC code, whose Tanner graph has girth eight and contains 100 cycles of length eight.

A Coding Scheme for Encoding and Iterative Decoding of Cyclic Codes of Prime Lengths in the GFT Domain Given a cyclic code C of prime length n over GF (q), where $q = 2^\kappa$, with parity-check matrix B as in (1), in one embodiment, a coding scheme is disclosed for encoding and decoding the cascaded code $C_{casc}$ of length $n^2$ over GF ($q^\tau$). A codeword in $C_{casc}$ is composed of n component words, $c_0, c_1, \ldots, c_{n-1}$, each of length n, where $c_t$, $0 \leq t < n$, is a codeword in the code $C_\tau^t$ over GF($q^\tau$) with parity-check matrix $B^{\circ t}$. The proposed coding scheme encodes a codeword in $C_{casc}$ into a codeword in the LDPC code $C_{LDPC}$ of length $n^2$ over GF ($q^\tau$) using the GFT. The codeword is transmitted over the channel (or stored in a storage system). The received vector is decoded using iterative SDD, and converted back, using the inverse GFT, to a sequence of estimates of the component words of the codeword in $C_{casc}$. Since $C_\tau^{(0)}$ is an (n, n−1) code over GF($q^\tau$), it encodes a message composed of n−1 symbols in GF($q^\tau$). For $1 \leq t < n$, $C_\tau^{(t)}$ is an (n, n−m) code over GF ($q^\tau$), and hence encodes a message of length n−m over GF ($q^\tau$). Thus, in one embodiment, the proposed coding scheme encodes in total (n−1)+(n−1)(n−m)=(n−m+1)(n−1) symbols in GF ($q^\tau$) into a codeword in $C_{LDPC}$ composed of $n^2$ symbols in GF ($q^\tau$), resulting in a code rate of (n−1)(n−m+1)/$n^2$.

Note that, in one embodiment, both the encoding and decoding are performed collectively on nτ codewords over GF(q). This scheme should be compared with the classical scheme in which codewords from the (n, n−m) cyclic code C over GF(q) are transmitted over the channel and decoded individually giving a code rate of (n−m)/n. The coding scheme proposed herein has a higher code rate for m>1. The difference, which is in the favor of our scheme, can be used to transmit more information or be sacrificed to enhance the error-correcting capability as shown in the rest of this document.

Encoding of a Cascaded Code in the GFT Domain

Figure 5:
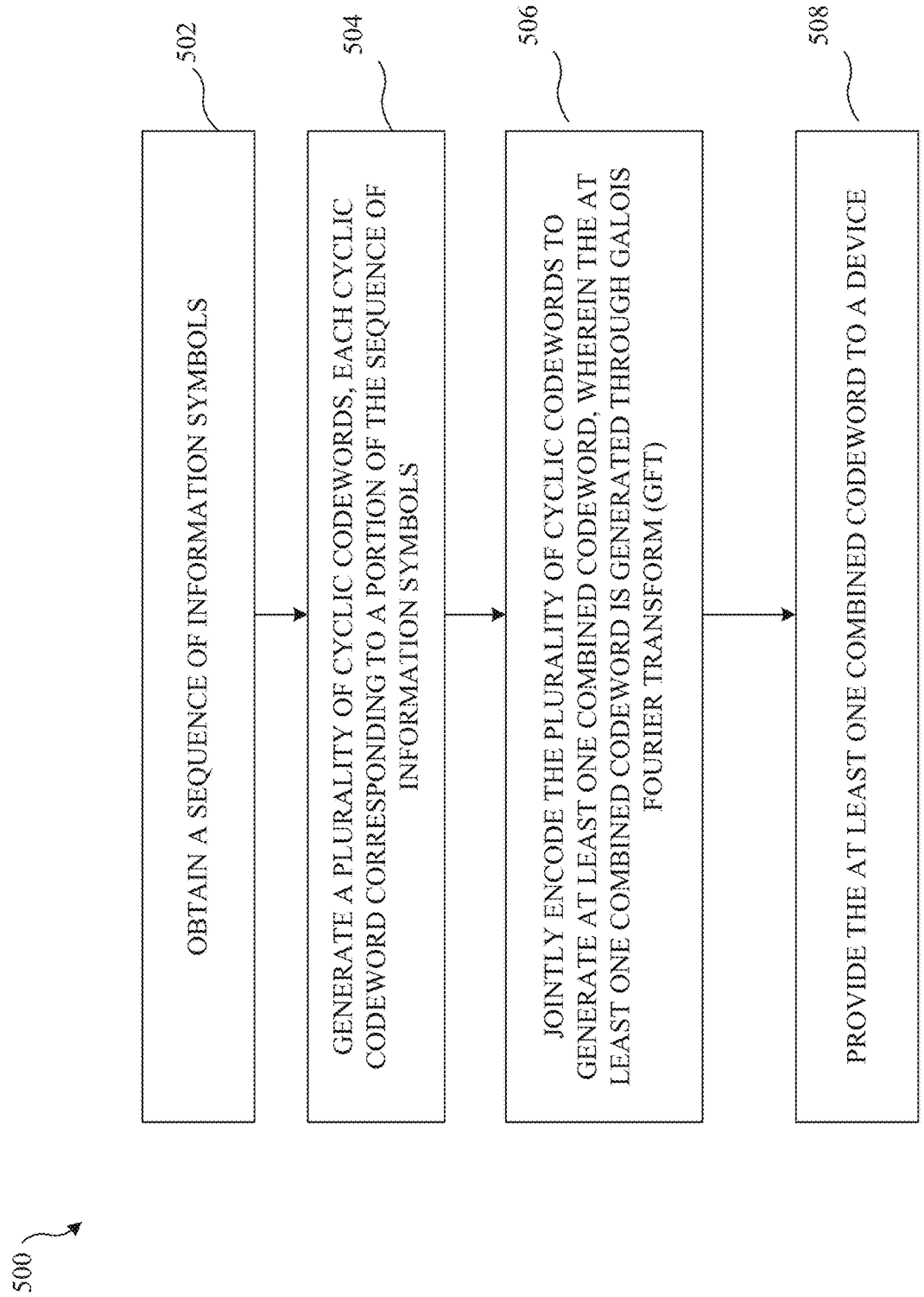
FIG. 5 illustrates example operations that may be performed by a device to encode a sequence of information symbols, in accordance with certain embodiments of the present disclosure.

FIG. 5 illustrates example operations that may be performed by a device to encode a sequence of information symbols, in accordance with certain embodiments of the present disclosure. It should be noted that any of these operations may be modified and/or omitted, or other processing may be added without departing from the teachings of the present disclosure. At 502, the device obtains a sequence of information symbols. At 504, the device generates a plurality of cyclic codewords, each cyclic codeword corresponding to a portion of the sequence of information symbols. In one embodiment, the device encodes τ messages, each composed of n−1 q-ary symbols, into τ codewords, $v_{i,o}$, $0 \leq i < \tau$, in the SPC code $C^{(0)}$, and (n−1)τ messages, each composed of n m q-ary symbols, into (n−1)τ codewords, $v_{i,t}$, $0 \leq i < \tau$, $1 \leq t < n$, in C. It should be noted that the plurality of cyclic codewords can be Reed-Solomon codes, BCH codes, Quadratic Residue codes, Reed-Muller codes, and/or any other cyclic code without departing from the teachings of the present disclosure. At 506, the device jointly encodes the plurality of cyclic codewords to generate at least one combined codeword. In one embodiment, the at least one combined codeword is generated through GFT. At 508, the device provides the at least one combined codeword to another device or application for transmission and/or storage.

Figure 6:
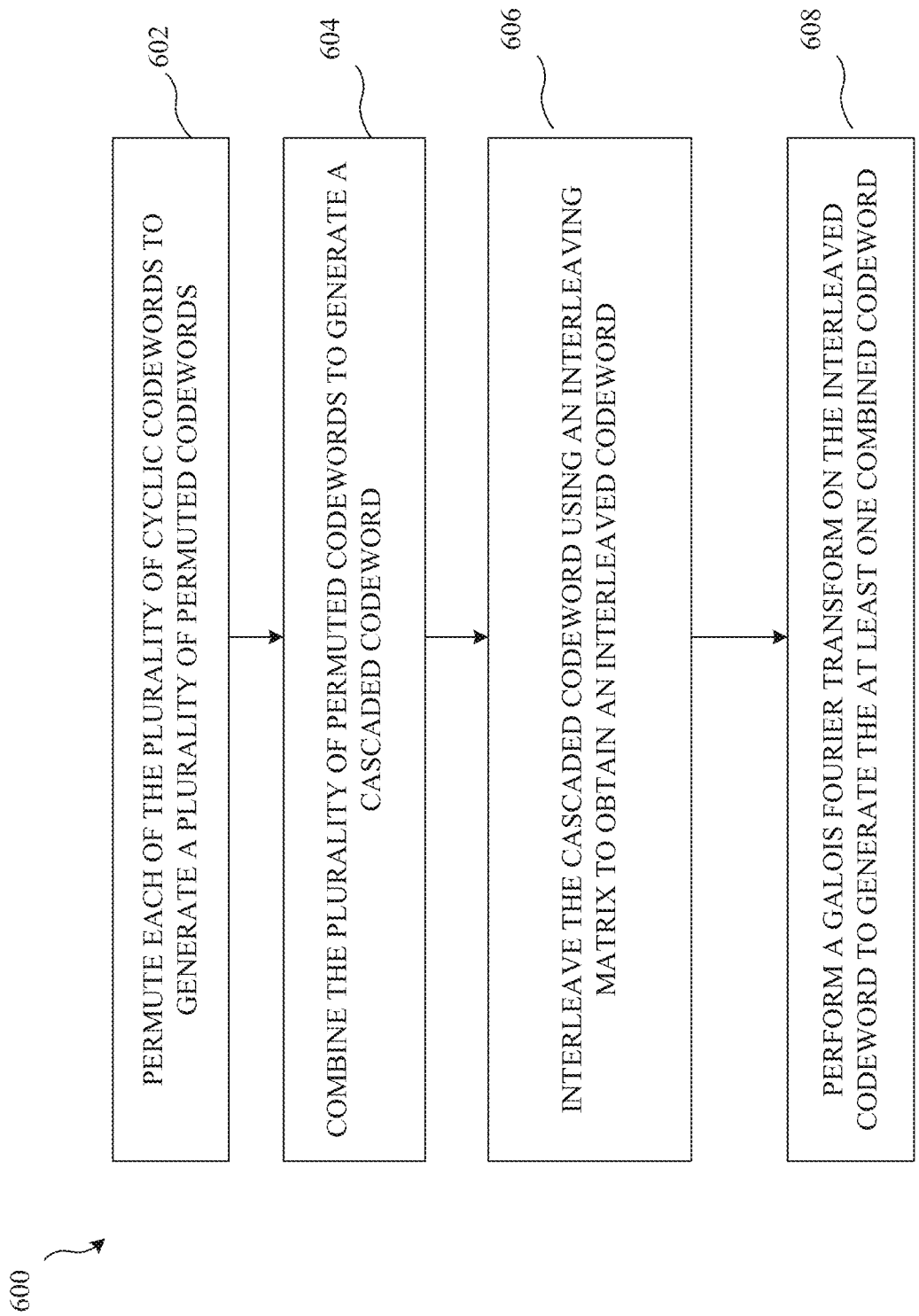
FIG. 6 illustrates example operations for joint encoding that may be performed by a device, in accordance with certain embodiments of the present disclosure.

FIG. 6 illustrates example operations 600 for joint encoding the plurality of cyclic codewords, as illustrated in step 506 of FIG. 5, in accordance with certain embodiments of the present disclosure. At 602, the device permutes each of the plurality of cyclic codewords to generate a plurality of permuted codewords. In one embodiment, the plurality of permuted codewords are generated using Hadamard permutation algorithm. In one embodiment, the device applies the permutation $\pi_t$ on each $v_{i,t}$, for $0 \leq i < \tau$, $1 \leq t < n$, to obtain a codeword $c_{i,t}$ of length n over GF(q) in the code $C^{(t)}$. In one embodiment, no permutation is performed on the code $C^{(0)}$ and we set $c_{i,0} = v_{i,o}$ for $0 \leq i < \tau$.

At 604, the device combines the plurality of permuted codewords to generate a cascaded codeword. As an example, the device combines the $\tau$ codewords in $C^{(t)}$ to form a codeword $c_t$ of length n over GF ($q^\tau$) in the code $C_\tau^{(t)}$ for each t, $0 \leq t < n$, and form the cascaded codeword $c_{casc} = (c_0, c_1, \ldots, c_{n-1})$ in the cascaded code $C_{casc}$.

At 606, the device interleaves the cascaded codeword using an interleaving matrix to obtain an interleaved codeword. As an example, the device apply the permutation $\pi_{col}$, defined by Eqn. (6), to $c_{casc}$, i.e., interleave $c_{casc}$, to obtain the interleaved cascaded codeword $c_{casc}^\pi = (c_0^\pi, c_1^\pi, \ldots, c_{n-1}^\pi)$ in $C_{casc}^\pi$.

At 608, the device performs a Galois Fourier Transform on the interleaved codeword to generate the at least one combined codeword. In one embodiment, the plurality of cyclic codewords correspond to a first finite field and the at least one combined codeword corresponds to a second finite field which is larger than the first finite field. In one embodiment, the combined codeword comprises a quasi-cyclic low density parity check codeword. In one embodiment, the device takes the GFT of each component word $c_t^\pi$, $0 \leq t < n$, in $c_{casc}^\pi$ to obtain $c_t^{\pi,F}$ and form the vector $c_{casc}^{\pi,F} = (c_0^{\pi,F}, c_1^{\pi,F}, \ldots, c_{n-1}^{\pi,F})$ of length $n^2$ over GF ($q^\tau$) for transmission. The vector $c_{casc}^{\pi,F}$ is a codeword in the LDPC code $C_{LDPC}$ which has $H_{LDPC}$ given by (14) as a parity-check matrix.

In the following, we elaborate on each step of the proposed encoding scheme. Let $M_{i,t}$, $0 \leq i < \tau$, $0 \leq t < n$, be $n\tau$ messages with symbols from GF(q). For t=0, each message $M_{i,0}$ is composed of n−1 information symbols. For $1 \leq t < n$, each message $M_{i,t}$ is composed of n−m information symbols. The message $M_{i,0}$, for $0 \leq i < \tau$, is encoded into a codeword $c_{i,0} = v_{i,0}$ in $C^{(0)}$. For $1 \leq t < n$, the message $M_{i,t}$ composed of n−m symbols is encoded into a codeword $v_{i,t}$ in C. (e.g., Step 504). In one embodiment, the Hadamard permutation $\pi_t$ is applied in Step 602 to $v_{i,t}$ resulting in a codeword $c_{i,t}$ in $C^{(t)}$. This generates the $\tau$ codewords $c_{0,t}, c_{1,t}, \ldots, c_{\tau-1,t}$ in $C^{(t)}$ for each t, $1 \leq t < n$. In Step 604, for each t, $0 \leq t < n$, the vector $c_t = \sum_{i=0}^{\tau-1} c_{i,t} a^i$ is formed, where a is a primitive element in GF (e). The resulting vector $c_t$ is a codeword in the code $C_\pi^{(t)}$. Step 606 can be performed by arranging the sequences $c_0, c_1, \ldots, c_{n-1}$ as rows in an n×n array, denoted by κ. Then, the columns of this array are $c_0^\pi, c_1^\pi, \ldots, c_{n-1}^\pi$ from which the interleaved cascaded codeword $c_{casc}^\pi$ in $C_{casc}^\pi$ is formed. Finally, in Step 608, the GFT is applied to each $c_t^\pi$, $0 \leq t < n$, to obtain the vector $c_t^{\pi,F}$ over GF ($q^\tau$). The vector $c_{casc}^{\pi,F} = (c_0^{\pi,F}, c_1^{\pi,F}, \ldots, c_{n-1}^{\pi,F})$ formed, which is a codeword in the LDPC code $C_{LDPC}$ with parity-check matrix $H_{LDPC}$. The vector $c_{casc}^{\pi,F}$ is transmitted over the channel or stored in a memory (e.g., Step 508).

The implementation of above encoding process is relatively simple. In one embodiment, two encoders may be used, one for the SPC code $C^{(0)}$ (also a cyclic code with generator polynomial g(X)=X−1) and one for the base cyclic code C. Since $C^{(0)}$ is an SPC code, its encoder is very simple. Since C is a cyclic code, in one embodiment, its encoder can be implemented with a simple feedback shift-register with feedback connections based on the coefficients of its generator polynomial g(X). Combining the $\tau$ codewords in $C^{(t)}$ to form a codeword $c_t$ in $C_\tau^{(t)}$ is based on representing a sequence of $\tau$ symbols in GF (q) as a symbol in GF ($q^\tau$). In one embodiment, this can be easily implemented by a look-up-table, or any other method. Note that for most practical applications, $\tau$ is small, e.g., equal to 8. This step is only performed when $\tau > 1$ since in case $\tau = 1$, which includes RS codes, $c_t = c_{0,t}$ and $C_\tau^{(t)} = C^{(t)}$. In one embodiment, the Hadamard-permutation and interleaving operations can be performed together using a memory unit to store the code symbols of $c_0, c_1, \ldots, c_{n-1}$ in an n×n array κ. Computing the GFTs of the columns of the array κ can be implemented efficiently with a fast algorithm. The GFT is performed on each column of the array κ as it is read out from the memory unit for transmission.

Decoding of a Cascaded Code in the GFT Domain

Figure 7:
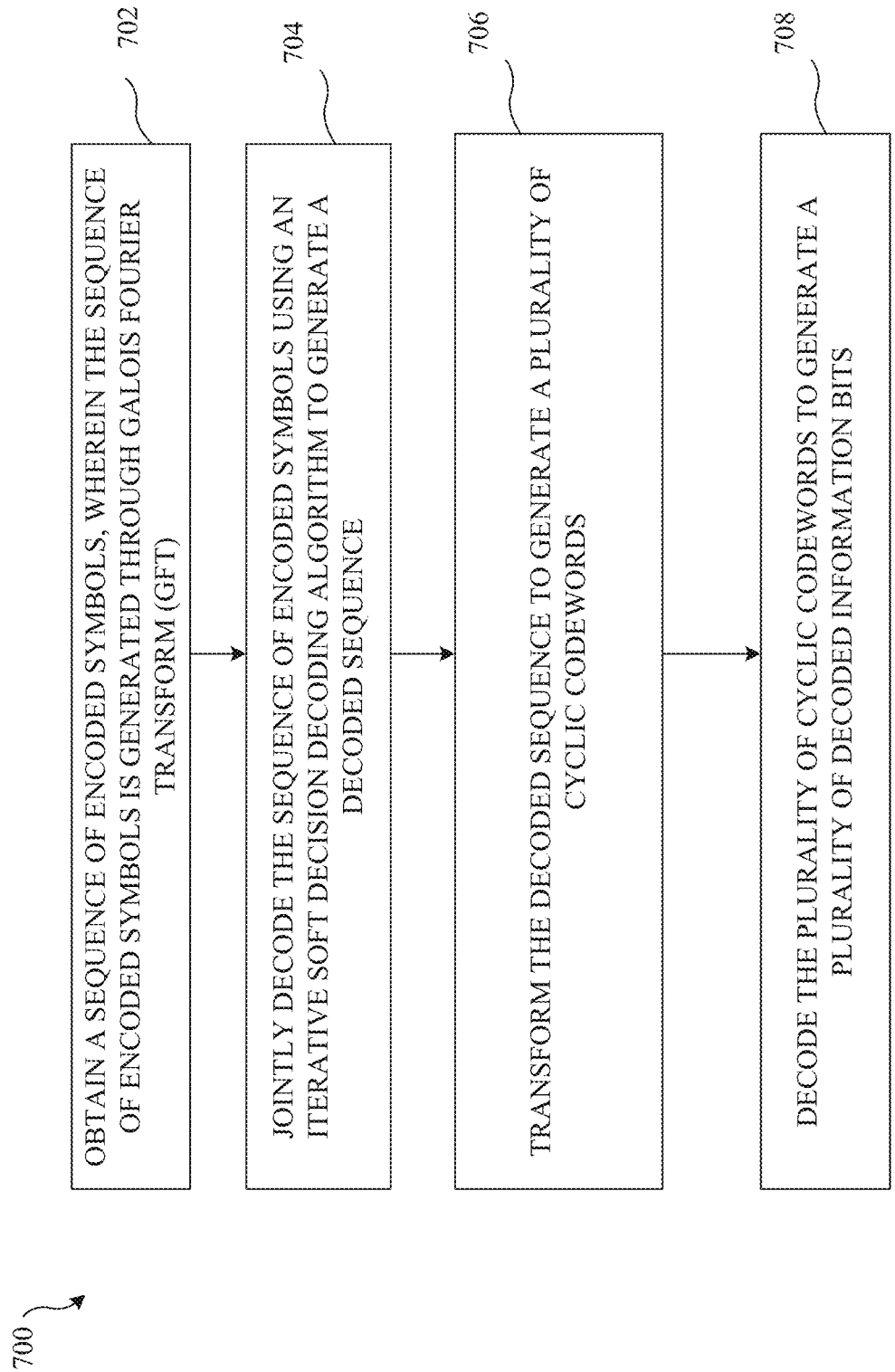
FIG. 7 illustrates example operations that may be performed by a device to decode a sequence of encoded symbols, in accordance with certain embodiments of the present disclosure.

FIG. 7 illustrates example operations that may be performed by a device to decode a sequence of encoded symbols, in accordance with certain embodiments of the present disclosure. At 702, the device obtains a sequence of encoded symbols. In one example, the sequence of encoded symbols is generated through GFT (e.g., as described in FIGS. 5 and 6). As an example, let $r = (r_0, r_1, \ldots, r_{n^2-1})$ be the received vector (the output of the detector) corresponding to the transmitted vector $c_{casc}^{\pi,T}$. At 704, the device jointly decodes the sequence of encoded symbols using an iterative soft decision decoding algorithm to generate a decoded sequence. The iterative soft decision decoding algorithm can, in general, be any belief propagation algorithm, such as Min-Sum algorithm, and the like. In one embodiment, the device decodes the sequence of $n^2$ received symbols over GF ($q^\tau$) based on the LDPC matrix $H_{LDPC}$ given by (14) using an iterative soft-decision BP-algorithm to obtain an estimate $c_{casc}^{\pi,F} = (c_0^{\pi,F}, c_1^{\pi,F}, \ldots, c_{n-1}^{\pi,F})$ of $c_{casc}^{\pi,F}$ formed by the encoder in Step 608.

At 706, the device transforms the decoded sequence to generate a plurality of cyclic codewords. At 708, the device decodes the plurality of cyclic codewords to generate a plurality of decoded information symbols.

Figure 8:
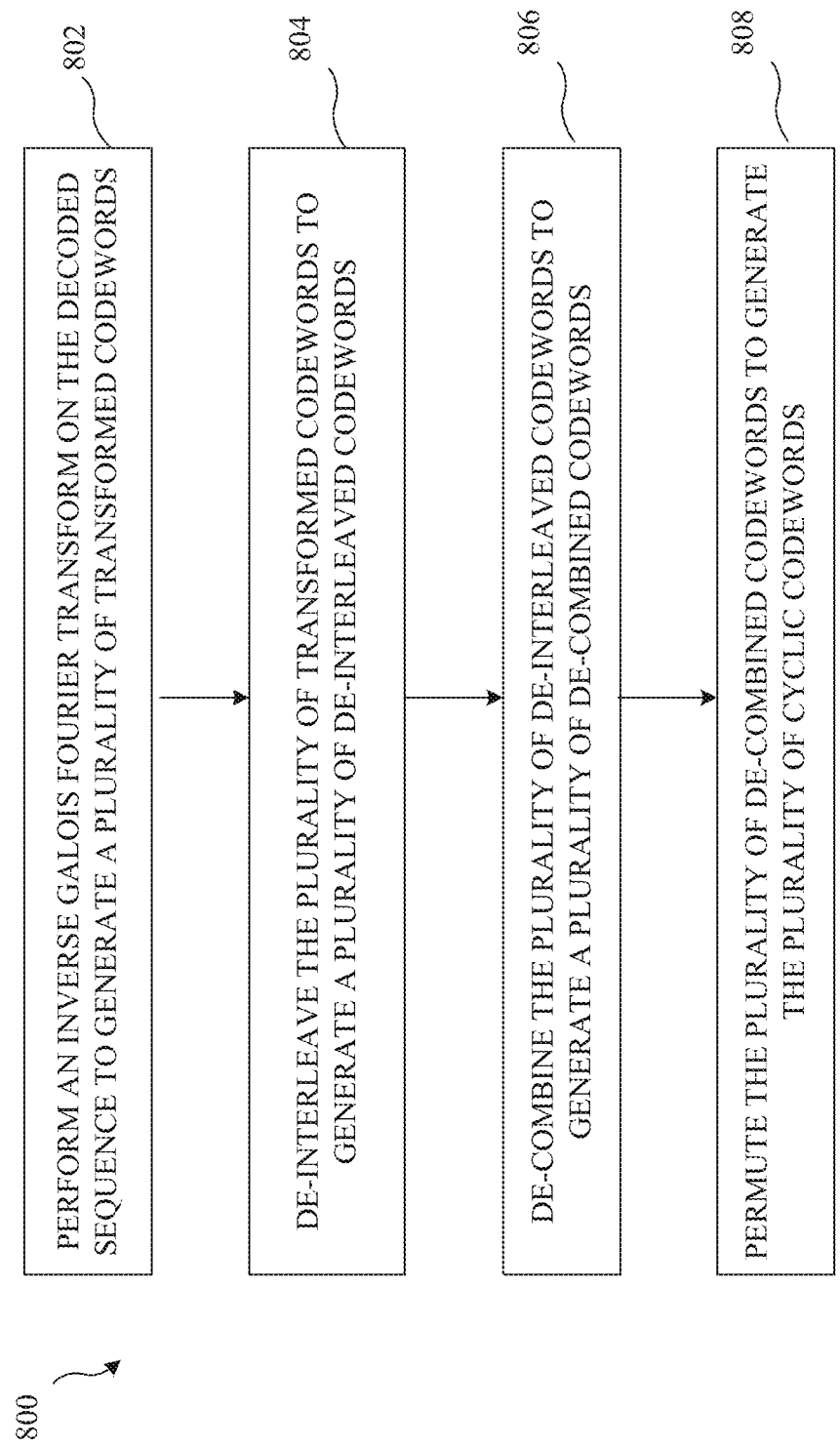
FIG. 8 illustrates example operations for transforming the decoded sequence, in accordance with certain embodiments of the present disclosure.

FIG. 8 illustrates example operations for transforming the decoded sequence as illustrated in step 706, FIG. 7, in accordance with certain embodiments of the present disclosure. As illustrated, at 802, the device performs an inverse Galois Fourier Transform on the decoded sequence to generate a plurality of transformed codewords. In one embodiment, the device takes the inverse GFT of the decoded sequence to obtain an estimate $c_{casc}^\pi$ of the interleaved cascaded codeword $c_{casc}^\pi$ formed by the encoder at Step 606.

At 804, the device de-interleaves the plurality of transformed codewords to generate a plurality of de-interleaved codewords. In one embodiment, the device applies the inverse permutation $n_{col}^{-1}$ to $c_{casc}^\pi$, i.e., de-interleave $c_{casc}^\pi$, to obtain a sequence $c_{casc} = (c_0, c_1, \ldots, c_{n-1})$ of n vectors of length n which is an estimate of $c_{casc}$ formed by the encoder at Step 604.

At 806, the device de-combines the plurality of de-interleaved codewords to generate a plurality of de-combined codewords. In one embodiment, the device de-combines $c_t$, for each t, $0 \leq t < n$, into $\tau$ sequences $c_{0,t}, c_{1,t}, \ldots, c_{\tau-1,t}$, which are the estimates of the codewords $c_{0,t}, c_{1,t}, \ldots, c_{\tau-1,t}$ in $C^{(t)}$ formed by the encoder at Step 602.

At 808, the device permutes the plurality of de-combined codewords to generate the plurality of cyclic codewords. In one embodiment, the device permutes $c_{i,t}$, for $0 \leq i < \tau$ and $1 \leq t < n$, using $\pi_t^{-1}$ to obtain an estimate $v_{i,t}$ for $v_{i,t}$ formed by the encoder at Step 504.

In one embodiment, the decoder may optionally apply HDD to decode $v_{i,t}$ for $0 \leq i < \tau$, $1 \leq t < n$, based on the code $C^{(t)}$ to correct errors if detected. For example, the device decodes the sequence of encoded symbols using HDD to generate a sequence of corrected symbols, and jointly decodes the sequence of corrected symbols using the iterative soft decision decoding algorithm to generate the decoded sequence.

In the following, each decoding step is explained in more detail. In one embodiment, in Step 704, the received vector r is decoded based on the LDPC matrix $H_{LDPC}$ using an iterative soft-decision BP-algorithm. Recall that $H_{LDPC}$ is a binary matrix. Based on the properties described earlier in this disclosure, the received vector $r = (r_0, r_1, \ldots, r_{n^2-1})$ can be decoded in binary using the binary LDPC matrix $H_{LDPC}$ as follows. Note that all the received symbols in r are elements in GF ($q^\tau$), where $q^\tau = 2^{\kappa\tau}$. For $0 \leq j < n^2$, let $(r_{j,0}, r_{j,1}, \ldots, r_{j,\kappa\tau-1})$, a $\kappa\tau$-tuple over GF(2), be the binary vector representation of the received symbol $r_j$. The received vector r is de-combined into $\kappa\tau$ vectors of length $n^2$ over GF(2), $r_{b,i} = (r_{0,i}, r_{1,i}, \ldots, r_{n^2-1,i})$, $0 \leq i < \kappa\tau$. These $\kappa\tau$ binary vectors are referred to as "constituent received vectors" of r. Suppose the received vector r is free of errors. Then, $r = c_{casc}^{\pi,\mathcal{F}}$ and $H_{LDPC} r^T = 0$, and since $H_{LDPC}$ is binary, $H_{LDPC} r_{b,i}^T = 0$ for $0 \leq i < \kappa\tau$. Based on this fact, r can be decoded by decoding its $\kappa\tau$ binary constituent vectors. The decoding of each binary constituent received vector is based on the binary LDPC matrix $H_{LDPC}$ using a binary iterative soft-decision BP-decoding, such as the SPA, the MSA, or any other soft decoding algorithm. Thus, decoding a received vector over GF ($q^\tau$) can be implemented by performing $\kappa\tau$ decodings of $\kappa\tau$ binary vectors. This significantly reduces the decoding complexity.

The $\kappa\tau$ binary decodings result in $\kappa\tau$ decoded binary vectors. We combine these decoded binary vectors into a vector, denoted by $c_{casc}^{\pi,\mathcal{F}}$ of length $n^2$ over GF ($q^\tau$) by grouping each set of $\kappa\tau$ corresponding bits in the $\kappa\tau$ decoded binary vectors into an element in GF ($q^\tau$). Then, $c_{casc}^{\pi,\mathcal{F}}$ is an estimate of the transmitted vector $c_{casc}^{\pi,\mathcal{F}}$.

Let $c_{casc}^{\pi,\mathcal{F}} = (c_0^{\pi,\mathcal{F}}, c_1^{\pi,\mathcal{F}}, \ldots, c_{n-1}^{\pi,\mathcal{F}})$, where each $c_t^{\pi,\mathcal{F}}$ is of length n over GF($q^\tau$). In Step 802, the inverse GFT is applied to each $c_t^{\pi,\mathcal{F}}$, $0 \leq t < n$, to yield $c_t^{\pi}$ and the vector $c_{casc}^{\pi} = (c_0^{\pi}, c_1^{\pi}, \ldots, c_{n-1}^{\pi})$ is formed as an estimate of $c_{casc}^{\pi} = (c_0^{\pi}, c_1^{\pi}, \ldots, c_{n-1}^{\pi})$ in the encoding process.

In one embodiment, Step 804, in which the inverse permutation $\pi_{col}^{-1}$ is applied to $c_{casc}^{\pi}$ can be implemented by storing $c_0^{\pi}, c_1^{\pi}, \ldots, c_{n-1}^{\pi}$ as columns in an n×n array $\kappa$. Then the rows of this array give $c_0, c_1, \ldots, c_{n-1}$, where $c_t$ is an estimate of the codeword $c_t$ in $C_\pi^{(t)}$. In Step 806, each $c_t$, for $0 \leq t < n$, is de-combined into $\pi$ vectors $c_{0,t}, c_{1,t}, \ldots, c_{\pi-1,t}$ which are estimates of the codewords $c_{0,t}, c_{1,t}, \ldots, c_{\pi-1,t}$ in $C^{(t)}$. In Step 808, the inverse permutation $\pi_t^{-1}$ is performed on $c_{i,t}$, for $0 \leq i < \pi$ and $1 \leq t < n$, to obtain an estimate $v_{i,t}$ of the codeword $v_{i,t}$ in C. If $v_{i,t}$ is a codeword in C for $1 \leq t < n$, then a message $M_{i,t}$ can be deduced as an estimate of $M_{i,t}$ and if $v_{i,0} = c_{i,0}$ is a codeword in the SPC code $C^{(0)}$, then a message $M_{i,0}$ can be deduced as an estimate of $M_{i,0}$. Otherwise, we declare a decoding failure. However, in one embodiment, if $v_{i,t}$, for $1 \leq t < n$, is not a codeword in C, then we can apply HDD to correct errors (as explained further corresponding to FIG. 9). This option may not be available for $t=0$ since the code $C^{(0)}$ has minimum distance of 2. Later, we see how to correct errors in $v_{i,0} = c_{i,0}$.

The complexity of decoding the LDPC code $C_{LDPC}$ over GF($q^\tau$) based on the binary parity-check matrix $H_{LDPC}$ is generally in the order of $\kappa\tau$ times that of decoding the LDPC code over GF(2) given by the null space of $H_{LDPC}$. Using the reduced-complexity iterative decoding scheme, the hardware implementation complexity of the decoder based on $H_{LDPC}$ can be reduced by a factor as large as n, the size of the constituent CPMs in $H_{LDPC}$, i.e., the number of codewords in a cascaded codeword in $C_{casc}$.

With the coding scheme proposed herein, a collection of $n\tau$ codewords in a base code C and $C^{(0)}$ is combined into a single coded sequence which is transmitted in the GFT domain over the channel. At the received end, these $n\tau$ codewords are decoded collectively in the GFT domain. This collection of $n\tau$ codewords is referred to herein as a coded frame.

Note that the decoder has the option of performing HDD for $C^{(t)}$, $1 \leq t < n$, as the final decoding step. Since $C^{(0)}$ is an SPC code with minimum distance of 2, it does not have any error-correction capability. In one embodiment, the scheme can be easily modified to allow for error-correction by restricting $M_{i,0}$, for $0 \leq i < \tau$, to be a message composed of n−m q-ary symbols rather than n−1 q-ary symbols as follows. For example, in Step 504, we encode each message $M_{i,0}$ of n−m q-ary symbols into a codeword $v_{i,0}$ in the code C over GF(q) for $0 \leq i < \tau$. Next, we combine the $\tau$ codewords, $v_{0,0}, v_{1,0}, \ldots, v_{\tau-1,0}$ to form a codeword $v_0$ of length n over GF ($q^\tau$) as in Step 604. Let $v_0 = (v_{0,0}, v_{1,0}, v_{2,0}, \ldots, v_{n-1,0})$, where $v_{j,0}$ is an element in GF ($q^\tau$). Next, let $c_0 = (v_{0,0}, \beta^{l_0} v_{1,0}, \beta^{2l_0} v_{2,0}, \ldots, \beta^{(n-1)l_0} v_{n-1,0})$, where $\beta^{l_0}$ is one of the roots of the generator polynomial of the cyclic code C, see (1). Then, $c_0$ is a codeword in $C_\tau^{(0)}$. The cascaded codeword in Step 604 is then $c_{casc} = (c_0, c_1, \ldots, c_{n-1})$ and Steps 606 and 608 follow as above based on this cascaded codeword. With this modification, the coding scheme proposed herein encodes in total $n\tau$ messages, each consisting of n−m q-ary symbols, into a codeword in the LDPC code $C_{LDPC}$ of length $n^2$, where each symbol is in GF ($q^\tau$). The resulting code rate is then (n−m)/n, the same as that of the classical scheme.

In one embodiment, at the receiver, the decoder goes through Steps 704, 802 and 804 as explained in above which results in an estimate $c_0 = (\tilde{c}_{0,0}, \tilde{c}_{1,0}, \tilde{c}_{2,0}, \ldots, \tilde{c}_{n-1,0})$ of $c_0$. However, before implementing Step 806, the decoder forms $v_0 = (\tilde{c}_{0,0}, \beta^{-l_0}\tilde{c}_{1,0}, \beta^{-2l_0}\tilde{c}_{2,0}, \ldots, \beta^{-(n-1)l_0}\tilde{c}_{n-1,0})$ as an estimate of $v_0$. In Step 806, the decoder de-combines $v_0$ over GF ($q^\tau$) into the estimates $v_{0,0}, v_{1,0}, \ldots, v_{\tau-1,0}$ over GF(q). In one embodiment, if the estimate $v_{i,0}$, $0 \leq i < \tau$, is not a codeword in the code C, then it can be decoded using HDD based on the error-correction capability of C to correct errors.

Figure 9:
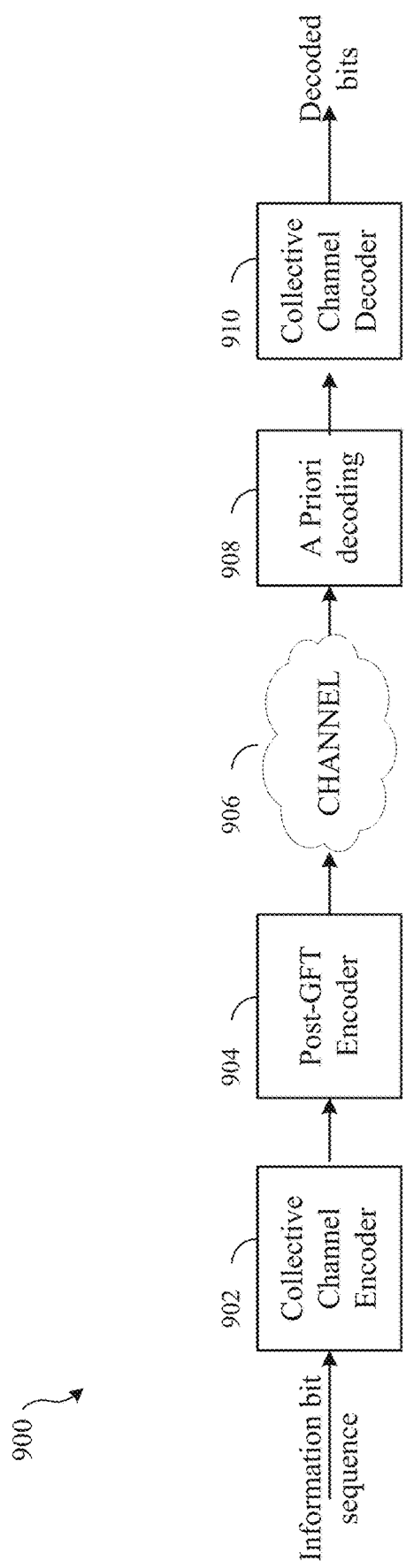
FIG. 9 illustrates an example error control coding system, including inner coding and outer coding, in accordance with certain embodiments of the present disclosure.

FIG. 9 illustrates an example error control coding system 900, including an inner and an outer coding, in accordance with certain embodiments. As illustrated, the error control coding system includes a collective channel encoder 902 and a post-GFT encoder 904 in the transmitter side. At the receiver side, the error control coding system includes a priori decoding 908 and a collective channel decoder 910. As shown in FIG. 9, the collective channel encoder 902 and the collective channel decoder 910 may perform the proposed coding scheme (e.g., GFT-ISDD). In addition, a post GFT encoder 904 may be added to the system that encodes the output of the collective channel encoder 902 based on an error-correcting code to generate an encoded message. The encoded message is then passed through the channel 906. At the receiver side, the a priori decoding 908 may perform an algebraic HDD prior to the GFT-ISDD/MSA decoding. The encoding and decoding are performed on each of the n sections of the GFT of the interleaved cascaded codeword.

The added post encoding 904 and a priori decoding 908 may be regarded as the inner coding for a concatenated coding scheme, with the GFT-ISDD scheme as the outer coding. This concatenated coding scheme allows correcting a small number of scattered random errors in each received section of a transmitted sequence. In one embodiment, The GFT-ISDD/MSA decoding is performed only when the decoding of any of the n received sections fails.

In some scenarios, whether or not HDD is performed on C at the final stage of decoding may have a small effect on performance (e.g., in one embodiment, the effect may not exceed one-tenth of a dB in SNR). This can be attributed to the fact that the iterative decoding based on BP of the LDPC code $C_{LDPC}$ corrects most of the errors, and in case it fails then the residual errors exceed the error correcting capability of the cyclic base code C.

Belief Propagation (BP) Decoding Modes

For certain embodiments, the $\kappa\tau$ binary constituent vectors of a received vector r can be decoded in three simple modes: (1) decode them in parallel by using $\kappa\tau$ identical binary BP-decoders; (2) decode them in serial, one at a time, using a single BP-decoder; and (3) decode them in partial-parallel using $\kappa$ (or $\tau$) BP-decoders. Other partial-parallel decoding modes can also be performed without departing from the teachings of the present disclosure. Different decoding modes provide various trade-offs between decoding speed and implementation complexity. In one embodiment, fully-parallel decoding of all $\kappa\tau$ binary constituent vectors may be performed. Grouping operation is performed when and only when all the binary constituent received vectors are successfully decoded with a chosen BP-decoding algorithm. Before all the binary constituent received vectors are successfully decoded, those that have been successfully decoded are saved in the memory, and the rest are continuously processed until all of them are successfully decoded and stored in the memory as a $\kappa\tau \times n^2$ array. At this point, grouping the $\kappa\tau$ decoded binary vectors is completed. If not all of $\kappa\tau$ binary received constituent vectors are successfully decoded by the time when a preset maximum number of BP-iterations for all the BP-decoders is reached, a decoding failure may be declared.

Let $I_{max}$ denote the preset maximum number of BP-iterations to be performed for decoding each of the $\kappa\tau$ binary received constituent vectors $r_{b,i}$, $0 \leq i < \kappa\tau$. For $0 \leq l \leq l_{max}$ and $0 \leq i < \kappa\tau$, let $r_{b,i}^{(l)}$ denote the updated hard-decision of $r_{b,i}$ at the end of the l-th iteration. For $l=0$, $r_{b,i}^{(0)} = r_{b,i}$, $0 \leq i < \kappa\tau$. In one embodiment, the iterative soft decision decoding (e.g., belief propagation (BP) decoding) of a received vector r is carried out as in the following steps:

BP-1. Initialization: Set $l=0$ and log-likelihood ratios (LLR's) for the received code bits of all the $\kappa\tau$ constituent received vectors based on the channel output detector.

BP-2. Perform the l-th BP-iteration to update the LLR's of the bits of $r_{b,i}$, $0 \leq i < \kappa\tau$ for which $H_{LDPC} (r_{b,i}^{(l-1)})^T \neq 0$. Compute $r_{b,i}^{(l)}$.

BP-3. Check $H_{LDPC}(r_{b,i}^{(l)})^T$, $0 \leq i < \kappa\tau$. If $H_{LDPC}(r_{b,i}^{(l)})^T = 0$ for all $0 \leq i < \kappa\tau$, go to Step BP-4. If not, save $r_{b,i}^{(l)}$'s for which $H_{LDPC} (r_{b,i}^{(l)})^T = 0$. If $l = I_{max}$, declare a decoding failure; otherwise, set $l \leftarrow l+1$ and go to Step BP-2.

BP-4. Stop BP-decoding and group the $\kappa\tau$ decoded binary vectors into an estimate of the transmitted word $c_{casc}^{\pi,T}$.

The decoding part of the proposed coding scheme for cyclic codes of prime lengths is an iterative soft-decision decoding (ISDD) scheme in the GFT domain. For simplicity, we refer to this decoding algorithm as GFT-ISDD scheme in the rest of this disclosure.

One of the most important features of the proposed coding scheme is that the decoding is performed on a collection of received codewords jointly. During the decoding process, the reliability information of each decoded codeword is shared by the others to enhance the overall reliability of all the decoded codewords. This joint-decoding and information sharing may result in an error performance per decoded codeword better than the error performance of a received codeword decoded individually using MLD. This will be demonstrated in several example embodiments described in this document. This gain over MLD is referred to as joint-decoding gain. For a long code, the joint-decoding gain can be large.

However, for a long code, computing its MLD performance is practically impossible. In this case, the union bound (UB) on MLD performance of the large codes, denoted by UB-MLD, are used for comparison. For large SNR, the UB is very tight.

Measures of the Error Performance of the BP-Decoding

For certain embodiments, in measuring the error performance of a cascaded code $C_{casc}$ of a base code C at the output of the LDPC decoder, we use frame error probability (i.e., the probability that a frame of $n\tau$ codewords is decoded incorrectly) in terms of frame error rate (FER), denoted by $P_{FER}$. After de-interleaving of the decoded frame and performing the inverse of the Hadamard-permutation on the n symbols of each decoded codeword, the block error probability (i.e., the probability that a codeword in a frame is decoded incorrectly) in terms of block error rate (BLER), denoted by $P_{BLER}$, is computed. The block error probability $P_{BLER}$ of a codeword in a decoded frame can be computed from the frame error probability $P_{FER}$. Let $\lambda$ be the average number of codewords in a decoded frame which are incorrectly decoded. Then, the error probability $P_{BLER}$ of a decoded codeword is $P_{BLER} = \lambda/(n\tau) P_{FER}$. It is clear that the frame error probability $P_{FER}$ is an upper bound on the block error probability $P_{BLER}$ of a decoded codeword. In simulations, we find that the gap between these two error probabilities is very small corresponding to a difference of one-tenth of a dB in SNR. This reflects the fact that if a frame is not decoded correctly, then most of the $n\tau$ codewords are not decoded correctly.

Suppose we transmit $n\tau$ codewords in the base code C independently and decode them individually using a certain decoding algorithm. Let $P^*_{BLER}$ be the block error probability of a single decoded codeword. Then, the total error probability, denoted by $P_{total}$, of $n\tau$ individually decoded codewords (i.e., the probability that at least one of the $n\tau$ decoded codewords is incorrect) is at least $P^*_{BLER}$.

In the later sections, when we compare the error performance of a cascaded code constructed from a base code C using the above proposed decoding scheme with the error performance of the base code C with other decoding algorithms or schemes in which each received vector is decoded individually, we compare $P_{BLER}$ with $P^*_{BLER}$. In comparison, we also include the frame error probability $P_{FER}$ of a cascaded code to show the gap between $P_{FER}$ and $P_{BLER}$.

Computational Complexity of the GFT-ISSD Scheme in Conjunction with the MSA

It should be noted that, in general, any iterative soft-decision BP-decoding algorithm can be used in conjunction with the proposed GFT-ISDD scheme to decode the $q^\tau$-ary LDPC code $C_{LDPC}$ with $q=2^\kappa$ based on its binary $mn \times n^2$ parity-check matrix $H_{LDPC}$. The two commonly used iterative BP-algorithms for decoding LDPC codes are the SPA and the MSA. Both algorithms require real number computations including multiplications, additions, and comparisons. The MSA is a simplified (or approximated) version of the SPA which requires mainly real number additions and comparisons, but much less multiplications which are required when scaling is performed. Since the MSA is an approximated version of the SPA, decoding an LDPC code with the MSA results in some performance loss. However, if optimal scaling is used in updating LLR's of the received symbols, the MSA may perform just as well as (or very close to) the SPA. For this reason, the MSA or its variations are most commonly used in practice.

For certain embodiments, the MSA is used in conjunction with the GFT-ISDD scheme in decoding the $q^\tau$-ary LDPC code $C_{LDPC}$ based on the binary parity-check matrix $H_{LDPC}$. We denote such a combination as the GFT-ISDD/MSA. However, any other soft decoding scheme may also be used instead of MSA, without departing from the teachings of the present disclosure. In computing the complexity of the GFT-ISDD/MSA, we only count the number of real number comparisons and additions. For a scaled MSA, each check node (CN) requires only 2 real number multiplications, which is a very small part of the total computations. Thus, in one embodiment, we ignore the real number multiplications when estimating the computational complexity of the GFT-ISDD/MSA. In the remaining of this disclosure, "a real number computation" refers to either a real number addition or comparison.

Recall that using the GFT-ISDD scheme to decode a $q^\tau$-ary received vector r of length $n^2$ with $q=2^\kappa$, we decode its $\kappa\tau$ binary constituent vectors $r_{b,i}=(r_{0,i}, r_{1,i}, \ldots, r_{n^2-1,i})$, $0 \leq i < \kappa\tau$, based on the binary LDPC matrix $H_{LDPC}$. Decoding a binary constituent received vector $r_{b,i}$ with the MSA, the number of real number computations required to update the reliabilities of the symbols of $r_{b,i}$ in each decoding iteration is at most $mn(3n+[\log_2 n]-2)$ which is, in general, proportional to the density (the number $mn^2$ of 1-entries) of the binary LDPC matrix $H_{LDPC}$. Since every iteration updates the reliabilities of $\kappa\tau$ binary received vectors, in one embodiment, the total number of real number computations required for updating a $q^\tau$-ary received vector per iteration of the GFT-ISSDD/MSA is $$N_{MSA}=\kappa\tau mn(3n+[\log_2 n]-2)\approx 3\kappa\tau mn^2. \quad (23)$$

Let $I_{avg}$ be the average number of iterations required to decode a $q^\tau$-ary received vector r with the GFT-ISDD/MSA. Then, the average total number of real number computations (excluding the computations required for GFTs over $GF(q^\tau)$) required for decoding r is $$N_{GFT-ISDD/MSA}=N_{MSA}I_{avg}=\kappa\tau mn(3n+[\log_2 n]-2)$$
$$I_{avg}\approx 3\kappa\tau mn^2 I_{avg}. \quad (24)$$

Since the GFT-ISDD/MSA decoding is performed on a collection of $(n-1)\tau$ codewords in the base code C and $\tau$ codewords in the SPC code $C^{(0)}$ (can be made as a codeword in C as described earlier), then the average number of real number computations required to decode a single codeword in C using the GFT-ISDD/MSA is $$N_{avg}=\kappa m(3n+[\log_2 n]-2)I_{avg}\approx 3\kappa mn I_{avg}. \quad (25)$$

If we set the maximum number of iterations to be performed for each MSA decoder to $I_{max}$, then the maximum number of real computations required to decode a $q^\tau$-ary received vector with the GFT-ISDD/MSA is $$N_{max}=\kappa m(3n+[\log_2 n]-2)I_{max}\approx 3\kappa mn I_{max}. \quad (26)$$

Note that mn is the total number of nonzero entries in the parity-check matrix B of the base cyclic code C of prime length, see (1).

In the remaining of this document, we show that decoding the LDPC code $C_{LDPC}$ associated with a cyclic base code C using the GFT-ISDD/MSA converges very fast. For example, setting $I_{max}$ to 5 gives an error performance only 0.2 dB away from the error performance obtained by setting $I_{max}$ to 50, especially for decoding RS and BCH codes.

Code Shortening and Rate Reduction
Shortening the Codes

In many applications, it is desired to use a code of composite length, i.e., not of prime length. In one embodiment, a code of prime length can be shortened to a desired length. Note that for any (n, k) cyclic code over GF(q), the last (rightmost) k symbols in each codeword can be chosen to be information symbols, i.e., they can be chosen arbitrarily, and the first n–k symbols (parity-check symbols) can then be calculated to produce a codeword in the code. A code in this form is said to be systematic. By considering all possible choices of the k information symbols, we obtain the $q^k$ codewords in the code. To shorten the code to length n', where $1 \leq n-n' < k$, we consider all codewords in the code ending with n–n' 0's. There are $q^{k-(n-n')}$ such codewords. By deleting the last n–n' symbols from each such codeword, we obtain the shortened (n', k–(n–n')) code. Note that, in general, this shortened code is not cyclic. However, it can be implemented using the same encoder and decoder as the (n, k) cyclic code, and in this sense it is called a shortened cyclic code. A parity-check matrix for the shortened (n', k–(n–n')) code can be obtained by deleting the last n–n' columns of a parity-check matrix of the (n, k) code.

In one embodiment, the proposed coding scheme is applied to the shortened cyclic code of length n' obtained by shortening the (n, n–m) cyclic code C of prime length n to the desired length n', where n'>m. Let $M'_{i,t}$, for $0 \leq i < \tau$, $1 \leq t < n$, be a message composed of n'–m q-symbols and $M'_{i,0}$, for $0 \leq i < \tau$, be a message composed of n'–1 q-ary symbols. For $0 \leq i < \tau$ and $0 \leq t < n$, we append each message $M'_{i,t}$ with n–n' 0's and encode it into a codeword $c_{i,t}$ in the code $C^{(t)}$ of length n. Then, $c_{i,t}$ ends with n–n' 0's. This completes Step 602 in the encoding process, as shown in FIG. 6. For each t, $0 \leq t < n$, the $\tau$ codewords, $c_{i,t}$, $0 \leq i < \tau$, are combined to form a codeword $c_t$ of length n in the code $C_\tau^{(t)}$ over $GF(q^\tau)$, and the cascaded codeword $c_{casc}=(c_0, c_1, \ldots, c_{n-1})$ in the cascaded code $C_{casc}$ is formed as in Step 604. Applying the permutation $\pi_{col}$, defined by (6), to $c_{casc}$, as stated in Step 606, we obtain the interleaved cascaded codeword $c_{casc}^\pi=(c_0^\pi, c_1^\pi, \ldots, c_{n-1}^\pi)$ in $C_{casc}^\pi$. Note that $c_{casc}^\pi$ can be obtained by arranging $c_0, c_1, \ldots, c_{n-1}$ as rows of the array $\kappa$. Then, the columns of this array give $c_0^\pi, c_1^\pi, \ldots, c_{n-1}^\pi$. Since each of $c_0, c_1^\pi, \ldots, c_{n-1}$ ends with n–n' 0's, $c_{n'}^\pi, c_{n'+1}^\pi = \ldots = c_{n-1}^\pi$ are sequences of 0's. In Step 608, the GFT is performed on the sequences $c_0^\pi, c_1^\pi, \ldots, c_{n-1}^\pi$ to obtain the sequences $c_0^{\pi,F}, c_1^{\pi,F}, \ldots, c_{n-1}^{\pi,F}$. Since the GFT of a sequence of 0's is a sequence of 0's, $c_{n'}^{\pi,F}=c_{n'+1}^{\pi,F}=\ldots=c_{n-1}^{\pi,F}$ are sequences of 0's. In one embodiment, only the sequence $c_0^{\pi,F}, c_1^{\pi,F}, \ldots, c_{n'-1}^{\pi,F}$, composed of nn' symbols in $GF(q^\tau)$ is transmitted over the channel. The collection of all such sequences gives an LDPC code $C'_{LDPC}$ with a parity-check matrix $H'_{LDPC}$ obtained by deleting the last n(n–n') columns of $H_{LDPC}$. Since $H_{LDPC}$ is an m×n array of CPMs of size n×n, $H'_{LDPC}$ is an m×n' array of CPMs of size n×n. In particular, the code $C'_{LDPC}$ is a also QC-LDPC code. The rate of this shortened coding scheme is $((n'-1)+(n-1)(n'-m))/nn'$. The parameter n–n' is called the shortening degree.

At the receiving end, the decoder first decodes the received sequence of length nn' based on the LDPC matrix $H'_{LDPC}$ using an iterative soft-decision BP-algorithm and appends the decoded sequence with n(n–n') 0's. Then, it follows Steps 802-806 as illustrated in FIG. 8 to obtain $c_{0,t}$, $c_{1,t}, \ldots, c_{\tau-1,t}$ which are the estimates of the codewords $c_{0,t}$, $c_{1,t}, \ldots, c_{\tau-1,t}$ in $C^{(t)}$ from which the messages $M_{i,t}$, and therefore the messages $M'_{i,t}$, $0 \leq i < \tau$, $0 \leq t < n$, can be retrieved. In one embodiment, an optional HDD may be performed on the code $C^{(t)}$ on $c_{i,t}$, $0 \leq i < \tau$, $1 \leq t < n$.

In one embodiment, encoding steps 504 and 602 as illustrated in FIGS. 5 and 6 can be combined to form a codeword $c_{i,t}$ of length n over GF(q) in the code $C^{(t)}$. This codeword is not obtained by applying the permutation $\pi_t$ to a codeword in C since this permutation may not result in n−n'0's of the last n−n' symbols in $c_{i,t}$. Correspondingly, in one embodiment, Step 808 of decoding may be skipped.

Reduction of Code Rate

Using the shortening technique described above, we not only reduce the length of the final QC-LDPC code for information transmission but also reduce the code rate. However, in some applications, we may want to reduce the code rate but maintain the code length. One approach to accomplish this goal is presented in the following.

One embodiment starts with an (n, n−m) cyclic code C over GF(q) of prime length n as the base code for the construction of a cascaded code $C_{casc,*}^{\pi,F}$ of length $n^2$ in the GFT domain using the encoding scheme presented in FIGS. 5 and 6. For $0 \leq t < n$, let $\lambda_t$ be a nonnegative integer such that $0 \leq \lambda_t \leq \tau$. In one embodiment, in the first step of encoding, we set $\tau - \lambda_t$ of the $\tau$ messages to zero messages. Encode the $\lambda_t$ nonzero messages into $\lambda_t$ nonzero codewords in C and the $\tau - \lambda_t$ zero messages into $\tau - \lambda_t$ zero codewords in C. Then, we follow the rest of the encoding steps. At the end of Step 608, we obtain a codeword $c_{casc,*}^{\pi,F}$ over GF($q^\tau$) of length $n^2$ in the GFT domain, which contains $(n-1)\lambda_0 + (n-m)(\lambda_1 + \lambda_2 + \ldots + \lambda_{n-1})$ information symbols over GF(q). Therefore, the rate of the resultant LDPC code $C_{casc,*}^{\pi,F}$ is $((n-1)\lambda_0 + (n-m)(\lambda_1 + \lambda_2 + \ldots + \lambda_{n-1}))/\tau n^2$. As an example, if we set $\lambda_0 = \lambda_1 = \ldots = \lambda_{n-1} = 1$, the code $C_{casc,*}^{\pi,F}$ is then a code over GF($q^\tau$) with rate $(n-1)(n-m+1)/\tau n^2$.

Different choices of the set $\{\lambda_0, \lambda_1, \ldots, \lambda_{n-1}\}$ of parameters result in different codes, $C_{casc,*hu \pi,F}$ of the same length $n^2$ but with different rates. The choice $\lambda_0 \lambda_1 = \ldots = \lambda_{n-1} = \tau$ gives the code $C_{casc}^{\pi,F}$. All these codes can be decoded with the same decoder as the code $c_{casc}^{\pi,F}$.

Decoding RS Codes of Prime Lengths with the GFT-ISDD Scheme

One embodiment applies the GFT-ISDD scheme proposed herein to cyclic RS codes of prime lengths and show that the proposed GFT-ISDD scheme not only requires much lower decoding complexity than other SDD schemes or algorithms for RS codes, but also yields superior performance demonstrated through examples.

The GFT-ISDD Scheme for Decoding RS codes

In one embodiment, let $\beta$ be an element of order n in a field GF(q) of characteristic two, where n is a prime factor of q−1 and $q = 2^\kappa$. Consider the cyclic RS code $C_{RS}$ of length n and dimension n−m over GF(q) whose generator polynomial $g_{RS}(X)$ has $\beta, \beta^2, \ldots, \beta^m$ as roots with $1 \leq m < n$. Then, the generator polynomial of this RS code is $g_{RS}(X) = (X-\beta)(X-\beta^2) \ldots (X-\beta^m)$, which is a polynomial of degree m over GF(q) and divides $X^n 1$. The parity-check matrix of the RS code $C_{RS}$ in terms of the roots of its generator polynomial is given by the following m×n matrix over GF(q):

$$B_{RS} = \begin{bmatrix} 1 & \beta & \beta^2 & \cdots & \beta^{n-1} \\ 1 & \beta^2 & (\beta^2)^2 & \cdots & (\beta^2)^{n-1} \\ \vdots & \vdots & \vdots & \ddots & \vdots \\ 1 & \beta^m & (\beta^m)^2 & \cdots & (\beta^m)^{n-1} \end{bmatrix} \quad (27)$$

Typically, the decoding of an RS code is carried out based on a parity-check matrix in the form of (27) using either an HDD or an SDD algorithm. Since the RS code is over GF(q) and $\beta$ is an element in GF(q), we have $\tau = 1$. Hence, the code $C_\tau^{(t)}$ is the same as $C^{(t)}$ for $0 \leq t < n$ and the code $C_{casc}$ is obtained by concatenating codewords in $C^{(0)}, C^{(1)}, C^{(2)}, C^{(n-1)}$, where $C^{(0)}$ is the (n, n−1) SPC code, $C^{(1)} = C_{RS}$ is the RS code, and $C^{(2)}, C^{(n-1)}$ are the Hadamard-equivalents of $C_{RS}$. We call the cascaded code constructed using $C_{RS}$ as the base code the cascaded RS code which is denoted by $C_{RS,casc}$.

In one embodiment, encoding follows with Steps 504 and 602-608 as described corresponding to FIGS. 5 and 6. In the first three steps, codewords $c_t$ over GF(q) in the code $C_{RS}^{(t)}$, $0 \leq t < n$ are obtained. The code $C_{RS}^{(t)}$ has $B_{RS}^{\circ t}$ as a parity-check matrix. The codewords $c_0, c_1, \ldots, c_{n-1}$ are cascaded to form a codeword in $C_{RS,casc}$. Interleaving followed by applying GFT as stated in Steps 606 and 608 of FIG. 6 result in the transmitted codeword in the LDPC code $C_{RS,LDPC}$ with parity-check matrix $H_{RS,LDPC}$. The parity-check matrix $H_{RS,LDPC}$ can be obtained by replacing the entries of $B_{RS}$ by their binary CPM-dispersions. Since the code symbols of $C_{RS}$ and the entries of the parity-check matrix $B_{RS}$ are from the same field GF(q), the GFT of a cascaded codeword in $C_{RS,casc}$ is also a vector over the same field GF(q). The q-ary LDPC code $C_{RS\ LDPC}$ is called an RS-LDPC code. The LDPC matrix $H_{RS,LDPC}$ is called the RS-LDPC parity-check matrix or the RS-LDPC parity-check array.

In one embodiment, we use the proposed GFT-ISDD scheme to decode a received vector r over GF(q) following decoding steps illustrated in FIGS. 7 and 8. In Step 704, we decode its $\kappa$ binary constituent received vectors using a binary iterative soft-decision BP-decoding algorithm based on the binary RS-LDPC matrix $H_{RS,LDPC}$. Decoding an RS code of the cascaded form in such a way greatly reduces the decoding complexity compared to all other existing SDD algorithms or schemes for RS codes. Furthermore, the proposed decoding scheme also yields superior performance over existing SDD algorithms or schemes for RS codes as shown in examples given in the remaining of this disclosure.

In the following, we use a number of example embodiments to demonstrate the effectiveness of the proposed GFT-ISDD scheme for decoding RS codes of prime lengths. Hereafter, in every example, we use the binary MSA for decoding every binary constituent received vector, i.e., we use the GFT-ISDD/MSA for decoding. In performance simulations, we assume transmission over the binary-input additive white Gaussian noise (AWGN) channel using BPSK signaling. It should be noted that the list of example embodiments are non-limiting and any other code, with any other code parameter may also be used without departing from the teachings of the present disclosure. In addition, although GFT-ISDD/MSA is considered as an example decoding algorithm, in general, any other decoding procedure may be used to decode the received sequence without departing from the teachings of the present disclosure.

In the given examples, we may compare the performance of a cascaded RS code $C_{RS,casc}$ decoded with the GFT-ISDD/MSA with the MLD performance (or the UB-MLD) of its base RS code $C_{RS}$.

EXAMPLE 2

In one embodiment, decoding of an RS code $C_{RS}$ over GF($2^5$) using the GFT-ISDD/MSA is considered. In this example, $q = 2^5$ and $2^5 - 1 = 31$ is a prime, the only prime factor of q−1 is n=31. Let $\beta$ be a primitive element of GF($2^5$).

Suppose we construct an RS code $C_{RS}$ whose generator polynomial has $\beta$, $\beta^2$, $\beta^3$, $\beta^4$, $\beta^5$, $\beta^{16}$ as roots. This RS code is a (31,25) primitive RS code over $GF(2^5)$ with rate 0.806 and minimum distance 7 (a triple-error-correcting code). Its parity-check matrix $B_{RS}$ in terms of the roots of its generator polynomial is a 6×31 matrix over $GF(2^5)$ in the form given by (27). From this matrix, we construct a 6×31 RS-LDPC array $H_{RS,LDDC}$ of binary CPMs of size 31×31, which is a 186×961 matrix with column and row weights 6 and 31, respectively. The Tanner graph associated with $H_{RS,LDPC}$ has girth at least six.

For $1 \leq t < 31$, the code $C_{RS}^{(t)}$ given by the null space of BRs (the t-th Hadamard-power of $B_{RS}$) is also a (31,25) code over $GF(2^5)$ which is equivalent to $C_{RS}$. For t=0, the code $C_{RS}^{(0)}$ given by the null space of the 0-th Hadamard-power $B_{RS}^{\circ 0}$ of $B_{RS}$ is a (31,30) SPC code over $GF(2^5)$. By cascading $C_{RS}^{(0)}$ and the 30 Hadamard-equivalents of $C_{RS}$, we obtain a cascaded RS code $C_{RS,casc}$ of length 961 over $GF(2^5)$. Interleaving the 31 component codewords in each codeword of $C_{RS,casc}$ using the permutation $n^-_{col}$ defined by (6) followed by the GFT, we obtain a transmitted vector $c_{casc}^{\pi,\mathcal{F}}$ of 961 symbols over $GF(2^5)$. This is a codeword in the 32-ary (961,780) RS-LDPC code $C_{RS,LDPC}$ given by the null space over $GF(2^5)$ of the binary 186×961 RS-LDPC matrix $H_{RS,LDPC}$.

Next, we decode the cascaded RS code $C_{RS,casc}$ based on the binary 186×961 RS-LDPC matrix $H_{RS,LDPC}$ constructed above using the proposed GFT-ISDD/MSA. We first decompose a received vector r into 5 binary constituent received vectors $r_{b,0}, r_{b,1}, r_{b,2}, r_{b,3}, r_{b,4}$. Each of these 5 binary constituent received vectors is decoded using the MSA with a scaling factor 0.625. The MSA decoding results in 5 decoded binary vectors. We combine these 5 decoded binary vectors into a vector over $GF(2^5)$, which is an estimate of the transmitted codeword $c_{casc}^{\pi,\mathcal{F}}$ in the GFT domain. Applying the inverse GFT, followed by de-interleaving and then inverse Hadamard permutations, we obtain the estimates of the 31 transmitted codewords, one from $C^{(0)}$ and the 30 codewords from the (31,25) RS code $C_{RS}$. Suppose we decode the RS-LDPC code $C_{RS,LDPC}$ using 50 iterations of the MSA without performing HDD on these estimates.

Figure 10A:
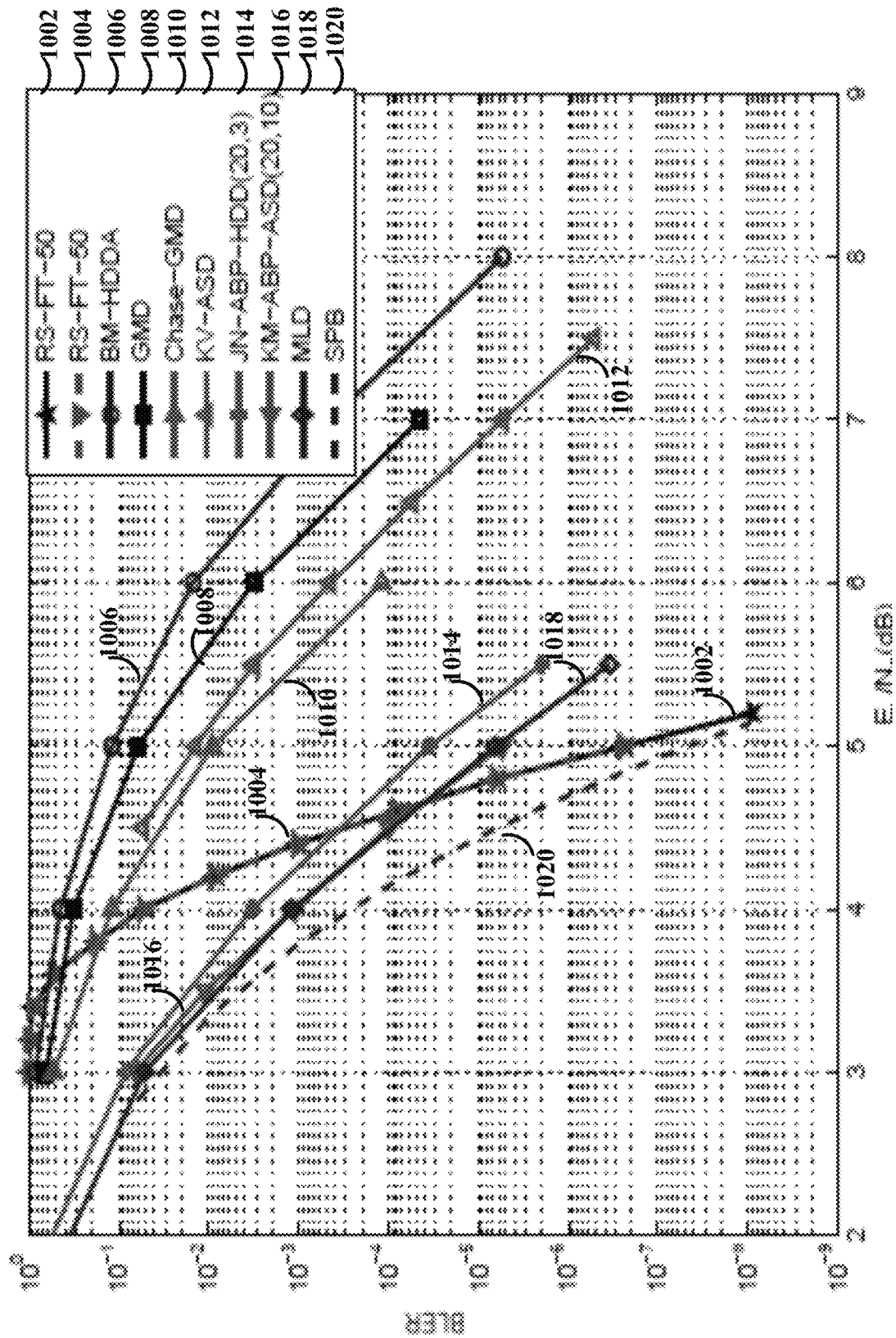
FIG. 10A illustrates frame and block error performances of the (31,25) RS code in Example 2 decoded by the proposed joint decoding and other decoding algorithms, in accordance with certain embodiments of the present disclosure.

FIG. 10A illustrates frame and block error performances of the (31,25) RS code in Example 2 decoded by the GFT-ISDD/MSA and other decoding algorithms, in accordance with certain embodiments of the present disclosure. In this figure, frame error rates are shown with dashed lines and block error rates are shown with solid lines. The block error performance $P_{BLER}$ of a codeword in a decoded frame and the frame error performance $P_{FER}$ of the cascaded code $C_{RS,casc}$ of the (31,25) RS code $C_{RS}$ are shown in curves 1002 and 1004, respectively, labeled by RS-FT-50. We see that the gap between the $P_{FER}$ (curve 1004) and $P_{BLER}$ (curve 1002) is invisible and they basically overlap with each other.

Also included in FIG. 10A are the block error performances of the (31,25) RS code decoded with other algorithms including the BM-HDDA (curve 1006), GMD (curve 1008), Chase-GMD (curve 1010), the KV-ASD (curve 1012), the JN-ABP-HDDA with 20 inner iterations and 3 outer iterations using the SPA, labeled by JN-ABP-HDD (20,3) (curve 1014), the KM-ABP-ASD with 20 inner iterations and 10 outer iterations using the SPA, labeled by KM-ABP-ASD(20,10) (curve 1016) and MLD (curve 1018). The interpolation coefficient used in the KV-ASD is $\lambda$=4.99. It can be seen that the proposed GFT-ISDD/MSA (e.g., curves 1002 and 1004) not only improves upon other algorithms, but also improves upon the performance of MLD of the RS code (curve 1018) below the FER of $10^{-5}$ (with each codeword decoded individually). This surprising result is due to the fact that we do not decode the cascaded codewords in the RS code individually, but rather jointly through the powerful induced QC-RS-LDPC code. At a BLER of $10^{-6}$, the joint-decoding gain of the GFT-ISDD/MSA over MLD of the RS code is 0.3 dB. The coding gain over the BM-HDDA is almost 3 dB at a BLER of $10^{-5}$.

From FIG. 10A, we see that below the BLER of $10^{-5}$, the GFT-ISDD/MSA 1002 outperforms both the JN-ABP-HDD (20,3) 1014 and the KM-ABP-ASD(20,10) 1016 that use the SPA for reliability updating in the iterative decoding process. Note that the KM-ABP-ASD(20,10) 1016 performs almost the same as MLD 1018. Also shown in the figure is the sphere-packing bound (SPB) on the BLER, shown as curve 1020.

Figure 10B:
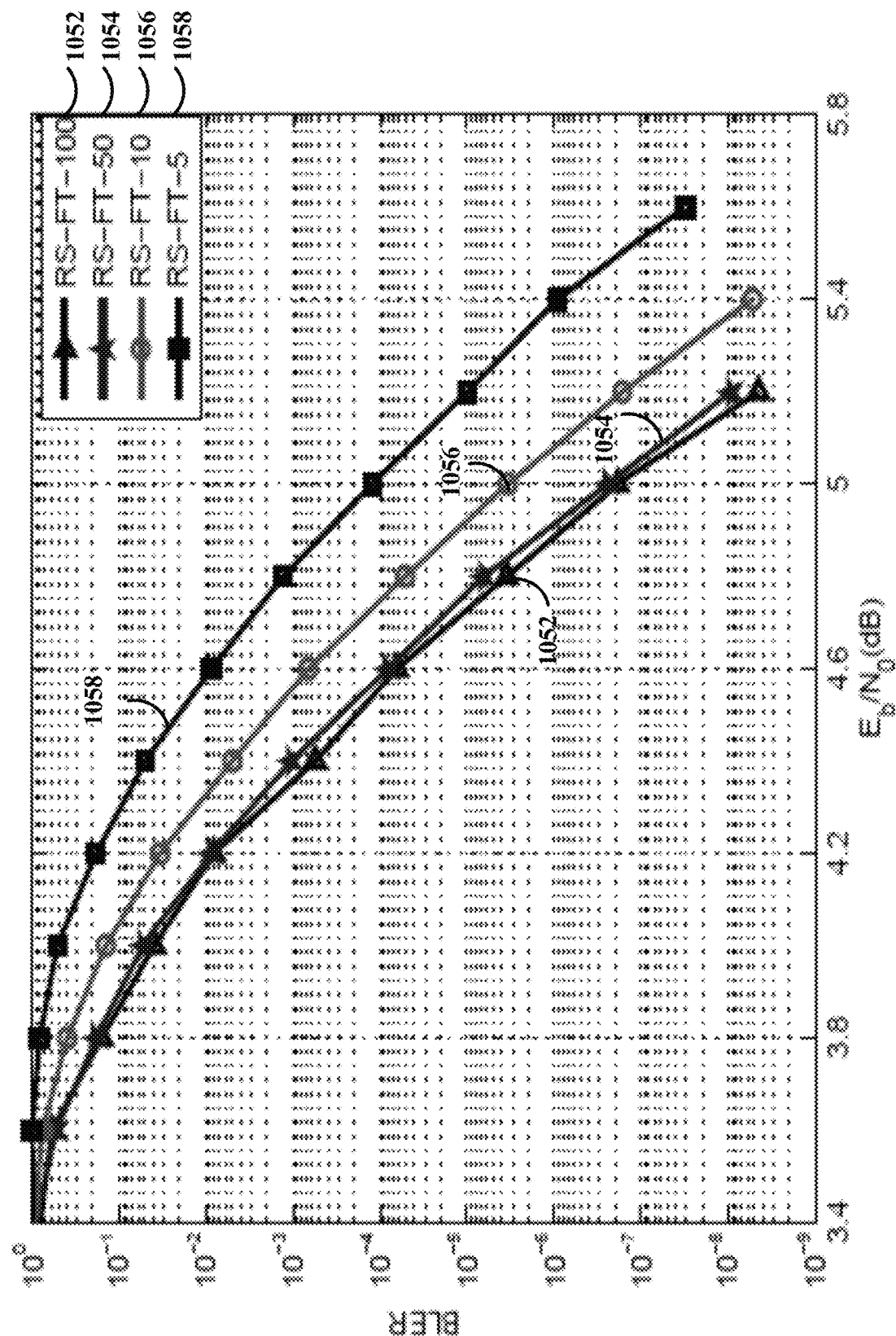
FIG. 10B illustrates block error performances of the (31,25) RS code in Example 2 decoded by the proposed joint decoding with 5, 10, 50, and 100 iterations, in accordance with certain embodiments of the present disclosure.

FIG. 10B illustrates the block error performances of the (31,25) RS code decoded using the GFT-ISDD/MSA with 5, 10, 50, and 100 iterations, labeled by RS-FT-5 1058, RS-FT-10 1056, RS-FT-50 1054, and RS-FT-100 1052, respectively. As illustrated in this figure, decoding of the code with the GFT-ISDD/MSA converges fast. At a BLER of $10^{-8}$, the performance gap between 5 and 10 iterations is 0.3 dB, while the performance gap between 10 and 50 iterations is less than 0.2 dB. Also, the performance curves with 50 and 100 iterations overlap with each other. Even with 5 iterations, the GFT-ISDD/MSA outperforms the KM-ABPA-ASD(20,10) below the BLER of $10^{-6}$.

It follows from Eqn. (23) that the number of real number computations in each iteration of the GFT-ISDD/MSA is 89,280. Since each iteration is performed on 31 codewords from the (31,25) RS base code $C_{RS}$. The average number of real computations required for updating each codeword in $C_{RS}$ is 2880. At the SNR ($E_b/N_0$) of 4.9 dB, the code achieves a BLER of $10^{-6}$ and the decoding takes an average of about 2 iterations to converge. Therefore, from Eqn. (25), at the SNR=4.9 dB, the average number of real number computations required to decode a codeword in $C_{RS}$ is 5760. If the decoding is performed up to a maximum of 5 iterations, then from Eqn. (26), the number of real number computations required is at most 14,400. If the MSA is used in the KM-ABP-ASD(20,10), the number of real number computations required to perform 20 inner iterations and 10 outer iterations is at least 1,161,000, as explained later in this section.

In the next example, we consider a longer RS code with a high rate over a larger field than that used in Example 2. It should be noted that the embodiments presented in this disclosure are mere examples. One of ordinary skill in the art would readily understand that these code parameters are not limiting. In general, the coding scheme presented herein can be used with a variety of code types corresponding to a variety of parameters, and be decoded with any decoding procedure without departing from the teachings of the present disclosure.

EXAMPLE 3

In one embodiment, decoding of an RS code $C_{RS}$ over $GF(2^7)$ using the GFT-ISDD/MSA is considered. In this example, $q=2^7$ and $2^{7-1}=127$ is a prime, the only prime factor of q-1 is n=127. Let $\beta$ be a primitive element of $GF(2^7)$. Suppose we construct an RS code $C_{RS}$ whose generator polynomial has $\beta$, $\beta^2$, $\beta^3$, $\beta^4$, $\beta^5$, $\beta^6$, $\beta^7$, $\beta^8$ as roots. The RS code $C_{RS}$ is a (127,119) primitive RS code over $GF(2^7)$ with rate 0.937 and symbol-error-correcting capability of four. Its parity-check matrix $B_{RS}$ in terms of the roots of its generator polynomial is an 8×127 matrix over $GF(2^7)$ in the form given by Eqn. (27). Using this matrix and its 127 Hadamard-powers $B_{RS}^{\circ t}$, $0 \le t < 127$, we construct an 8×127 RS-LDPC array $H_{RS,LDPC}$ of binary CPMs of size 127×127, which is a 1016×16129 matrix with column and row weights 8 and 127, respectively. The Tanner graph associated with $H_{RS,LDDC}$ has girth at least 6.

For $1 \le t < 127$, the code $C_{RS}^{(t)}$ given by the null space of $B_{RS}^{\circ t}$ (the t-th Hadamard-power of $B_{RS}$) is also a (127,119) code over $GF(2^7)$ which is equivalent to $C_{RS}$. For $t=0$, the code $C_{RS}^{(0)}$ given by the null space of the 0-th Hadamard-power $B_{RS}^{\circ 0}$ of $B_{RS}$ is a (127,126) SPC code over $GF(2^7)$. By cascading $C_{RS}^{(0)}$ and the 126 Hadamard-equivalents of $C_{RS}$, we obtain a cascaded RS code $C_{RS,casc}$ of length 16129 over $GF(2^7)$. A codeword in $C_{RS,casc}$ is composed of 127 words: one word in the (127,126) SPC code and 126 words in $C_{RS}$ and its Hadamard-equivalents. Interleaving the 127 words in each codeword of $C_{RS,casc}$ using the permutation $\pi_{col}$ defined by Eqn. (6) followed by the GFT performed over $GF(2^7)$, we obtain a transmitted vector $c_{casc}^{\pi,F}$ of 16129 symbols over $GF(2^7)$. This is a codeword in the 128-ary (16129,15120) QC-RS-LDPC code $C_{RS,LDPC}$ given by the null space over $GF(2^7)$ of the binary 1016×16129 RS-LDPC matrix $H_{RS,LDPC}$.

To decode the cascaded RS code $C_{RS,casc}$ based on $H_{RS,LDDC}$ using the GFT-ISDD scheme, we first decompose a received vector r into 7 binary constituent received vectors. In decoding of these 7 binary constituent received vectors, we use the binary MSA with a scaling factor of 0.5. The MSA decoding results in 7 decoded binary vectors. We combine these 7 decoded binary vectors into a vector over $GF(2^7)$, which is an estimate of the transmitted codeword $c_{casc}^{\pi,F}$ in the GFT domain. Applying the inverse GFT, followed by de-interleaving and then inverse Hadamard permutations, we obtain the estimates of the 127 transmitted codewords, one from $C^{(0)}$ and 126 codewords from the (127,119) RS code $C_{RS}$. Suppose we do not perform error corrections on these estimates.

Figure 11A:
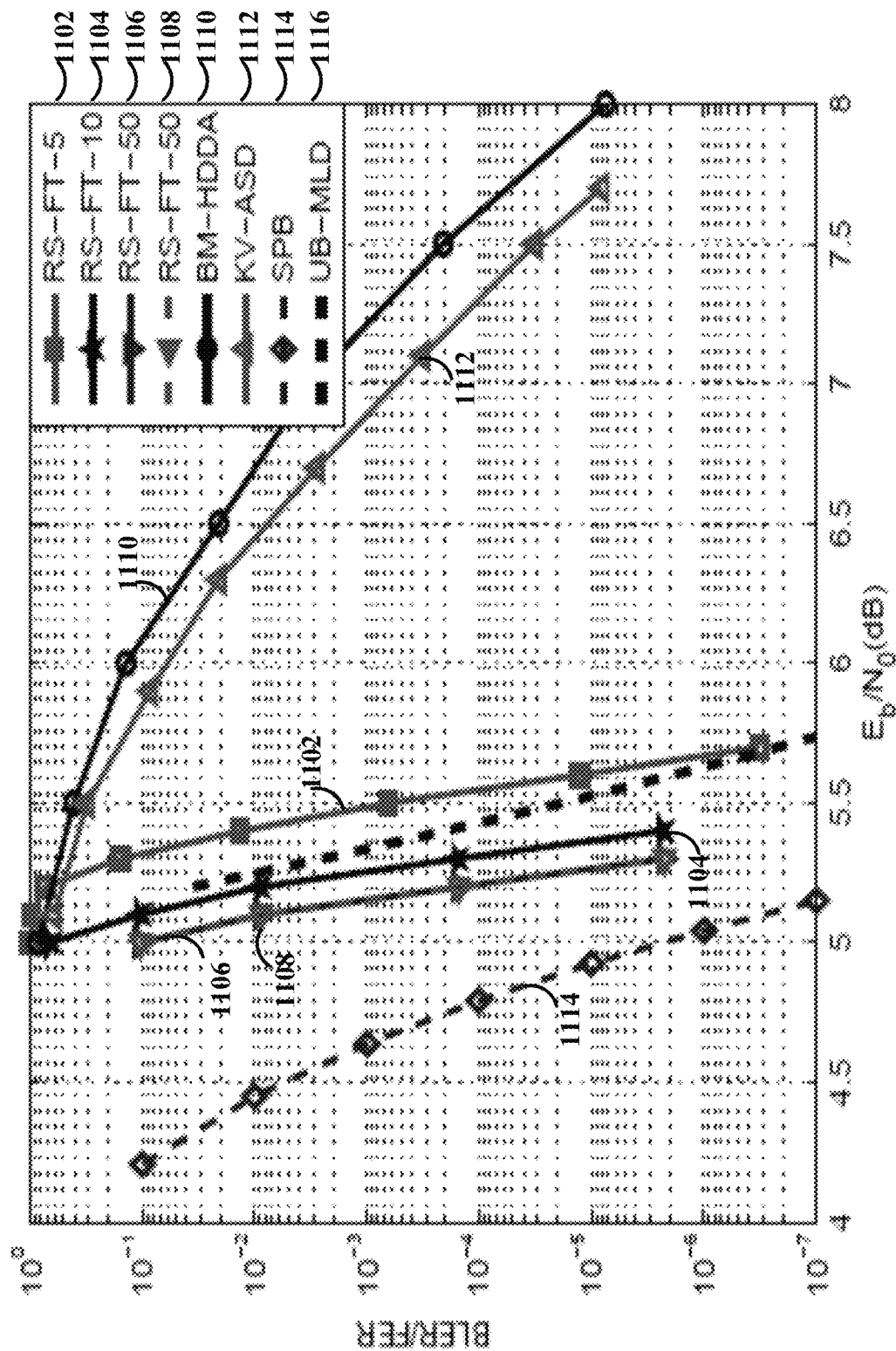
FIG. 11A illustrates frame and block error performances of the (127,119) RS code in Example 3 decoded by the proposed joint decoding and other decoding algorithms, in accordance with certain embodiments of the present disclosure.

FIG. 11A illustrates frame (dashed lines) and block (solid lines) error performances of the (127,119) RS code in Example 3 decoded by the GFT-ISDD/MSA and other decoding algorithms, in accordance with certain embodiments of the present disclosure. The block error performances of a codeword in a frame decoded with 5, 10, and 50 iterations of the MSA in the decoding of the QC-RS-LDPC code $C_{RS,LDPC}$ based on $H_{RS,LDPC}$ are labeled by RS-FT-5 1102, RS-FT-10 1104, and RS-FT-50 1106, respectively. From FIG. 11A, we see that the GFT-ISDD/MSA converges very fast and the performance curves drop sharply. At a BLER of $10^{-5}$, the performance gap between 5 and 50 iterations is within 0.3 dB and the gap between 10 and 50 iterations is about 0.1 dB. The frame error performance $P_{FER}$ of the cascaded code $C_{RS,casc}$ of the (127,119) RS code $C_{RS}$ decoded with 50 iterations of the MSA is also shown in curve 1108. We see that there is almost no gap between the frame error performance and block error performance of the cascaded RS code. At a BLER of $10^{-6}$, the cascaded RS code $C_{RS,casc}$ decoded with 50 iterations of the GFT-ISDD/MSA performs less than 0.3 dB from sphere-packing bound on the BLER (curve SPB 1114).

Also included in FIG. 11A are the block error performances of the (127,119) RS code decoded with the BM-HDDA 1110 and the KV-ASDA 1112 with interpolation coefficient $\lambda$=4.99. In BM-HDDA and KV-ASDA decoding procedures, each received codeword is decoded independently. We see that the GFT-ISDD/MSA (e.g., curves 1102-1106) performs superior than the KV-ASDA (curve 1112). With 50 iterations of the MSA (e.g., curve 1106), at a BLER of $10^{-5}$, there is a 2.75 dB gain over the BM-HDDA 1110 of the code. Also included in FIG. 11A is the UB-MLD of the base (127,119) RS code $C_{RS}$. We see that the BLER performance curves of $C_{RS,casc}$ decoded with 10 and 50 iterations of the GFT-ISDD/MSA are below the UB-MLD 1116 curve. The curve UB-MLD 1116 shows the union bound the MLD performance.

Figure 11B:
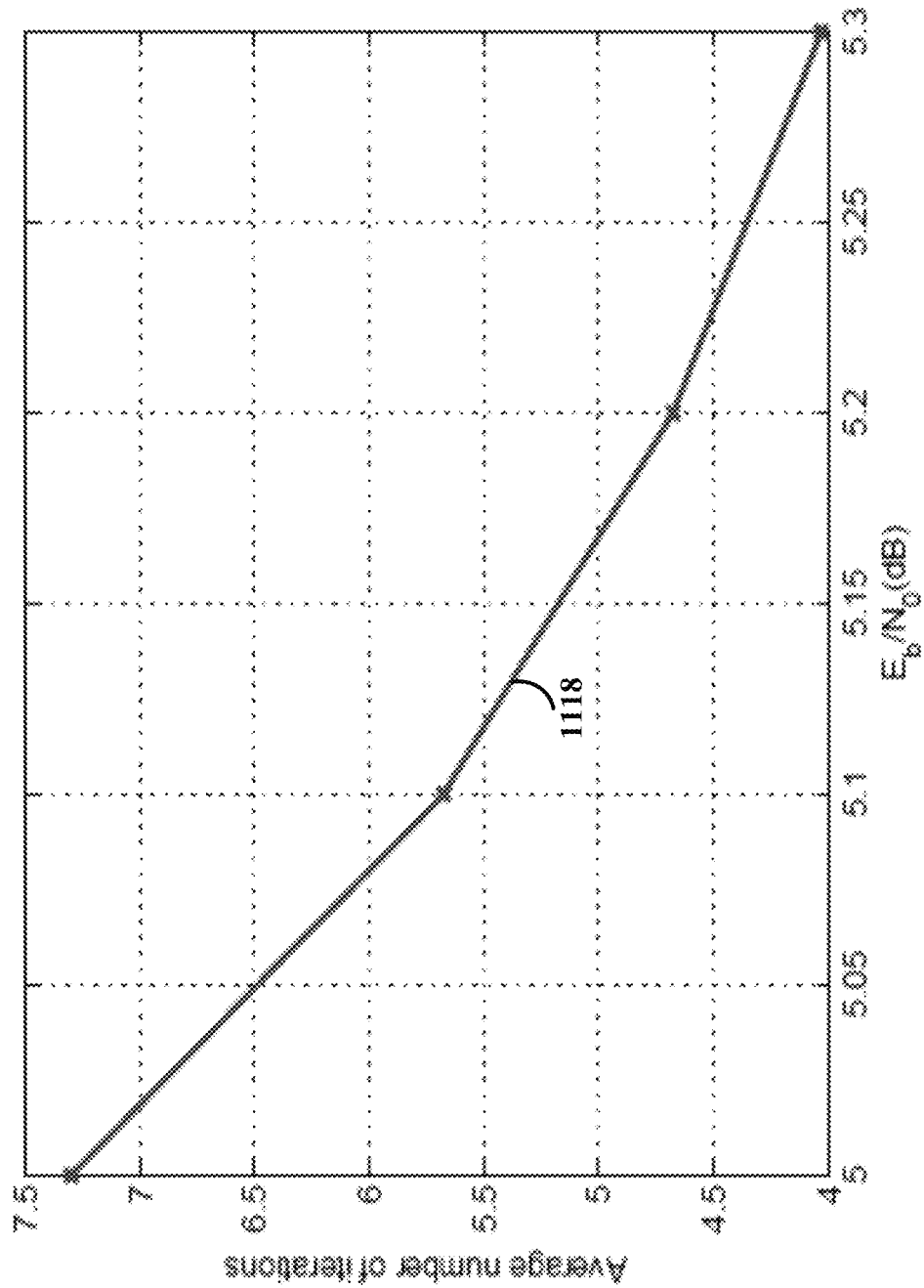
FIG. 11B illustrates average number of iterations required to decode the (127,119) RS code in Example 3 v.s. $E_b/N_0$ (dB), in accordance with certain embodiments of the present disclosure.

FIG. 11B illustrates average number of iterations required to decode the (127,119) RS code in Example 3 as a function of SNR, in accordance with certain embodiments of the present disclosure. Curve 1118 shows the fast rate of decoding convergence using the GFT-ISDD/MSA to decode the cascaded (127,119) RS code. The number of real number computations required for updating each codeword per iteration of the GFT-ISDD/MSA is 21,616. If the maximum number of iterations is set to 5, the number of real number computations required to decode a codeword is 108,080. Complexity comparison with the ABPA will be given later.

In the last two examples, we gave the error performances of two primitive RS codes decoded using the proposed GFT-ISDD scheme. In the next example, we consider a nonprimitive RS code.

EXAMPLE 4

In one embodiment, decoding of a nonprimitive RS code $C_{RS}$ over $GF(2^{11})$ using the GFT-ISDD/MSA is considered. In this example, q−1=2048−1=2047, which can be factored as the product of two prime numbers, 23 and 89. Based on these two prime factors, we can construct two nonprimitive RS codes over $GF(2^{11})$.

Let $\alpha$ be a primitive element of $GF(2^{11})$ and $\beta = \alpha^{23}$. The order of $\beta$ is n=89. Let $C_{RS,0}$ be the RS code of length 89 over $GF(2^{11})$ whose generator polynomial has $\beta$, $\beta^2$, $\beta^3$, $\beta^4$ as roots. Then, the code $C_{RS,0}$ is an (89,85) RS code over $GF(2^{11})$ with rate 0.955. We decode the cascaded code of this RS code and its Hadamard-equivalents using the GFT-ISDD/MSA. Each received vector r consists of 7921 received symbols which are elements in $GF(2^{11})$. In decoding, we decode the 11 binary constituent received vectors of r, each with 50 iterations of the MSA.

Figure 12A:
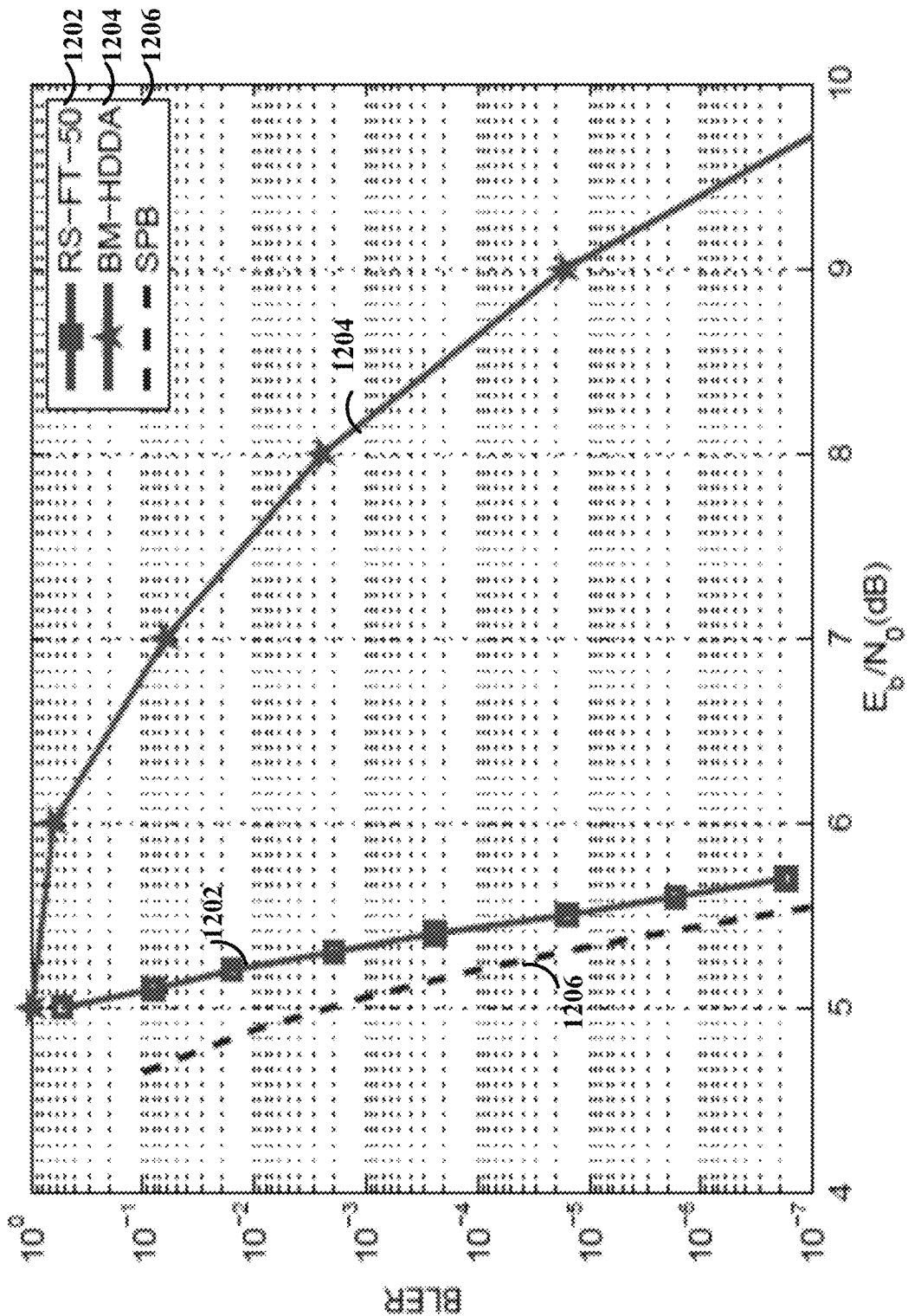
FIG. 12A illustrates block error performances of the (89,85) RS code in Example 4 decoded by the proposed joint decoding and other decoding algorithms, in accordance with certain embodiments of the present disclosure.

FIG. 12A illustrates Block error performances of the (89,85) RS code in Example 4 decoded by the GFT-ISDD/MSA and the BM-HDDA, in accordance with certain embodiments of the present disclosure. The block error performance of the RS code RS-FT-50 1202 shows that the block error probability $P_{BLER}$ drops sharply. Also included in this figure is the block error performance of decoding each received codeword over $GF(2^{11})$ individually using the BM-HDDA (Curve 1204). We see that at a BLER of $10^{-7}$ the proposed GFT-ISDD/MSA (curve 1202) achieves about 4 dB gain over the BM-HDDA of the code. In FIG. 12A, the frame error performance of the cascaded code $C_{RS,casc}$ of the RS code $C_{RS}$ is not included since the curves of the frame and block error performances overlap with each other. Block error rate of the cascaded code $C_{RS,casc}$ of the RS code $C_{RS}$ is shown in curve 1202. Sphere-packing bound is also shown in curve SPB 1206.

Figure 12B:
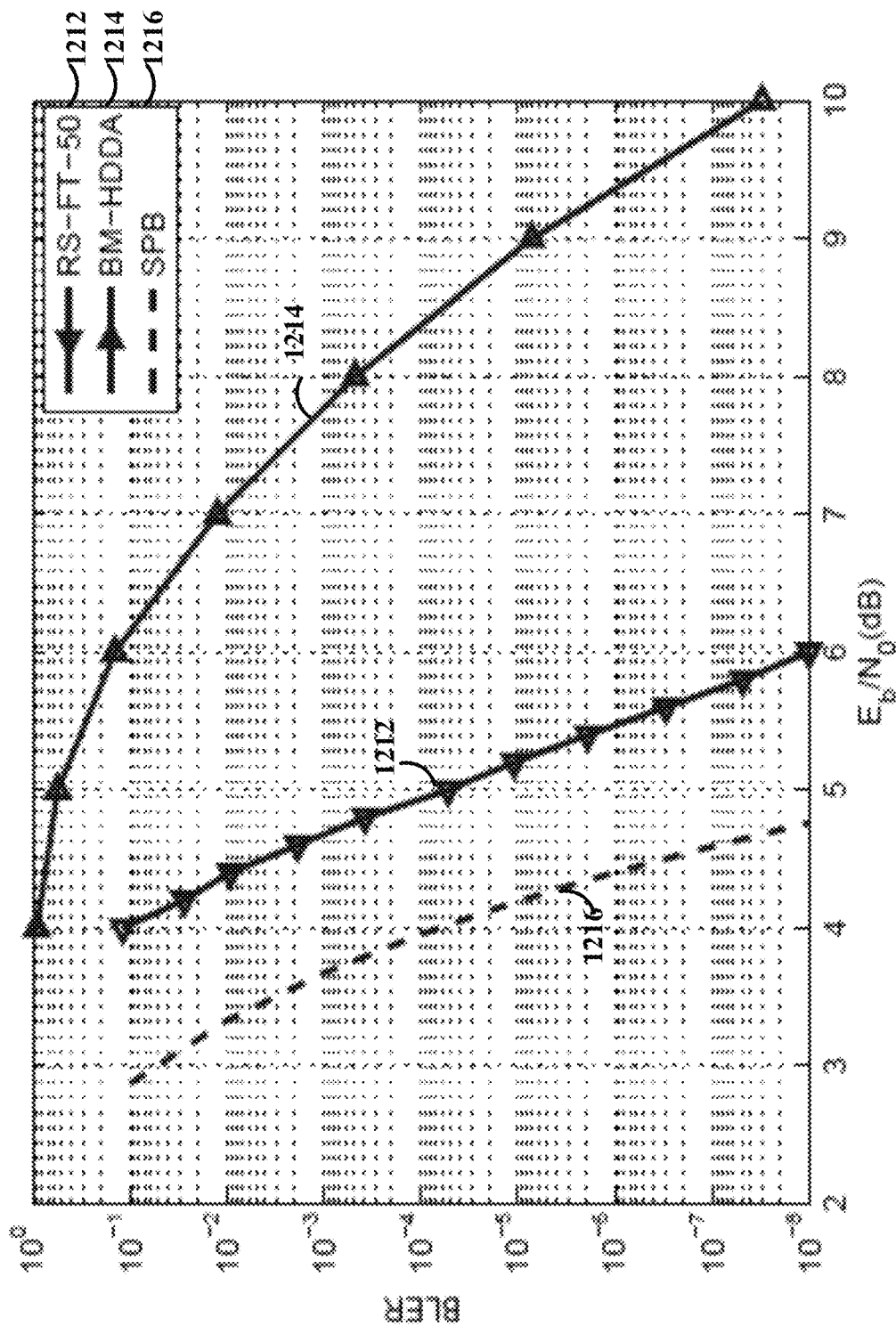
FIG. 12B illustrates block error performances of the (23,19) RS code in Example 4 decoded by the proposed joint decoding and other decoding algorithms, in accordance with certain embodiments of the present disclosure.

FIG. 12B illustrates block error performances of the (23,19) RS code in Example 4 decoded by the GFT-ISDD/MSA and the BM-HDDA, in accordance with certain embodiments of the present disclosure. Let $\eta = \alpha^{89}$. Then, $\eta$ is an element of order 23 in $GF(2^{11})$. Next, we construct a (23,19) nonprimitive RS code over $GF(2^{11})$, denoted by $C_{RS,1}$, whose generator polynomial has $\eta$, $\eta^2$, $\eta^3$, $\eta^4$ as roots. The rate of this RS code is 0.826. Curve 1212 in FIG. 12B illustrates block error performance of the cascaded (23,19)

RS code of length 529 using the GFT-ISDD/MSA. At a BLER of $10^{-8}$, the GFT-ISDD/MSA (curve 1212) achieves 4 dB coding gain over the BM-HDDA 1214. Curve SPB 1216 illustrates Sphere-packing bound on BLER.

EXAMPLE 5

In one embodiment, a shortened cascaded RS code in the GFT domain is considered. As an example, consider the (127,121) RS code $C_{RS}$ over $GF(2^7)$ whose generator polynomial has $\beta, \beta^2, \beta^3, \beta^4, \beta^5, \beta^6$ as roots where $\beta$ is a primitive element of $GF(2^7)$. $C_{RS}$ is a triple-error-correcting RS code with rate 0.9527. Suppose we shorten this RS code by a degree of 63. Shortening results in a (64,58) shortened RS code. Using this shortened RS code as the base code and following the encoding process described above, we obtain a shortened (8128,7371) QC-RS-LDPC code over $GF(2^7)$ with rate 0.9068 in the GFT domain. Each transmitted codeword in the cascaded shortened (64,58) RS code consists of 126 codewords in the shortened (64,58) RS code and one codeword in the (64,63) SPC code in the GFT domain.

Figure 13A:
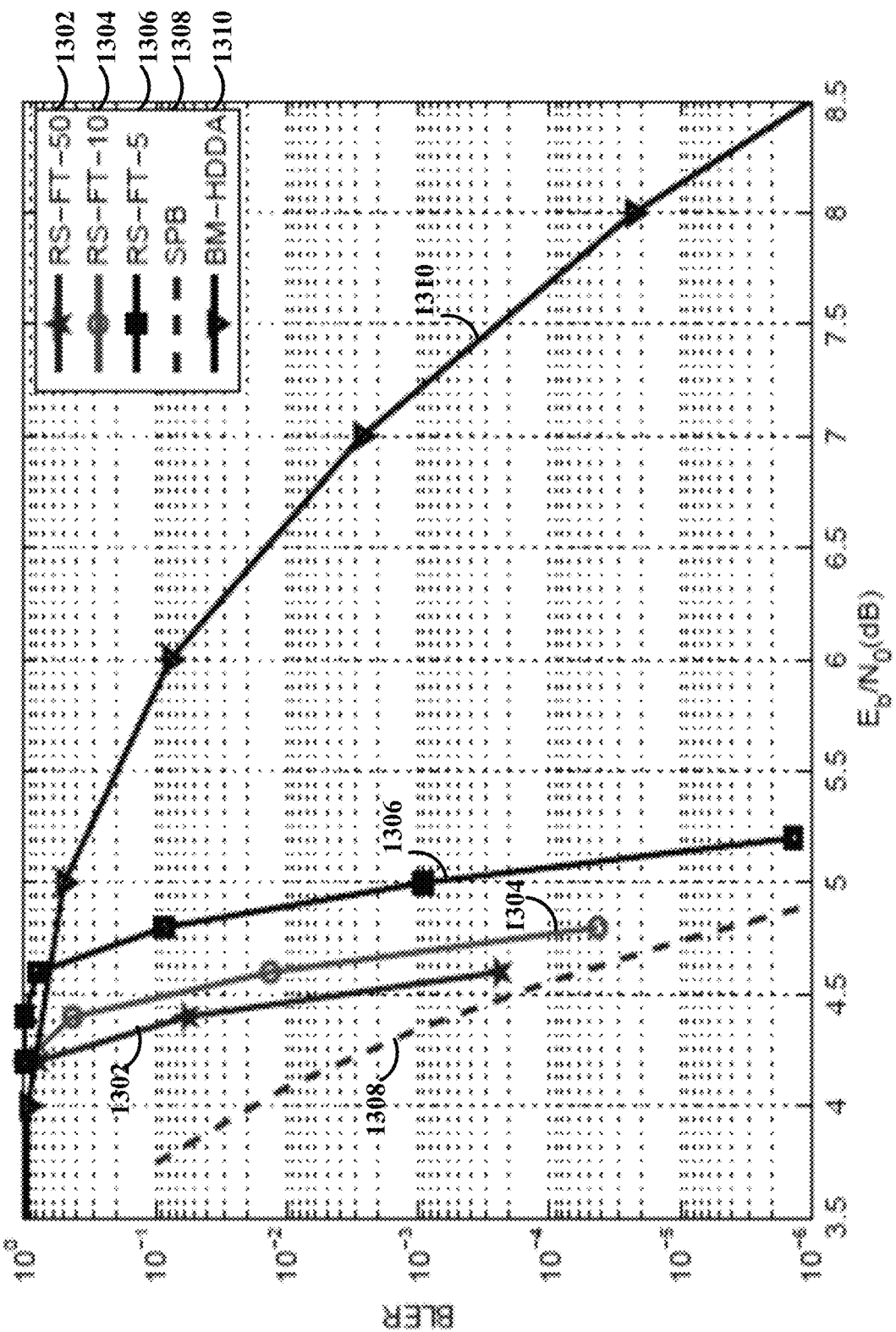
FIG. 13A illustrates block error performances of the shortened (64,58) RS code over GF ($2^7$) in Example 5 decoded by the proposed joint decoding and other decoding algorithms, in accordance with certain embodiments of the present disclosure.

FIG. 13A illustrates block error performances of the shortened (64,58) RS code over GF $(2^7)$ decoded by the GFT-ISDD/MSA and the BM-HDDA (curve 1310), in accordance with certain embodiments of the present disclosure. The BLER performances of this shortened cascaded (64,58) RS code decoded with 5, 10, and 50 iterations of the GFT-ISDD/MSA are shown in curves 1302, 1304, and 1306, respectively. Sphere-packing bound on the BLER is also shown in curve SPB 1308.

Figure 13B:
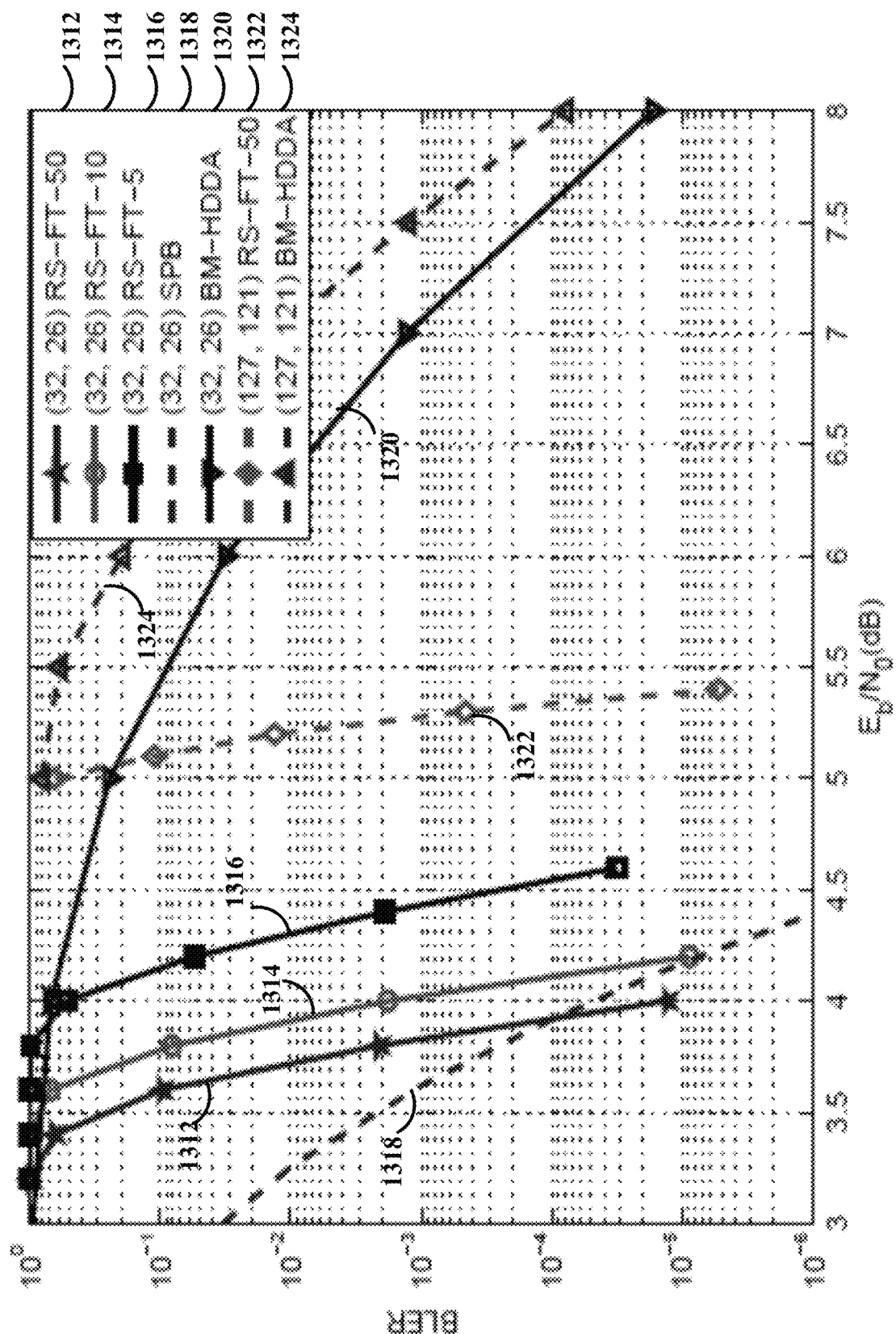
FIG. 13B illustrates block error performances of the shortened (32,26) RS code over GF ($2^7$) and the (127,121) RS code over GF ($2^7$) in Example 5 decoded by the proposed joint decoding and other decoding algorithms, in accordance with certain embodiments of the present disclosure.

FIG. 13B illustrates block error performances of the shortened (32,26) RS code over GF $(2^7)$ and the (127,121) RS code over GF $(2^7)$ decoded by the GFT-ISDD/MSA and the BM-HDDA (curve 1320), in accordance with certain embodiments of the present disclosure. By shortening the (127,121) RS code over $GF(2^7)$ by a degree 95, we obtain a shortened (32,26) RS code $GF(2^7)$. Using this shortened RS code as the base code, we can construct a shortened (4064, 3307) QC-RS-LDPC code with rate 0.8137 in the GFT domain. The BLER performances of this shortened cascaded RS code decoded 5, 10, and 50 iterations of the GFT-ISDD/MSA are shown in curves 1312, 1314 and 1316 in FIG. 13B, respectively. Also included in FIG. 13B is the BLER performance of the cascaded (127,121) RS code (curves 1322 and 1324). Sphere-packing bound on the BLER is also shown in curve SPB 1318.

Computational Complexity and Comparison

In the following, we give a comparison between the computational complexity of the GFT-ISDD/MSA and that of an ABPA (either the JN-ABP-HDDA or the KM-ABP-ASDA) for decoding an RS code.

In one embodiment, the MSA is used in conjunction with the proposed GFT-ISDD scheme for decoding the cascaded RS code $C_{RS,casc}$ in the GFT domain. It follows from Eqn. (25) that the average number of real computations required to decode a single codeword in the base RS code $C_{RS}$ using the GFT-ISDD/MSA in the iterative process of decoding its associated RS-LDPC code $C_{RS,LDPC}$ is $$N_{RS,avg} = \kappa m(3n + [\log_2 n] - 2) I_{RS,LDPC} \approx 3\kappa mn I_{RS,avg}, \quad (28)$$

where $I_{RS,avg}$ is the average number of iterations required to decode a q-ary received vector using the GFT-ISDD/MSA.

For decoding of an (n, n−m) RS code $C_{RS}$ over $GF(2^\kappa)$ with the ABPA, the decoding of a codeword consists of $N_1$ inner ABP iterations and $N_2$ outer iterations. Each ABP iteration consists of the four steps. The first step is to sort the components of the LLR vector associated with the binary received vector of length n$\kappa$, which is the binary expansion (or binary image) of the received vector of length n over $GF(2^\kappa)$, to find m$\kappa$ least reliable bits. This step requires real number comparisons. The second step is to adapt a new parity-check matrix in which the part (submatrix) corresponding to the m$\kappa$ least reliable bits is sparse. This step requires binary operations to perform Gaussian elimination. The third step is to perform a BP algorithm to update the reliabilities of the received symbols based on the newly adapted parity-check matrix. This step requires real number computations (including real number multiplications, additions, and comparisons). After the completion of each ABP iteration, if the hard-decision vector formed based on the updated LLR vector does not converge to a codeword, HDD is performed on the hard-decision vector using an HDDA. For the JN-ABP-HDDA, HDD is performed with the BM-HDDA. For the KM-ABP-ASDA, the KV-ASDA is used. Any other algorithm may also be used without departing from the teachings of the present disclosure. The KV-ASDA requires much more computation complexity than the BM-HDDA.

To show that the computational complexity of the proposed GFT-ISDD/MSA is much lower than that of the ABPA (either the JN-ABP-HDDA or the KM-ABP-ASDA), we only compare the number of real number computations required by the GFT-ISDD/MSA and that of the ABP iteration step (which is common for both the JN-ABP-HDDA and the KM-ABP-ASDA). Suppose the MSA is applied to update LLRs during the ABP iteration step. In this example, we only compute a lower bound on the number of real computations (including real number additions and comparisons) at the ABP/MSA iteration step. The adapted parity-check matrix used for each inner ABP/MSA iteration consists of two submatrices, one sparse and one dense. The dense submatrix is a $\kappa M \times \kappa(n-m)$ matrix with average row weight $\kappa(n-m)/2$ and average column weight $\kappa m/2$. The sparse submatrix is a $\kappa M \times \kappa M$ matrix with column weight 1 (can be made weight 2 which will increase the computational complexity). Then, the average number of real number computations in each inner ABP/MSA iteration is lower bounded by $$\kappa m(3\kappa(n-m)/2 + [\log_2(1+\kappa(n-m)/2)]) \approx 3/2\kappa^2 m(n-m). \quad (29)$$

Therefore, in this example, a lower bound on the number of real number computations required at the ABP/MSA decoding step with total number $N_1 N_2$ of inner and outer iterations is $$N_{ABP} = N_1 N_2 \kappa m(3\kappa(n-m)/2 + [\log_2(1+\kappa(n-m)/2)]) \approx 3/2 N_1 N_2 \kappa^2 m(n-m). \quad (30)$$

Comparing the number of real number computations required for one GFT-ISDD/MSA iteration with that of one ABP/MSA iteration, we can easily check that for an RS code of rate greater than $2/\kappa$, the GFT-ISDD/MSA requires lower computational complexity than the ABP/MSA for each LLR updating iteration. For example, consider the (31,25) RS code given in Example 2. Each GFT-ISDD/MSA iteration requires 2880 real number computations, while each ABP/MSA iteration of the JN- (or the KM-) ABPA requires 5805 real number computations. For the (127,119) RS code over $GF(2^7)$ given in Example 3, each GFT-ISDD/MSA iteration requires 21,616 real number computations to update the LLRs of a codeword in the cascaded (127,199) RS code, while each ABP/MSA iteration of the JN- (or the KM-) ABPA requires at least 70,476 real number computations (ignoring all the additional computations required in other steps).

For the JN-ABPA (or the KM-ABPA), to achieve good error performance, $N_1$ and $N_2$ must be reasonably large (even using the SPA for reliability updating). Large $N_1$ and $N_2$ increase the computational complexity drastically and make the implementation of the ABP decoder for an RS code impractical. Again, consider the (31,25) RS code over $GF(2^5)$. For this code to achieve MLD performance, the KM-ABP-ASDA requires $N_1=20$ and $N_2=10$; then, the total number of real computations required to decode a codeword is at least 1,161,000. However, decoding the code with the GFT-ISDD/MSA achieves MLD performance at the SNR of 4.8 dB as shown in FIG. 10A. At this SNR, the average number of MSA iterations required to decode a codeword is about two, and the number of real computations required to decode a codeword is only 5760. If we carry out the GFT-ISDD/MSA with 50 iterations, the number of real number computations required to decode a codeword in the cascaded (31,25) RS code is 144,000 which is at least 8 times less than 1,161,000, the real number computations required by the KM-ABP/MSA with $N_1=20$ inner and $N_2=10$ outer iterations. We see that the GFT-IDSS/MSA reduces the computational complexity drastically compared to both the KM-ABP-ASDA and the JN-ABP-HDDA.

Another significant advantage of the GFT-ISDD scheme over the ABPA is that the decoding matrix is fixed without new adaptation after each decoding iteration. Furthermore, since the parity-check matrix $H_{RS,LDPC}$ of the cascaded RS-LDPC code $C_{RS,LDPC}$ is an array of binary CMPs of size n×n, the reduced-complexity revolving iterative decoding (RID) scheme can be used in conjunction with the GFT-ISDD/MSA to reduce the hardware decoder complexity by a factor as large as n (the size of a CPM).

Decoding of BCH Codes of Prime Lengths with the proposed GFT-ISDD Scheme

In one embodiment, the GFT-ISDD scheme is used to decode binary BCH codes of prime lengths. Similar to RS codes, BCH codes form an important class of error-correcting codes, discovered in 1959 and 1960. They have been widely used for error control in various communications and storage systems since the 1960s. BCH codes are generally decoded with the BM-HDDA. Several SDD algorithms or schemes (mostly reliability-based list decoding) have also been devised over the years. These decoding algorithms or schemes either achieve relatively small coding gains over the BM-HDDA or require large decoding complexity. In the following, we apply the GFT-ISDD scheme to decode BCH codes of prime lengths and show that superior error performance can be achieved with practically implementable complexity.

In one embodiment, for this subclass of codes, we set $\kappa=1$, $q=2$, and $\tau \geq 3$. Let n be a prime factor of $2^\tau-1$ and $\beta$ be an element of order n in $GF(2^\tau)$. Let t and m be two positive integers such that $1 \leq 2t \leq m < n$. Let S be a set of m elements in the cyclic subgroup $\{1, \beta, \beta^2, \ldots, \beta^{n-1}\}$ of the field GF ($2^\tau$) which consists of 2t consecutive powers of $\beta$ say $\beta, \beta^2, \beta^3, \ldots, \beta^{2t}$, and their conjugates, i.e., if $\eta$ is an element of S, then $\eta^{(2^l)^{p^i}}$ with $l \geq 0$ is also an element of S. Let $g_{BCH}(X)$ be a polynomial of degree m over GF(2) with elements in S as roots. Then, the binary cyclic code of length n generated by $g_{BCH}(X)$ is a t-error-correcting binary (n, n−m) BCH code $C_{BCH}$ of length n with minimum distance at least 2t+1, as implied by the BCH bound. For nontrivial cases, m is greater than 2 t. The code $C_{BCH}$ has an m×n parity-check matrix $B_{BCH}$ of the form given by Eqn. (1) in which each row corresponds to a root of $g_{BCH}(X)$. Note that the t-error-correcting BCH code $C_{BCH}$ over GF(2) is a subfield subcode of the t-symbol-error-correcting RS code over $GF(2^\tau)$ whose generator polynomial has only $\beta, \beta^2, \ldots, \beta^{2t}$ as roots.

From the m×n parity-check matrix $B_{BCH}$ over $GF(2^\tau)$ for $C_{BCH}$ in the form given by Eqn. (1), we can construct the m×n array $H_{BCH,LDPC}$ of binary CPMs of size n×n, which is an mn×n² binary matrix with column and row weights m and n, respectively. Note that the $2\tau$-ary BCH-LDPC code $C_{BCH,LDPC}$ given by the null space over $GF(2^\tau)$ of the BCH-LDPC parity-check matrix $H_{BCH,LDPC}$ has minimum distance at least m+1, which is in general greater than the designed distance 2t+1 of the t-error-correcting base BCH code $C_{BCH}$.

Encoding follows steps as shown in FIGS. 5 and 6. In steps 504 and 602, we obtain codewords $c_{i,t}$ over GF(2) in the code $C_{BCH}^{(t)}$, $0 \leq i < \tau$, $0 \leq t < n$. The code $C_{BCH}^{(t)}$ has $B_{BCH}^{\circ t}$ as a parity-check matrix. In Step 604, $\tau$ codewords in $C_{BCH}^{(t)}$ are combined to form a codeword $c_t$ over GF ($2^\tau$) in the code $C_{BCH,\tau}^{(t)}$ of length n. The codewords $c_0, c_1, \ldots, c_{n-1}$ are cascaded to form a codeword in the cascaded BCH code $C_{BCH,casc}$. Steps 606 and 608 are then performed to form the transmitted codeword in the BCH-LDPC code $C_{BCH,LDPC}$ with the BCH-LDPC matrix $H_{BCH,LDPC}$. The parity-check matrix $H_{BCH,LDPC}$ can be obtained by replacing the entries of $B_{BCH}$ by their binary CPM-dispersions. Decoding of the cascaded code $C_{BCH,casc}$ can be performed using the GFT-ISDD scheme following Steps described corresponding to FIGS. 7 and 8.

In the following, we use several examples to demonstrate the effectiveness of the GFT-ISDD scheme for decoding BCH codes of prime lengths. This is even true for cyclic binary Hamming codes.

EXAMPLE 6

In one embodiment, we consider the triple-error-correcting (31,16) primitive BCH code $C_{BCH}$ whose generator polynomial has $\beta, \beta^2, \beta^3, \beta^4, \beta^5, \beta^6$ and their conjugates as roots, a total of 15 roots, where $\beta$ is a primitive element in $GF(2^5)$. This code has minimum distance seven. Using the 15 roots of the generator polynomial of this BCH code, we form a 15×31 parity-check matrix $B_{BCH}$ over $GF(2^5)$ in the form of Eqn. (1). Based on the parity-check matrix $B_{BCH}$, we form the BCH-LDPC matrix $H_{BCH,LDPC}$, a 15×31 array of 31×31 binary CPMs. The cascaded code $C_{BCH,casc}$ of the (31,16) BCH code $C_{BCH}$ is of length 961. The GFT of a codeword in the interleaved code $C_{BCH,casc}^\pi$ of the cascaded BCH code $C_{BCH,casc}$ is a codeword in the 32-ary BCH-LDPC code $C_{BCH,LDPC}$ given by the null space over $GF(2^5)$ of the BCH-LDPC matrix $H_{BCH,LDPC}$. Since $H_{BCH,LDPC}$ satisfies the RC-constraint and has column weight 15, the BCH-LDPC code $C_{BCH,LDPC}$ associated with the base BCH code $C_{BCH}$ has minimum distance at least 16 which is more than twice the minimum distance of the base code $C_{BCH}$.

We decode the cascaded BCH code $C_{BCH,casc}$ using the GFT-ISDD scheme based on the parity-check array $H_{BCH,LDPC}$. At the BCH-LDPC decoding stage, the received vector over $GF(2^5)$ is decomposed into 5 binary constituent received vectors and each of these 5 binary vectors is decoded with 50 iterations of the MSA.

Figure 14:
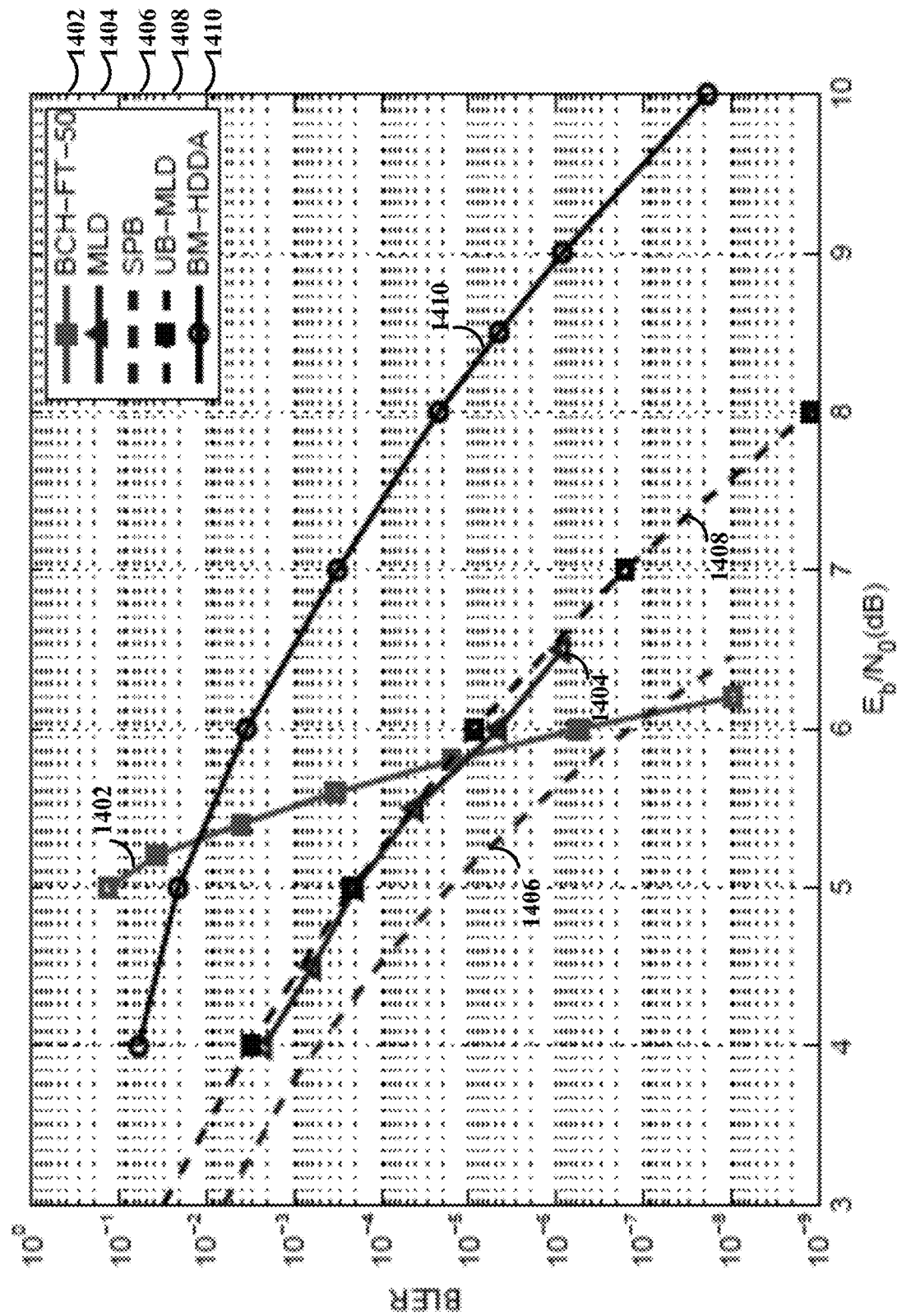
FIG. 14 illustrates block error performances of the (31,16) BCH code in Example 6 decoded by the proposed joint decoding and other decoding algorithms, in accordance with certain embodiments of the present disclosure.

FIG. 14 illustrates Block error performances of the (31, 16) BCH code decoded by the GFT-ISDD/MSA, the BM-HDDA, and MLD, in accordance with certain embodiments of the present disclosure. Curve BCH-FT-50 1402 illustrates block error performance of the cascaded code C BCH,casc of the (31,16) BCH code $C_{BCH}$. In addition, block error performance of the BCH code decoded using the BM- HDDA and MLD are shown in curves 1410 and 1404. At a BLER of $10^{-8}$, the GFT-ISDD/MSA achieves about 3.8 dB coding gain over the BM-HDDA and 1.4 dB joint-decoding gain over the MLD of the code which decodes each received codeword individually. From FIG. 14, we see that the MLD 1404 and the upper bound MLD (UB-MLD 1408) curves basically overlap with each other. Hence, the UB-MLD is a very tight bound on the MLD. Sphere-packing bound on BLER is also shown in curve 1406 for comparison.

EXAMPLE 7

In one embodiment, a binary double-error-correcting primitive BCH code $C_{BCH}$ constructed from the field $GF(2^7)$ is considered, which is a (127,113) cyclic code of prime length with rate 0.89. Let $\beta$ be a primitive element of $GF(2^7)$. The generator polynomial of this code has $\beta$, $\beta^2$, $\beta^3$, $\beta^4$ and their conjugates as roots, a total of 14 roots. This BCH code is a subfield subcode of the (127,123) RS code over $GF(2^7)$. Based on the 14 roots of its generator polynomial, we construct a 14×127 BCH-LDPC array $H_{BCH,LDPC}$ of binary CPMs of size 127×127. It is a 1778×16129 binary matrix with column weight 14 and row weight 127. Even though the (127,113) BCH base code has minimum distance 5, its associated 128-ary BCH-LDPC code $C_{BCH,LDPC}$ given by the null space over $GF(2^7)$ of the BCH-LDPC matrix $H_{BCH,LDPC}$ has minimum distance at least 15.

Figure 15:
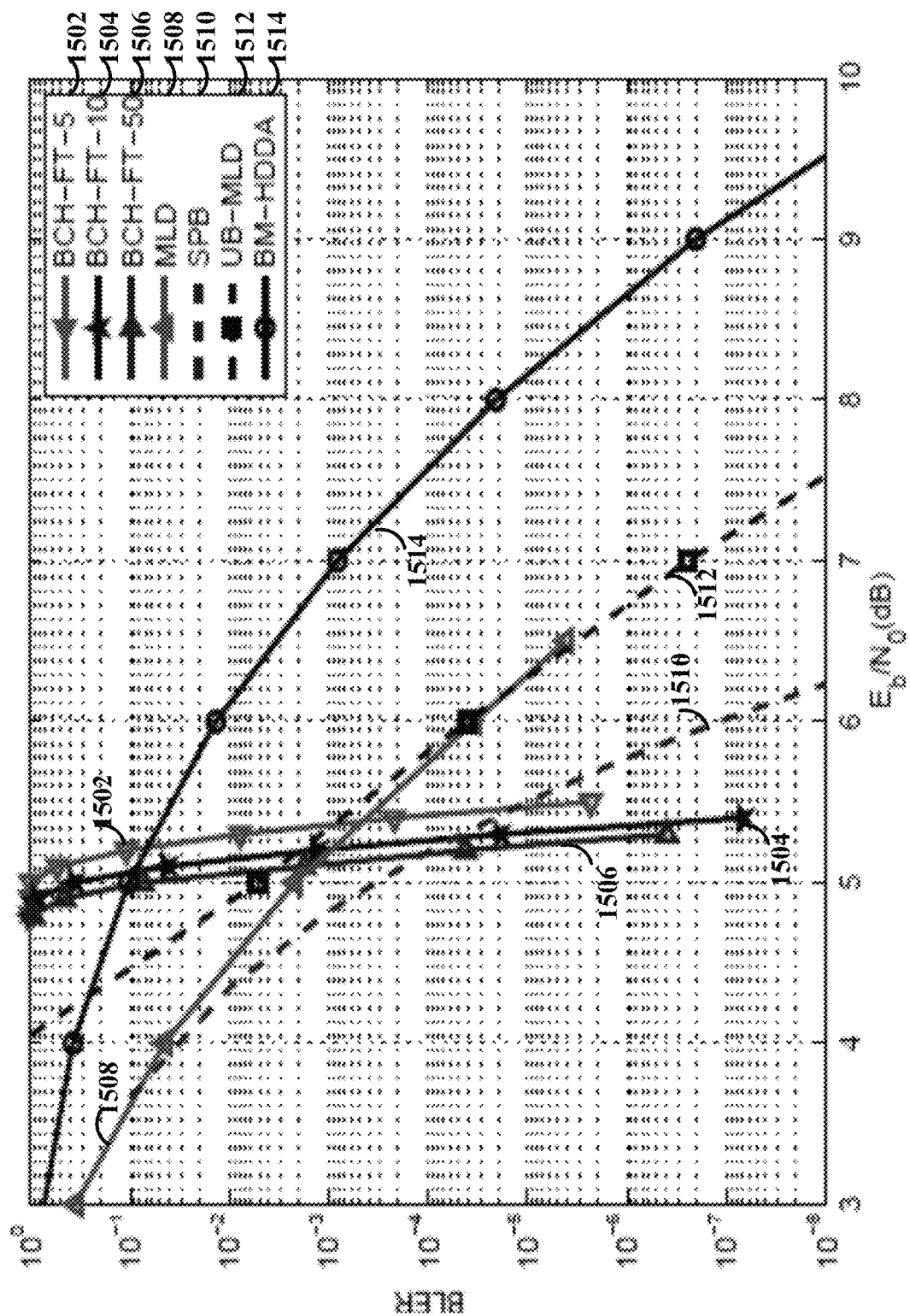
FIG. 15 illustrates block error performances of the (127, 113) BCH code in Example 7 decoded by the proposed joint decoding and other decoding algorithms, in accordance with certain embodiments of the present disclosure.

FIG. 15 illustrates Block error performances of the (127, 113) BCH code decoded by the GFT-ISDD/MSA, the BM-HDDA, and MLD, in accordance with certain embodiments of the present disclosure. The block error performances of the (127,113) BCH code decoded in cascaded form in the GFT domain with the GFT-ISDD/MSA using 5, 10, and 50 iterations are shown in curves BCH-FT-5 1502, BCH-FT-10 1504, and BCH-FT-50 1506, respectively. We see that the GFT-ISDD/MSA decoding of this code converges very fast and with 10 iterations of the MSA, at a BLER of $10^{-7}$, it achieves 3.7 dB coding gain over the BM-HDDA curve 1514 and 1.8 dB joint-decoding gain over the UB-MLD of the code (curve 1512). From FIG. 15, we see that at BLER of $10^{-5}$, the GFT-ISDD/MSA decoding of the cascaded (127,113) BCH code with 50 iterations (curve 1506) achieves more than 1 dB coding gain over the MLD of the (127,113) BCH code with each codeword decoded individually. Furthermore, we see that for SNR greater than 5 dB, the MLD performance (curve 1508) and the UB on the MLD performance of the BCH code (curve 1512) overlap with each other, i.e., the UB-MLD is tight. Curve SPB 1510 illustrates Sphere-packing bound on BLER.

In the next example, we show that even a cyclic binary Hamming code of prime length decoded with the proposed GFT-ISDD/MSA can achieve a very good error performance.

EXAMPLE 8

In one embodiment, a (127,120) cyclic binary Hamming code $C_{Ham}$ is considered. The $C_{Ham}$ code has a rate 0.945 and minimum distance 3, and is generated by a primitive polynomial of degree 7 over $GF(2)$, $g(X)=X^7+X^3+1$. The subscript "Ham" stands for "Hamming". This primitive polynomial has a primitive element $\beta$ of $GF(2^7)$ and its 6 conjugates as roots which are $\beta^2$, $\beta^4$, $\beta^8$, $\beta^{16}$, $\beta^{32}$ and $\beta^{64}$. Using these 7 roots, we form a 7×127 array $H_{Ham,LDPC}$ of 127×127 binary CPMs, which is an 889×16129 binary matrix with column and row weights 7 and 127, respectively. We decode the (127,120) Hamming code in cascaded form in the GFT domain using the GFT-ISDD/MSA based on the Hamming-LDPC matrix $H_{Ham,LDPC}$. Suppose the decoding of the 128-ary Hamming-LDPC code $C_{Ham,LDPC}$ associated with the base Hamming code $C_{Ham}$ is performed with 5, 10, and 50 iterations of the MSA.

Figure 16:
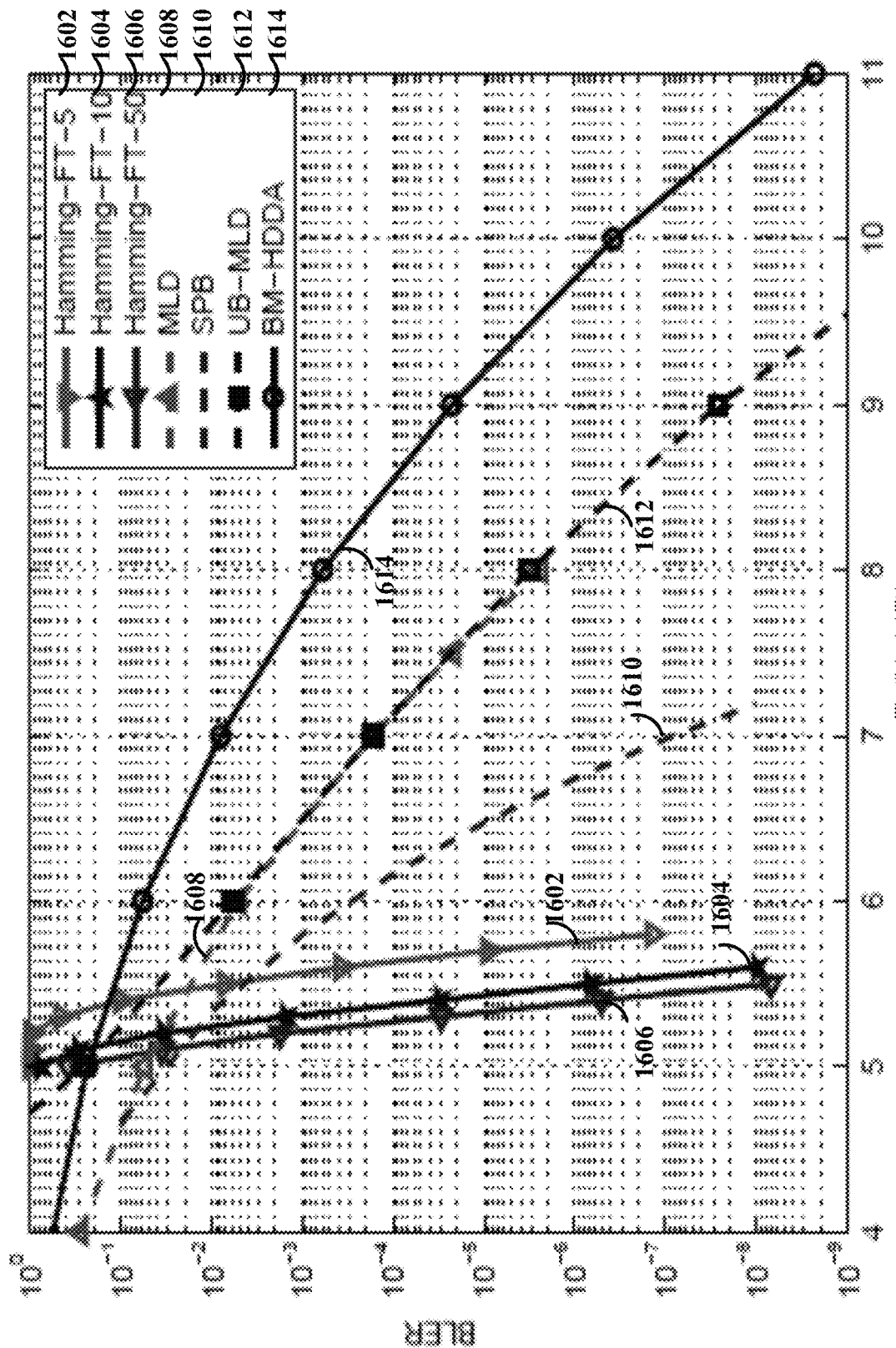
FIG. 16 illustrates block error performances of the (127, 120) Hamming code in Example 8 decoded by the proposed joint decoding and other decoding algorithms, in accordance with certain embodiments of the present disclosure.

FIG. 16 illustrates block error performances of the (127, 120) Hamming code in decoded by the GFT-ISDD/MSA, the BM-HDDA, and MLD, in accordance with certain embodiments of the present disclosure. The block error performances of the code are labeled by Hamming-FT-5 1602, Hamming-FT-10 1604, and Hamming-FT-50 1606, corresponding to 5, 10 and 50 decoding iterations, respectively. We see that at a BELR of $10^{-8}$, the GFT-ISDD/MSA with 50 iterations (curve 1606) achieves 5.2 dB coding gain over the BM-HDDA 1614 and 3.7 dB joint-decoding gain over MLD 1608, a very large joint-decoding gain over MLD. Even with 5 iterations of the MSA, the GFT-ISDD/MSA (curve 1602) outperforms the BM-HDDA and MLD by 4.4 dB and 2.9 dB gains at a BLER of $10^{-7}$, respectively. It even improves upon the SPB (curve 1610) applied to each codeword decoded individually by 0.7 dB. FIG. 16 also shows that the GFT-ISDD/MSA decoding of the code (curves 1602, 1604 and 1606) converges fast. UB-MLD is also shown in curve 1612.

Decoding of QR Codes of Prime Lengths with the GFT-ISDD Scheme

Another interesting class of cyclic codes of prime lengths is the class of binary quadratic residue (QR) codes. QR codes were first introduced by Gleason and later were investigated by many mathematicians and coding theorists. QR codes are good in terms of their minimum distances, i.e., for a given length n and dimension k, say an (n, k) QR code may have the largest possible minimum distance compared to other linear block codes of the same length and dimension. Many short binary QR codes with good (even the best) minimum distances have been found. Among them, the most well-known QR code is the (23,12) Golay code with minimum distance seven. QR codes are good but in general, they are difficult to decode algebraically up to their error-correcting capabilities guaranteed by their minimum distances. Since QR codes are cyclic and of prime lengths, in one embodiment, the proposed GFT-ISDD scheme can be applied to decode them. In this section, we apply the GFT-ISDD scheme to decode two short binary QR codes to demonstrate that they can achieve very good error performances.

Before applying the GFT-ISDD scheme to QR codes, we give a brief introduction to these codes. Let n be a prime. Then, there exists a prime field, denoted by $GF(n)$, with integer elements, $0,1,2, \ldots, n-1$, under modulo-n addition and multiplication. There are exactly half $((n-1)/2)$ of the nonzero elements that have square roots in $GF(n)$, i.e., they are even powers of a primitive element in $GF(n)$. These elements are referred to as quadratic residues. Let $\alpha$ be a primitive element of $GF(n)$ and $m=(n-1)/2$. Then, m even powers of $\alpha$, namely, $(\alpha^0)_n$, $(\alpha^2)_n$, $(\alpha^4)_n, \ldots, (\alpha^{2(m-1)})_n$, give the $(n-1)/2$ quadratic residues in $GF(n)$. Note that after the power $(\alpha^{2(m-1)})_n$, the set of quadratic residues will repeat. As an example, consider the prime field $GF(7)=\{0, 1,2,3,4,5,6\}$ under modulo-7 addition and multiplication. The integer 5 is a primitive element of $GF(7)$ and $m=(7-1)/2=3$. If we take the powers, $(5^0)_7$, $(5^2)_7$, and $(5^{2\times 2})_7$, we obtain the quadratic residues, 1, 4, and 2, in $GF(7)$. Note that $(5^{2\times 3})_7=1$.

From here on, the elements in the set $\{1,4,2\}$ of quadratic residues will repeat. Another way to find the $(n-1)/2$ quadratic residues in $GF(n)$ is to take the powers of two of the nonzero elements, 1,2,3, ... , m, i.e., $(1^2)_n$, $(2^2)_n$, $(3^2)_n$, $(m^2)_n$. Consider the prime field GF(7) given above. The powers of two of the elements, 1, 2, and 3, (i.e., $(1^2)_7$, $(2^2)_7$, and $(3^2)_7$) give the 3 quadratic residues 1, 4, and 2 in GF (7) which are the same as computed above.

Let n be an odd prime and $\Omega_n$ be the set of m=(n−1)/2 quadratic residues in the prime field GF(n). Let β be an element of order n in the field GF($2^\tau$), where τ be the smallest positive integer such that n is a factor of $2^\tau$−1. Define the following polynomial:

$$g_{QR}(X) = \Sigma_{\ell \in \Omega_n} (X - \beta^\ell). \quad (31)$$

The polynomial $g_{QR}(X)$ defined by Eqn. (31) is a polynomial of degree m over GF(2), which divides $X^n$−1. The cyclic code with $g_{QR}(X)$ as the generator polynomial is a binary (n, n−m) QR code, denoted by $C_{QR}$, of rate (n+1)/2n. Many short binary QR codes of this type have been constructed and they have very good (or even the best) minimum distances.

In one embodiment, the QR codes may be encoded following the steps described in FIGS. 5 and 6. In addition, decoding may follow the steps as described in FIGS. 7 and 8. In one embodiment, encoding and decoding of QR codes may be similar to the encoding/decoding for BCH codes as described above.

EXAMPLE 9

In one embodiment, consider the QR code of length 17. The set of quadratic residues in this case is $\Omega_{17}$={1,2,4,8,9,13,15,16}. The smallest positive integer τ for which $2^\tau$−1 is divisible by 17 is τ=8. Let α be a primitive element of GF($2^8$) which is a root of the primitive polynomial $X^8+X^4+X^3+X^2+1$, and $\beta=\alpha^{15}$. Then, β is an element of order 17 in GF($2^8$). In this case, the generator polynomial $g_{QR}(X)$ given in (31) is $X^6+X^4+X^2+X+1$, which is an irreducible polynomial with roots β, $\beta^2$, $\beta^4$, $\beta^8$, $\beta^9$, $\beta^{13}$, $\beta^{15}$, and $\beta^{16}$ GF ($2^8$). The cyclic code generated by $g_{QR}(X)$ is a binary (17,9) QR code $C_{QR}$ with minimum distance 5, which is the best linear code in terms of minimum distance for length 17 and dimension 9.

In one embodiment, suppose we decode this code in cascaded form using the GFT-ISDD/MSA. Based on the 8 roots of $g_{QR}(X)$, we form an 8×17 binary QR-LDPC array $H_{QR,LDPC}$ of CPMs of size 17×17, which is a 136×289 matrix with column and row weights 8 and 17, respectively. The QR-LDPC code associated with $C_{QR}$ is a 256-ary QC-QR-LDPC code of length 289 with minimum distance at least 9. We decode the cascaded code $C_{QR,casc}$ with $C_{QR}$ as the base code using the GFT-ISDD scheme with 50 iterations of the MSA scaled by a factor 0.5.

Figure 17:
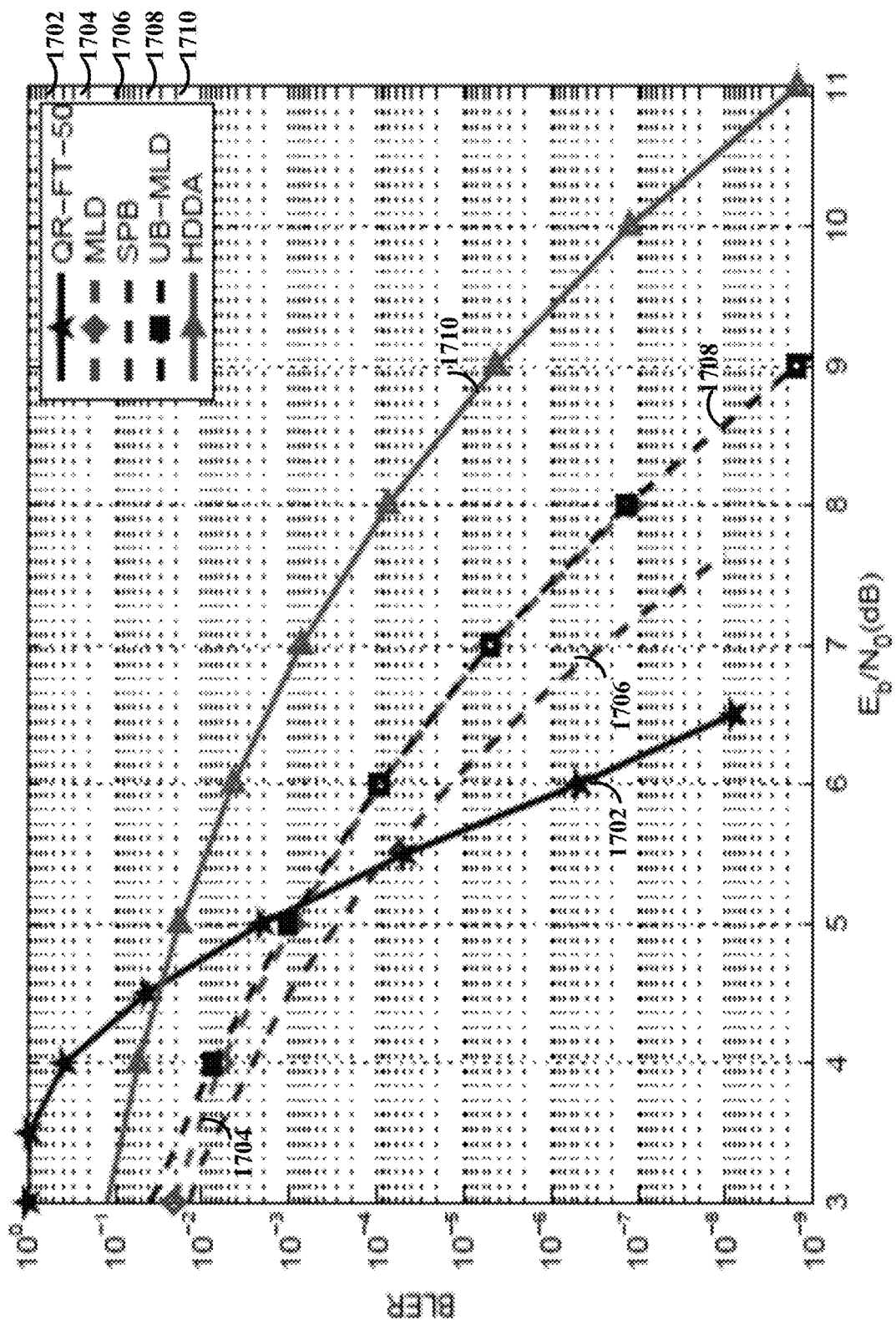
FIG. 17 illustrates block error performances of the (17,9) QR code in Example 9 decoded by the proposed joint decoding and other decoding algorithms, in accordance with certain embodiments of the present disclosure.

FIG. 17 illustrates block error performances of the (17,9) QR code in Example 9 decoded by the GFT-ISDD/MSA, HDDA, and MLD, in accordance with certain embodiments of the present disclosure. The block error performance of $C_{QR}$ is labeled by QR-FT-50 1702. We see that below the BLER of $10^{-3}$, the GFT-ISDD/MSA outperforms MLD (curve 1704) of the code with each received codeword decoded individually. At a BLER of $10^{-8}$, QR-FT-50 1702 shows 2.1 dB joint-decoding gain over MLD (curve 1704) and 4.1 dB gain over HDDA (curve 1710). Curve SPB 1706 illustrates Sphere-packing bound on BLER, and curve UB-MLD 1708 shows union bound on the MLD performance.

EXAMPLE 10

One embodiment considers the most well-known QR code (e.g., the (23,12) Golay code $C_{Golay}$ with minimum distance of 7), which is a perfect code. The set of 11 quadratic residues in the prime field GF(23) is $\Omega_{23}$={1,2,3,4,6,8,9,12,13,16,18}. The smallest positive integer τ for which 23 divides $2^\tau$−1 is τ=11. Let α be a primitive element of GF ($2^{11}$) which is a root of the primitive polynomial $X^{11}+X^2+1$, and $\beta=\alpha^{89}$. Then the order of β is 23. The generator polynomial of the (23,12) Golay code $C_{Golay}$ is $$g_{Golay}(X) = X^{11}+X^9+X^7+X^6+X^5+X+1,$$

which has β, $\beta^2$, $\beta^3$, $\beta^4$, $\beta^6$, $\beta^8$, $\beta^9$, $\beta^{12}$, $\beta^{13}$, $\beta^{16}$, and $\beta^{18}$ as roots.

Figure 18:
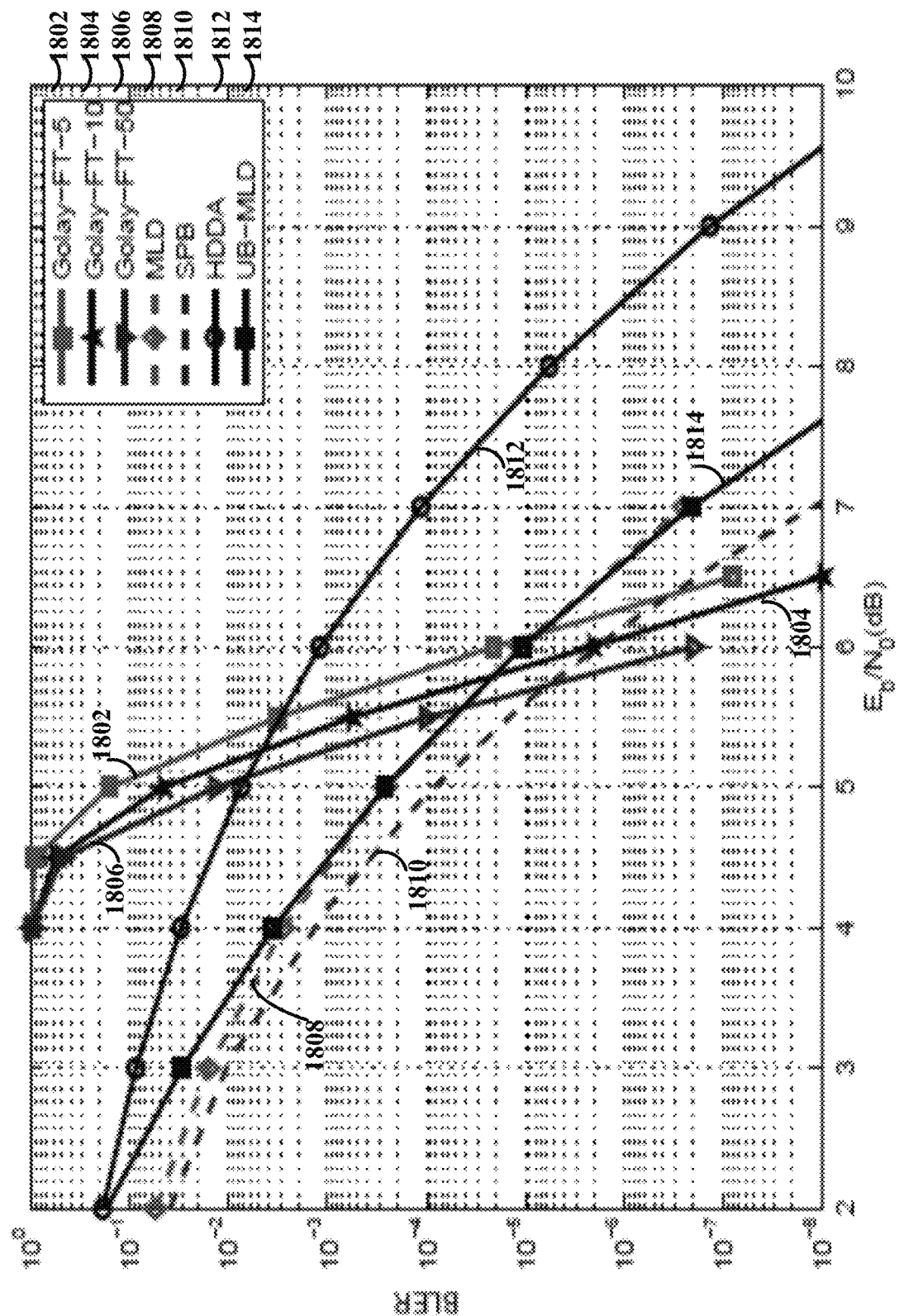
FIG. 18 illustrates block error performances of the (23,12) QR code in Example 10 decoded by the proposed joint decoding and other decoding algorithms, in accordance with certain embodiments of the present disclosure.

FIG. 18 illustrates block error performances of the (23,12) QR code in Example 10 decoded by the GFT-ISDD/MSA, HDDA, and MLD, in accordance with certain embodiments of the present disclosure. The cascaded code $C_{Golay,casc}$ is decoded with the GFT-ISDD/MSA using 5, 10, and 50 iterations of the MSA with a scaling factor 0.5, labeled by Golay-FT-5 1802, Golay-FT-10 1804, and Golay-FT-50 1806, respectively. The block error performances of the code are shown in FIG. 18. We see that the decoding converges fast. Also included in FIG. 18 is the block error performances of a single received codeword decoded with HDDA (curve 1812) and MLD (curve 1808). We see that below the BLER of $10^{-8}$, the GFT-ISDD/MSA (curve 1806) outperforms MLD. At a BLER of $10^{-8}$, with 10 iterations of the MSA (curve 1804), the GFT-ISDD scheme achieves 3 dB and 1.1 dB joint-decoding gains over the HDDA (curve 1812) and MLD (curve 1808), respectively. In addition, curve SPB 1810 shows sphere-packing bound on BLER and curve UB-MLD 1814 shows the union bound the MLD performance Note that 89 is also a prime factor of $2^{11}$−1. In one embodiment, using the quadratic residues of the prime field GF(89), an (89,45) QR code with minimum distance 15 can be constructed.

As described above, in one embodiment, the novel and effective coding scheme disclosed herein can be used for encoding and iterative soft-decision decoding of a class of cyclic codes of prime lengths, n, over finite fields of characteristic two. This class of cyclic codes includes all RS and BCH of prime lengths and all QR codes over such fields. Two of the keys to the disclosed coding scheme are joint-encoding and joint-decoding of a collection of codewords from a code. In one embodiment, the coding scheme includes applying Hadamard-permutations (or their inverses) to symbols of the encoded or decoded codewords in the collection; combining (or de-combining) encoded or decoded codewords into a codeword over a larger field; interleaving (or de-interleaving) encoded or decoded codewords; and taking GFTs (or their inverses) to the sequence of interleaved encoded or decoded codewords.

The joint-decoding and information sharing according to one embodiment results in an error performance per decoded codeword better than the error performance of a received codeword decoded individually using MLD as demonstrated in several embodiments. Another important feature of the proposed GFT-ISDD scheme, according to one embodiment, is that the decoding of a non-binary received sequence is carried out in binary based on a binary LDPC matrix. The binary iterative decoding can be performed efficiently and reduces the decoding complexity significantly. For decoding RS, BCH, and QR codes of prime lengths, the proposed coding scheme not only requires much lower decoding complexity than other existing soft-decision decoding algorithms for these codes, but also yields superior performance as demonstrated by the examples. In one embodiment, it is shown that with the proposed GFT-ISDD scheme, even a cyclic Hamming code can achieve an excellent error performance. It should be noted that although RS, BCH and QR codes are mentioned as examples, in general, the proposed coding scheme (e.g., collective encoding and/or collective decoding) can be applied to any type of code without departing from the teachings of the present disclosure.

It should be noted that one of the important structures of the QC-LDPC code $C_{LDPC}$ is that its parity check matrix $H_{LDPC}$ is binary, an array of CPMs over GF(2), whose Tanner graph is free of cycles of length four. The binary and QC-structures of the LDPC matrix $H_{LDPC}$ significantly facilitate and simplify the proposed decoding at the receiver side. Since both the base code C and the (n, n−1) SPC code are cyclic, the encoding of a collection of these codes can, in one embodiment, be accomplished with two simple feedback shift-registers and a buffer memory for permuting and interleaving the n generated codewords. The GFT of the interleaved sequence of n permuted codewords can be done with a fast Fourier transform algorithm.

In this disclosure, we also showed that the proposed coding scheme can be applied to shortened cyclic codes of prime lengths and presented a technique to reduce the rate of a cascaded code in the GFT-domain to various degrees while maintaining the code length. Besides RS, BCH, and QR codes of prime lengths, there are other well-known cyclic codes of prime lengths, such as cyclic Reed-Muller (RM) codes, finite geometry codes, difference set codes, generalized RM codes, and polynomial codes. All these codes are majority-logic decodable, which makes HDD much easier. However, if the proposed decoding scheme is applied to any of these codes, it yields superior performance.

FIG. 19 provides a schematic illustration of one embodiment of a computer system 1900 that can perform various blocks of the methods provided by various embodiments. A computer system as illustrated in FIG. 19 may be incorporated as part of the previously described computerized devices, such as various blocks (e.g., encoder, permuter, interleaver, decoder and the like as illustrated in FIGS. 1-4. For instance, functions of an encoder and/or a decoder may be performed by a general-purpose processor implemented as part of computer system 1900. Further, encoder/decoders may reside on a computerized mobile device, such as a tablet computer or cellular phone that contains computer system 1900. It should be noted that FIG. 19 is meant only to provide a generalized illustration of various components, any or all of which may be utilized as appropriate. FIG. 19, therefore, broadly illustrates how individual system elements may be implemented in a relatively separated or relatively more integrated manner.

The computer system 1900 is shown comprising hardware elements that can be electrically coupled via a bus 1905 (or may otherwise be in communication, as appropriate). The hardware elements may include one or more processors 1910, including without limitation one or more general-purpose processors and/or one or more special-purpose processors (such as digital signal processing chips, graphics acceleration processors, video decoders, and/or the like); one or more input devices 1915, which can include without limitation a mouse, a keyboard, remote control, and/or the like; and one or more output devices 1920, which can include without limitation a display device, a printer, and/or the like.

The computer system 1900 may further include (and/or be in communication with) one or more non-transitory storage devices 1925, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable and/or the like. Such storage devices may be configured to implement any appropriate data stores, including without limitation, various file systems, database structures, and/or the like.

The computer system 1900 might also include a communications subsystem 1930, which can include without limitation a modem, a network card (wireless or wired), an infrared communication device, a wireless communication device, and/or a chipset (such as a Bluetooth™ device, an 802.11 device, a Wi-Fi device, a WiMax device, cellular communication device, GSM, CDMA, WCDMA, LTE, LTE-A, LTE-U, etc.), and/or the like. The communications subsystem 1930 may permit data to be exchanged with a network (such as the network described below, to name one example), other computer systems, and/or any other devices described herein. In many embodiments, the computer system 1900 will further comprise a working memory 1935, which can include a RANI or ROM device, as described above.

The computer system 1900 also can comprise software elements, shown as being currently located within the working memory 1935, including an operating system 1940, device drivers, executable libraries, and/or other code, such as one or more application programs 1945, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a non-transitory computer-readable storage medium, such as the non-transitory storage device(s) 1925 described above. In some cases, the storage medium might be incorporated within a computer system, such as computer system 1900. In other embodiments, the storage medium might be separate from a computer system (e.g., a removable medium, such as a compact disc), and/or provided in an installation package, such that the storage medium can be used to program, configure, and/or adapt a general purpose computer with the instructions/code stored thereon. These instructions might take the form of executable code, which is executable by the computer system 1900 and/or might take the form of source and/or installable code, which, upon compilation and/or installation on the computer system 1900 (e.g., using any of a variety of generally available compilers, installation programs, compression/decompression utilities, etc.), then takes the form of executable code.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer system (such as the computer system 1900) to perform methods in accordance with various embodiments of the invention. According to a set of embodiments, some or all of the procedures of such methods are performed by the computer system 1900 in response to processor 1910 executing one or more sequences of one or more instructions (which might be incorporated into the operating system 1940 and/or other code, such as an application program 1945) contained in the working memory 1935. Such instructions may be read into the working memory 1935 from another computer-readable medium, such as one or more of the non-transitory storage device(s) 1925. Merely by way of example, execution of the sequences of instructions contained in the working memory 1935 might cause the processor(s) 1910 to perform one or more procedures of the methods described herein.

The terms "machine-readable medium," "computer-readable storage medium" and "computer-readable medium," as used herein, refer to any medium that participates in providing data that causes a machine to operate in a specific fashion. These mediums may be non-transitory. In an embodiment implemented using the computer system 1900, various computer-readable media might be involved in providing instructions/code to processor(s) 1910 for execution and/or might be used to store and/or carry such instructions/code. In many implementations, a computer-readable medium is a physical and/or tangible storage medium. Such a medium may take the form of a non-volatile media or volatile media. Non-volatile media include, for example, optical and/or magnetic disks, such as the non-transitory storage device(s) 1925. Volatile media include, without limitation, dynamic memory, such as the working memory 1935.

Common forms of physical and/or tangible computer-readable media include, for example, a floppy disk, a flexible disk, hard disk, magnetic tape, or any other magnetic medium, a CD-ROM, any other optical medium, any other physical medium with patterns of marks, a RAM, a PROM, EPROM, a FLASH-EPROM, any other memory chip or cartridge, or any other medium from which a computer can read instructions and/or code.

Various forms of computer-readable media may be involved in carrying one or more sequences of one or more instructions to the processor(s) 1910 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1900.

The communications subsystem 1930 (and/or components thereof) generally will receive signals, and the bus 1905 then might carry the signals (and/or the data, instructions, etc. carried by the signals) to the working memory 1935, from which the processor(s) 1910 retrieves and executes the instructions. The instructions received by the working memory 1935 may optionally be stored on a non-transitory storage device 1925 either before or after execution by the processor(s) 1910.

It should further be understood that the components of computer system 1900 can be distributed across a network. For example, some processing may be performed in one location using a first processor while other processing may be performed by another processor remote from the first processor. Other components of computer system 1900 may be similarly distributed. As such, computer system 1900 may be interpreted as a distributed computing system that performs processing in multiple locations. In some instances, computer system 1900 may be interpreted as a single computing device, such as a distinct laptop, desktop computer, or the like, depending on the context.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A method for joint encoding data for storage, comprising:
    obtaining a sequence of information symbols;
    generating a plurality of cyclic codewords, each cyclic codeword corresponding to a portion of the sequence of information symbols;
    jointly encoding the plurality of cyclic codewords to generate at least one combined codeword, wherein the at least one combined codeword is generated through Galois Fourier Transform (GFT), resulting in the at least one combined codeword being in a GFT domain; and
    providing the at least one combined codeword in the GFT domain to a storage device for storage on the storage device.

2. The method of claim 1, wherein jointly encoding the plurality of cyclic codewords comprises:
  permuting each of the plurality of cyclic codewords to generate a plurality of permuted codewords;
  combining the plurality of permuted codewords to generate a cascaded codeword;
  interleaving the cascaded codeword using an interleaving matrix to obtain an interleaved codeword; and
  performing a Galois Fourier Transform on the interleaved codeword to generate the at least one combined codeword.

3. The method of claim 2, wherein the plurality of permuted codewords are generated using Hadamard permutation algorithm.

4. The method of claim 1, wherein the plurality of cyclic codewords correspond to a first finite field and the at least one combined codeword corresponds to a second finite field, wherein the second finite field is larger than the first finite field.

5. The method of claim 1, wherein the combined codeword comprises a quasi-cyclic low density parity check codeword.

6. The method of claim 4, wherein the quasi-cyclic low density parity check codeword corresponds to a binary parity check matrix.

7. The method of claim 1, wherein a length of at least one of the plurality of cyclic codewords is a prime number.

8. The method of claim 1, wherein the plurality of cyclic codewords are generated over a finite field of characteristic two.

9. The method of claim 1, wherein the plurality of cyclic codewords comprise Reed-Solomon codewords.

10. The method of claim 1, wherein generating the plurality of cyclic codewords comprises encoding the sequence of information symbols using a single parity check cyclic code algorithm.

11. The method of claim 1, further comprising:
  generating at least one shortened cyclic codeword of prime length by performing a shortening procedure on at least one of the plurality of cyclic codewords when a length of the plurality of cyclic codewords is a composite number; and
  jointly encoding the at least one shortened cyclic codes to generate the combined codewords.

12. The method of claim 1, further comprising:
  encoding the at least one combined codeword using an error-correcting coding algorithm to generate at least one post-GFT encoded codeword; and
  providing the at least one post-GFT encoded codeword to the device.

13. The method of claim 1, wherein the storage device comprises at least one hard disk.

14. The method of claim 1, wherein the storage device comprises at least one flash memory.

15. An apparatus for joint encoding data for storage, comprising:
  a memory; and
  at least one processor coupled to the memory, the at least one processor configured to:
  obtain a sequence of information symbols;
  generate a plurality of cyclic codewords, each cyclic codeword corresponding to a portion of the sequence of information symbols;
  jointly encode the plurality of cyclic codewords to generate at least one combined codeword, wherein the at least one combined codeword is generated through Galois Fourier Transform (GFT), resulting in the at least one combined codeword being in a GFT domain; and
  provide the at least one combined codeword in the GFT domain to a storage device for storage on the storage device.

16. The apparatus of claim 15, wherein the at least one processor is further configured to:
  permute each of the plurality of cyclic codewords to generate a plurality of permuted codewords;
  combine the plurality of permuted codewords to generate a cascaded codeword;
  interleave the cascaded codeword using an interleaving matrix to obtain an interleaved codeword; and
  perform a Galois Fourier Transform on the interleaved codeword to generate the at least one combined codeword.

17. The apparatus of claim 16, wherein the plurality of permuted codewords are generated using Hadamard permutation algorithm.

18. The apparatus of claim 15, wherein the plurality of cyclic codewords correspond to a first finite field and the at least one combined codeword corresponds to a second finite field, wherein the second finite field is larger than the first finite field.

19. The apparatus of claim 15, wherein the combined codeword comprises a quasi-cyclic low density parity check codeword.

20. The apparatus of claim 19, wherein the quasi-cyclic low density parity check codeword corresponds to a binary parity check matrix.

21. The apparatus of claim 15, wherein a length of at least one of the plurality of cyclic codewords is a prime number.

22. The apparatus of claim 15, wherein the plurality of cyclic codewords are generated over a finite field of characteristic two.

23. The apparatus of claim 15, wherein the plurality of cyclic codewords comprise Reed-Solomon codewords.

24. The apparatus of claim 15, wherein the at least one processor is further configured to encode the sequence of information symbols using a single parity check cyclic code algorithm.

25. The apparatus of claim 15, wherein the at least one processor is further configured to:
  generate at least one shortened cyclic codeword of prime length by performing a shortening procedure on at least one of the plurality of cyclic codewords when a length of the plurality of cyclic codewords is a composite number; and
  jointly encode the at least one shortened cyclic codes to generate the combined codewords.

26. The apparatus of claim 15, wherein the at least one processor is further configured to:
  encode the at least one combined codeword using an error-correcting coding algorithm to generate at least one post-GFT encoded codeword; and
  provide the at least one post-GFT encoded codeword to the device.

27. The apparatus of claim 15, wherein the storage device comprises at least one hard disk.

28. The apparatus of claim 15, wherein the storage device comprises at least one flash memory.

29. A non-transitory processor-readable medium for joint encoding data for storage, comprising processor-readable instructions configured to cause one or more processors to:

obtain a sequence of information symbols;

generate a plurality of cyclic codewords, each cyclic codeword corresponding to a portion of the sequence of information symbols;

jointly encode the plurality of cyclic codewords to generate at least one combined codeword, wherein the at least one combined codeword is generated through Galois Fourier Transform (GFT), resulting in the at least one combined codeword being in a GFT domain; and provide the at least one combined codeword in the GFT domain to a storage device for storage on the storage device.

* * * * *